(12) United States Patent
Shirai et al.

(10) Patent No.: US 10,175,584 B2
(45) Date of Patent: Jan. 8, 2019

(54) OPTICAL ELEMENT AND EXPOSURE APPARATUS

(71) Applicant: NIKON CORPORATION, Tokyo (JP)

(72) Inventors: Takeshi Shirai, Yokohama (JP); Takao Kokubun, Fuchu (JP); Hitoshi Ishizawa, Kawasaki (JP); Atsunobu Murakami, Fuchu (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/056,418

(22) Filed: Oct. 17, 2013

(65) Prior Publication Data

US 2014/0043592 A1 Feb. 13, 2014

Related U.S. Application Data

(62) Division of application No. 13/450,116, filed on Apr. 18, 2012, which is a division of application No.
(Continued)

(30) Foreign Application Priority Data

Aug. 26, 2003 (JP) .................................. 2003-302122
Aug. 27, 2003 (JP) .................................. 2003-302519
(Continued)

(51) Int. Cl.
*G02B 1/10* (2015.01)
*G02B 1/14* (2015.01)
*G03F 7/20* (2006.01)

(52) U.S. Cl.
CPC ......... *G03F 7/70341* (2013.01); *G02B 1/105* (2013.01); *G02B 1/14* (2015.01);
(Continued)

(58) Field of Classification Search
CPC ............ G03F 7/70341; G03F 7/70958; G02B 1/10–1/18
(Continued)

(56) References Cited

U.S. PATENT DOCUMENTS 3,573,975 A 4/1971 Dhaka et al.
3,648,587 A 3/1972 Stevens
(Continued)

FOREIGN PATENT DOCUMENTS

DE 206 607 6/1982
DE 242 880 A1 1/1983
(Continued)

OTHER PUBLICATIONS

Machine translation of description of WO1999049504 retrieved Jan. 7, 2014 from WIPO.*
(Continued)

*Primary Examiner* — Cara E Rakowski
(74) *Attorney, Agent, or Firm* — Oliff PLC

(57) ABSTRACT

An optical element is used for an exposure apparatus which is configured to illuminate a mask with an exposure light beam for transferring a pattern on the mask onto a substrate through a projection optical system and to interpose a given liquid in a space between a surface of the substrate and the projection optical system. The optical element includes a first anti-dissolution member provided on a surface of a transmissive optical element on the substrate's side of the projection optical system.

34 Claims, 31 Drawing Sheets

Related U.S. Application Data

12/659,121, filed on Feb. 25, 2010, now Pat. No. 8,189,170, which is a division of application No. 10/569,207, filed as application No. PCT/JP2007/012296 on Aug. 26, 2004, now Pat. No. 7,697,111.

(30) Foreign Application Priority Data

| Aug. 27, 2003 | (JP) | 2003-303432 |
|---|---|---|
| Sep. 26, 2003 | (JP) | 2003-336162 |
| Feb. 18, 2004 | (JP) | 2004-041848 |
| Feb. 18, 2004 | (JP) | 2004-042157 |
| Feb. 19, 2004 | (JP) | 2004-042752 |
| Feb. 20, 2004 | (JP) | 2004-044229 |

(52) U.S. Cl.
 CPC ...... *G03F 7/70875* (2013.01); *G03F 7/70958* (2013.01); *G03F 7/70983* (2013.01)

(58) Field of Classification Search
 USPC .......................................... 355/53; 359/665
 See application file for complete search history.

(56) References Cited

U.S. PATENT DOCUMENTS

| 3,706,485 | A | | 12/1972 | Fawcett et al. |
| 4,346,164 | A | | 8/1982 | Tabarelli et al. |
| 4,390,273 | A | | 6/1983 | Loebach et al. |
| 4,396,705 | A | | 8/1983 | Akeyama et al. |
| 4,480,910 | A | | 11/1984 | Takanashi et al. |
| 4,488,776 | A | * | 12/1984 | Skinner ................ G02B 7/022 |
| | | | | 359/808 |
| 4,500,611 | A | | 2/1985 | Nickol et al. |
| 4,509,852 | A | | 4/1985 | Tabarelli et al. |
| 4,534,614 | A | * | 8/1985 | Silverglate ......... H04B 10/1143 |
| | | | | 250/216 |
| 4,568,140 | A | | 2/1986 | Van Der Werf et al. |
| 4,954,372 | A | | 9/1990 | Sako et al. |
| 4,989,960 | A | | 2/1991 | Thomas |
| 5,040,020 | A | | 8/1991 | Rauschenbach et al. |
| 5,067,781 | A | | 11/1991 | Montanari et al. |
| 5,121,256 | A | | 6/1992 | Corle et al. |
| 5,139,879 | A | | 8/1992 | Aharoni et al. |
| 5,494,743 | A | | 2/1996 | Woodard et al. |
| 5,610,683 | A | | 3/1997 | Takahashi |
| 5,610,689 | A | | 3/1997 | Kamiya et al. |
| 5,648,860 | A | | 7/1997 | Ooi et al. |
| 5,703,724 | A | * | 12/1997 | Miyano ............... G02B 23/243 |
| | | | | 359/644 |
| 5,715,039 | A | | 2/1998 | Fukuda et al. |
| 5,825,043 | A | | 10/1998 | Suwa |
| 5,882,773 | A | | 3/1999 | Chow et al. |
| 5,900,354 | A | | 5/1999 | Batchelder |
| 5,962,079 | A | | 10/1999 | Koberstein et al. |
| 5,993,898 | A | | 11/1999 | Nagatsuka |
| 6,073,354 | A | * | 6/2000 | Rando ................. G01C 15/105 |
| | | | | 33/291 |
| 6,084,846 | A | | 7/2000 | Jordache et al. |
| 6,166,855 | A | | 12/2000 | Ikeyama et al. |
| 6,191,429 | B1 | | 2/2001 | Suwa |
| 6,219,113 | B1 | * | 4/2001 | Takahara ............. G02F 1/1334 |
| | | | | 345/98 |
| 6,236,634 | B1 | | 5/2001 | Lee et al. |
| 6,417,974 | B1 | | 7/2002 | Schuster |
| 6,466,365 | B1 | | 10/2002 | Maier et al. |
| 6,556,353 | B2 | | 4/2003 | Omura |
| 6,560,032 | B2 | | 5/2003 | Hatano |
| 6,574,039 | B1 | | 6/2003 | Murata et al. |
| 6,600,547 | B2 | | 7/2003 | Watson et al. |
| 6,603,130 | B1 | | 8/2003 | Bisschops et al. |
| 6,628,574 | B1 | | 9/2003 | Shimazaki et al. |
| 6,633,365 | B2 | | 10/2003 | Suenaga |
| 6,721,031 | B2 | * | 4/2004 | Hasegawa ............. G03B 27/52 |
| | | | | 355/30 |
| 6,795,167 | B2 | | 9/2004 | Ota et al. |
| 6,867,844 | B2 | | 3/2005 | Vogel et al. |
| 6,878,916 | B2 | | 4/2005 | Schuster |
| 6,914,665 | B2 | | 7/2005 | Ishikawa |
| 6,952,253 | B2 | | 10/2005 | Lof et al. |
| 6,954,256 | B2 | | 10/2005 | Flagello et al. |
| 7,009,682 | B2 | | 3/2006 | Blecker |
| 7,050,146 | B2 | | 5/2006 | Duineveld et al. |
| 7,075,616 | B2 | | 7/2006 | Derksen et al. |
| 7,081,943 | B2 | | 7/2006 | Lof et al. |
| 7,088,422 | B2 | | 8/2006 | Hakey et al. |
| 7,129,009 | B2 | | 10/2006 | French et al. |
| 7,187,503 | B2 | | 3/2007 | Rostalski et al. |
| 7,193,232 | B2 | | 3/2007 | Lof et al. |
| 7,199,858 | B2 | | 4/2007 | Lof et al. |
| 7,209,292 | B2 | | 4/2007 | Epple et al. |
| 7,215,410 | B2 | | 5/2007 | Sumiyoshi |
| 7,326,522 | B2 | | 2/2008 | Dierichs |
| 7,359,030 | B2 | | 4/2008 | Simon et al. |
| 7,393,469 | B2 | | 7/2008 | Benrashid et al. |
| 7,394,521 | B2 | | 7/2008 | Van Santen et al. |
| 7,460,206 | B2 | | 12/2008 | Weissenrieder et al. |
| 7,545,481 | B2 | | 6/2009 | Streefkerk et al. |
| 7,589,818 | B2 | | 9/2009 | Mulkens et al. |
| 7,697,111 | B2 | | 4/2010 | Shirai et al. |
| 7,924,397 | B2 | | 4/2011 | Lin et al. |
| 8,149,381 | B2 | | 4/2012 | Shirai et al. |
| 8,189,170 | B2 | | 5/2012 | Shirai et al. |
| 8,208,123 | B2 | | 6/2012 | Loopstra et al. |
| 8,836,914 | B2 | * | 9/2014 | Hazelton ............. G03F 7/70341 |
| | | | | 355/30 |
| 2001/0015939 | A1 | * | 8/2001 | Kubo .................... G11B 7/1374 |
| | | | | 369/13.01 |
| 2001/0043320 | A1 | | 11/2001 | Kato et al. |
| 2002/0005990 | A1 | | 1/2002 | Watanabe |
| 2002/0020821 | A1 | | 2/2002 | Van Santen et al. |
| 2002/0163629 | A1 | | 11/2002 | Switkes et al. |
| 2002/0191168 | A1 | * | 12/2002 | Ishizawa et al. ................ 355/53 |
| 2003/0030916 | A1 | | 2/2003 | Suenaga |
| 2003/0123040 | A1 | | 7/2003 | Almogy |
| 2003/0137733 | A1 | | 7/2003 | Gerhard et al. |
| 2003/0142409 | A1 | | 7/2003 | Ohtsu et al. |
| 2003/0174408 | A1 | | 9/2003 | Rostalski et al. |
| 2004/0000627 | A1 | | 1/2004 | Schuster |
| 2004/0021844 | A1 | | 2/2004 | Suenaga |
| 2004/0075895 | A1 | * | 4/2004 | Lin ..................... G03F 7/70341 |
| | | | | 359/380 |
| 2004/0109237 | A1 | | 6/2004 | Epple et al. |
| 2004/0119954 | A1 | | 6/2004 | Kawashima et al. |
| 2004/0125351 | A1 | | 7/2004 | Krautschik et al. |
| 2004/0165159 | A1 | | 8/2004 | Lof et al. |
| 2004/0230592 | A1 | | 11/2004 | Fischer et al. |
| 2004/0257544 | A1 | * | 12/2004 | Vogel et al. .................... 355/30 |
| 2005/0007567 | A1 | | 1/2005 | Pierrat et al. |
| 2005/0036183 | A1 | | 2/2005 | Yeo et al. |
| 2005/0068639 | A1 | | 3/2005 | Pierrat et al. |
| 2005/0094119 | A1 | | 5/2005 | Loopstra et al. |
| 2005/0100745 | A1 | | 5/2005 | Lin et al. |
| 2005/0213066 | A1 | | 9/2005 | Sumiyoshi |
| 2005/0225737 | A1 | | 10/2005 | Weissenrieder et al. |
| 2005/0225738 | A1 | | 10/2005 | Shirai |
| 2005/0237504 | A1 | | 10/2005 | Nagasaka et al. |
| 2005/0248856 | A1 | | 11/2005 | Omura et al. |
| 2006/0023183 | A1 | * | 2/2006 | Novak ................. G03F 7/70341 |
| | | | | 355/53 |
| 2006/0087725 | A1 | | 4/2006 | Arriola |
| 2006/0203218 | A1 | | 9/2006 | Shirai et al. |
| 2006/0209285 | A1 | | 9/2006 | Shirai |
| 2007/0188879 | A1 | | 8/2007 | Ikezawa et al. |
| 2007/0201011 | A1 | | 8/2007 | Kokubun et al. |

(56) References Cited

U.S. PATENT DOCUMENTS

| | | |
|---|---|---|
| 2008/0030698 A1 | 2/2008 | Novak et al. |
| 2008/0068573 A1 | 3/2008 | Omura et al. |
| 2011/0128514 A1 | 6/2011 | Shirai |

FOREIGN PATENT DOCUMENTS

| | | |
|---|---|---|
| DE | 221 563 A1 | 4/1985 |
| DE | 224 448 A1 | 7/1985 |
| DE | 35 37 626 A1 | 4/1986 |
| EP | 0 023 231 B1 | 2/1981 |
| EP | 0 418 427 A2 | 3/1991 |
| EP | 0 605 103 A1 | 7/1994 |
| EP | 0 834 773 A2 | 4/1998 |
| EP | 1 039 511 A1 | 9/2000 |
| EP | 1 152 263 A1 | 11/2001 |
| EP | 1 172 670 A2 | 1/2002 |
| EP | 1 316 849 A2 | 6/2003 |
| EP | 1 420 302 | 5/2004 |
| EP | 1 429 190 A2 | 6/2004 |
| EP | 1 510 871 A2 | 3/2005 |
| EP | 1 571 700 A1 | 9/2005 |
| EP | 1 646 074 A1 | 4/2006 |
| FR | 2 474 708 A1 | 1/1980 |
| JP | A-57-153433 | 9/1982 |
| JP | A 58-202448 | 11/1983 |
| JP | A 59-19912 | 2/1984 |
| JP | A 62-65326 | 3/1987 |
| JP | A 62-121417 | 6/1987 |
| JP | A 63-157419 | 6/1988 |
| JP | A 04-305915 | 10/1992 |
| JP | A 04-305917 | 10/1992 |
| JP | A 05-062877 | 3/1993 |
| JP | A 06-124873 | 5/1994 |
| JP | A-7-132262 | 5/1995 |
| JP | A 07-220990 | 8/1995 |
| JP | A 08-316125 | 11/1996 |
| JP | A-10-154659 | 6/1998 |
| JP | A 10-163099 | 6/1998 |
| JP | A 10-214783 | 8/1998 |
| JP | A-10-228661 | 8/1998 |
| JP | A-10-255319 | 9/1998 |
| JP | A 10-303114 | 11/1998 |
| JP | A 10-340846 | 12/1998 |
| JP | A-11-170605 | 6/1999 |
| JP | A 11-176727 | 7/1999 |
| JP | A 11-264903 | 9/1999 |
| JP | A 2000-058436 | 2/2000 |
| JP | A 2000-131503 | 5/2000 |
| JP | A 2000-505958 | 5/2000 |
| JP | A-2000-206304 | 7/2000 |
| JP | A-2001-91849 | 4/2001 |
| JP | A 2002-244035 | 8/2002 |
| JP | A-2004-193252 | 7/2004 |
| JP | A 2004-207711 | 7/2004 |
| JP | A 2004-259966 | 9/2004 |
| JP | A-2005-019864 | 1/2005 |
| JP | A-2005-202375 | 7/2005 |
| JP | A-2005-268741 | 9/2005 |
| JP | A-2005-286026 | 10/2005 |
| WO | WO 98/28665 | 7/1998 |
| WO | WO 99/49504 A1 | 9/1999 |
| WO | WO1999049504 * | 9/1999 |
| WO | WO 0003283 A2 * | 1/2000 ......... G02B 21/0088 |
| WO | WO 02/093209 A2 | 11/2002 |
| WO | WO 03/077034 A2 | 9/2003 |
| WO | WO 03/077036 A1 | 9/2003 |
| WO | WO 03/077037 A1 | 9/2003 |
| WO | WO 2004/019128 A2 | 3/2004 |
| WO | WO 2004/053596 A2 | 6/2004 |
| WO | WO 2004/053950 A1 | 6/2004 |
| WO | WO 2004-053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004-107048 A2 | 12/2004 |

OTHER PUBLICATIONS

Nov. 15, 2011 Office Action issued in Japanese Patent Application No. 2010-081728. (Translation only.).

M. Switkes et al., "Immersion Lithography at 157 nm," J. Vac. Sci. Technol. B., vol. 19, No. 6, Nov./Dec. 2001, pp. 2353-2356.

B.J. Lin, "Proximity Printing Through Liquid," IBM Technical Disclosure Bulletin, vol. 20, No. 11B, Apr. 1978, p. 4997.

B.J. Lin, "The Paths to Subhalf-Micrometer Optical Lithography," SPIE vol. 922, Optical/Laser Microlithography (1988), pp. 256-269.

G.W.W. Stevens, "Reduction of Waste Resulting from Mask Defects," Solid State Technology, Aug. 1978, vol. 21 008, pp. 68-72.

S. Owa et al., "Immersion Lithography; its Potential Performance and Issues," SPIE Microlithography 2003, 5040-186, Feb. 27, 2003.

S. Owa et al., "Advantage and Feasibility of Immersion Lithography," Proc. SPIE 5040 (2004).

H. Kawata et al., "Optical Projection Lithography using Lenses with Numerical Apertures Greater than Unity," Microelectronic Engineering 9 (1989), pp. 31-36.

J.A. Hoffnagle et al., "Liquid Immersion Deep-Ultraviolet Interferometric Lithography," J. Vac. Sci. Technol. B., vol. 17, No. 6, Nov./Dec. 1999, pp. 3306-3309.

B.W. Smith et al., "Immersion Optical Lithography at 193nm," Future FAB International, vol. 15, Jul. 11, 2003.

H. Kawata et al., "Fabrication of 0.2μm Fine Patterns Using Optical Projection Lithography with an Oil Immersion Lens," Jpn. J. Appl. Phys. vol. 31 (1992), pp. 4174-4177.

G. Owen et al., "1/8μm Optical Lithography," J. Vac. Sci. Technol. B., vol. 10, No. 6, Nov./Dec. 1992, pp. 3032-3036.

H. Hogan, "New Semiconductor Lithography Makes a Splash," Photonics Spectra, Photonics TechnologyWorld, Oct. 2003, Jul. 10, 2003 Edition, pp. 1-3.

S. Owa and N. Nagasaka, "Potential Performance and Feasibility of Immersion Lithography," NGL Workshop 2003, Jul. 10, 2003, Slide Nos. 1-33.

S. Owa et al., "Update on 193nm Immersion Exposure Tool," Litho Forum, International SEMATECH, Los Angeles, Jan. 27-29, 2004, Slide Nos. 1-51.

H. Hata, "The Development of Immersion Exposure Tools," Litho Forum, International SEMATECH, Los Angeles, Jan. 27-29, 2004, Slide Nos. 1-22.

T. Matsuyama et al., "Nikon Projection Lens Update," SPIE Microlithography 2004, 5377-05, Mar. 2004.

"Depth-of-Focus Enhancement Using High Refractive Index Layer on the Imaging Layer," IBM Technical Disclosure Bulletin, vol. 27, No. 11, Apr. 1985, p. 6521.

A. Suzuki, "Lithography Advances on Multiple Fronts," EEdesign, EE Times, Jan. 5, 2004.

B. Lin, "The $k_3$ Coefficient in Nonparaxial λNA Scaling Equations for Resolution, Depth of Focus, and Immersion Lithography," J. Microlith., Microfab., Microsyst., 1(1):7-12 (2002).

Search Report for European Application No. EP 04254940.2, date of completion: Oct. 11, 2004.

Search Report for European Application No. EP 04254940.2, date of completion: Feb. 4, 2005.

Aug. 13, 2007 Supplementary European Search Report in European Application No. 03 77 8771.0.

Office Action dated Jun. 25, 2009 in U.S. Appl. No. 12/292,271.

Office Action dated Feb. 6, 2009 in U.S. Appl. No. 10/927,531.

Office Action dated Mar. 31, 2010 in U.S. Appl. No. 10/927,531.

Office Action dated Mar. 14, 2008 in U.S. Appl. No. 10/529,587.

Office Action dated Oct. 5, 2005 in U.S. Appl. No. 11/147,284.

Office Action dated Feb. 15, 2006 in U.S. Appl. No. 11/147,284.

(56) References Cited

OTHER PUBLICATIONS

Notice of Allowance dated Jun. 28, 2006 in U.S. Appl. No. 11/147,284.
Office Action dated Feb. 9, 2007 in U.S. Appl. No. 11/147,284.
Office Action dated Aug. 8, 2007 in U.S. Appl. No. 11/147,284.
Office Action dated Feb. 15, 2008 in U.S. Appl. No. 11/147,284.
Office Action dated Dec. 3, 2008 in U.S. Appl. No. 11/147,284.
Office Action dated Sep. 8, 2009 in U.S. Appl. No. 11/147,284.
Office Action dated Apr. 2, 2010 in U.S. Appl. No. 11/147,284.
Notice of Allowance dated Sep. 27, 2010 in U.S. Appl. No. 11/147,284.
Office Action dated Aug. 3, 2006 in U.S. Appl. No. 11/416,110.
Office Action dated Jan. 29, 2007 in U.S. Appl. No. 11/416,110.
Office Action dated Jul. 26, 2007 in U.S. Appl. No. 11/416,110.
Office Action dated Apr. 4, 2008 in U.S. Appl. No. 11/416,110.
Office Action dated Mar. 1, 2009 in U.S. Appl. No. 11/416,110.
Office Action dated Jan. 7, 2010 in U.S. Appl. No. 11/416,110.
Office Action dated Apr. 28, 2010 in U.S. Appl. No. 11/416,110.
Notice of Allowance dated Sep. 22, 2010 in U.S. Appl. No. 11/416,110.
Office Action dated Jun. 19, 2009 in U.S. Appl. No. 11/546,298.
Office Action dated Feb. 1, 2010 in U.S. Appl. No. 11/546,298.
Office Action dated Apr. 23, 2010 in U.S. Appl. No. 11/415,160.
Office Action dated Jul. 24, 2009 in U.S. Appl. No. 11/415,160.
Office Action dated Jul. 27, 2005 in U.S. Appl. No. 10/702,664.
Office Action dated Mar. 20, 2006 in U.S. Appl. No. 10/702,664.
Office Action dated Jul. 12, 2006 in U.S. Appl. No. 10/702,664.
Office Action dated May 17, 2007 in U.S. Appl. No. 10/702,664.
Office Action dated Oct. 16, 2007 in U.S. Appl. No. 10/702,664.
Office Action dated Nov. 3, 2006 in U.S. Appl. No. 10/702,664.
Office Action dated Dec. 3, 2008 in U.S. Appl. No. 10/702,664.
Office Action dated Mar. 31, 2009 in U.S. Appl. No. 10/702,664.
Office Action dated Jul. 30, 2009 in U.S. Appl. No. 10/702,664.
Office Action dated Feb. 23, 2010 in U.S. Appl. No. 10/702,664.
Office Action dated Jul. 16, 2010 in U.S. Appl. No. 10/702,664.
Office Action dated Aug. 2, 2010 in U.S. Appl. No. 11/529,587.
Office Action dated Jan. 7, 2011 in U.S. Appl. No. 11/529,587.
M. Switkes et al., "Immersion Lithography at 157 nm," MIT Lincoln Lab, Orlando 2001, Dec. 17, 2001, pp. 1-13.
M. Switkes et al., "Immersion Lithography : Optics for the 50 nm Node," MIT Lincoln Lab, 157 Anvers, Sep. 4, 2002, pp. 1-18.
B.J. Lin, "Drivers, Prospects and Challenges for Immersion lithography," TSMC, Sep. 2002, pp. 1-28.
"Investor Relations—Nikon's Real Solutions," Nikon Precision Europe GmbH, May 2003, slides 1-18.
European Communication for EP 03255377.8, dated Aug. 6, 2004.
Partial European Search Report for European Application No. EP 04 25 4940, completed Oct. 11, 2004, communication dated Nov. 17, 2004.
Korean Office Action issued for Korean Patent Application No. 10-2004-0067737, dated May 26, 2006 (with translation).
Office Action dated Jan. 5, 2010 in U.S. Appl. No. 12/292,271.
Notice of Allowance dated Nov. 5, 2010 in U.S. Appl. No. 12/292,271.
M. Switkes et al., Immersion Liquids for Lithography in the Deep Ultraviolet, Optical Microlithography XVI, 2003, 690-699, vol. 5040 (2003).
Office Action dated Apr. 14, 2010 in U.S. Appl. No. 12/292,271.
Office Action dated Apr. 6, 2011 in U.S. Appl. No. 11/415,160.
Office Action dated Aug. 6, 2008 in U.S. Appl. No. 10/927,531.
Office Action dated Aug. 18, 2009 in U.S. Appl. No. 10/927,531.
Amendments and Remarks filed Jun. 30, 2010 in U.S. Appl. No. 10/927,531.
Office Action dated Sep. 16, 2010 in U.S. Appl. No. 10/927,531.
European Search Report dated Apr. 4, 2011 issued in European Patent Application No. 10189857.5.
European Search Report dated Apr. 4, 2011 issued in European Patent Application No. 10189817.9.
Office Action dated Aug. 25, 2011 in the U.S. Appl. No. 12/659,121.
Office Action dated Apr. 4, 2011 in U.S. Appl. No. 10/927,531.
Office Action dated Jan. 22, 2009 in U.S. Appl. No. 10/569,207.
Office Action dated Aug. 3, 2009 in U.S. Appl. No. 10/569,207.
Notice of Allowance dated Dec. 1, 2009 in U.S. Appl. No. 10/569,207.
Office Action dated Jan. 14, 2011 in U.S. Appl. No. 12/659,121.
Office Action dated Jul. 16, 2013 in U.S. Appl. No. 13/450,116.
Jan. 15, 2014 Office Action issued in U.S. Appl. No. 13/450,116.
Oct. 15, 2014 Office Action issued in U.S. Appl. No. 13/407,620.
Aug. 7, 2014 Office Action issued in U.S. Appl. No. 13/450,116.
Sep. 4, 2015 Office Action issued in U.S. Appl. No. 13/450,116.

* cited by examiner

SCANNING DIRECTION

OPTICAL ELEMENT AND EXPOSURE APPARATUS

This is a Divisional of U.S. application Ser. No. 13/450,116 filed Apr. 18, 2012, which is a Divisional of U.S. application Ser. No. 12/659,121 filed Feb. 25, 2010, which is a Divisional of U.S. application Ser. No. 10/569,207 filed Feb. 23, 2006, which in turn is a National Stage of PCT/JP2004/012296, filed Aug. 26, 2004. The disclosures of the prior applications are hereby incorporated by reference herein in its entirety.

TECHNICAL FIELD

The present invention relates to an optical element used in a projection exposure apparatus adopting the liquid immersion method, which is applied to the lithography step for transferring a mask pattern onto a photosensitive substrate to produce devices including, for example, semiconductor elements, image pickup devices (such as CCDs), liquid crystal display elements, and thin film magnetic heads. The present invention also relates to an exposure apparatus applying the optical element.

BACKGROUND ART

A projection exposure apparatus configured to transfer a pattern image of a reticle as a mask onto each shot area on a resist-coated wafer (or a glass plate and so forth) serving as a photosensitive substrate through a projection optical system is used for manufacturing semiconductor elements and the like. A reduced projection type exposure apparatus (a stepper) applying a step and repeat method has been conventionally used as the projection exposure apparatus in many cases. Meanwhile, a projection exposure apparatus applying a step-and-scan method configured to scan and expose the reticle and the wafer synchronously is also drawing attentions in these days.

Resolution of the projection optical system incorporated in the projection exposure apparatus becomes higher as an exposure wavelength used therein becomes shorter or as the numerical aperture of the projection optical system becomes larger. Therefore, the exposure wavelength used in the projection exposure apparatus is becoming shorter every year while the numerical aperture of the projection optical system is gradually increasing along developments in finer process rules for manufacturing integrated KrF excimer laser, an ArF excimer laser having a shorter exposure wavelength of 193 nm is also being put into practical use recently.

Incidentally, along the reduction in the wavelength of exposure light, types of glass materials having sufficient optical transmittance for obtaining light intensity required for exposure while ensuring a desired image-forming performance are limited. In this context, there is disclosed a projection exposure apparatus of a liquid immersion type configured to fill a space between a lower surface of a projection optical system and a surface of a wafer with a liquid such as water or an organic solvent, and to improve resolution by utilizing a phenomenon that the wavelength of exposure light in liquid becomes 1/n (n denotes a refractive index of liquid usually ranging from about 1.2 to 1.6) times as large as the wavelength in the air (Japanese Patent Application Laid-Open Gazette No. Hei 10-303114 (JP 10-303114 A)).

DISCLOSURE OF THE INVENTION

The projection optical system contacts the liquid when configuring this projection exposure apparatus of the liquid immersion type as the projection exposure apparatus applying the step and repeat method. Accordingly, there is a risk that a tip portion of the projection optical system contacting the liquid may be corroded by the liquid, thereby leading to a failure to obtain a desired optical performance.

Meanwhile, an exposure process is performed while moving a wafer when configuring the projection exposure apparatus of the liquid immersion type as the projection exposure apparatus applying the step-and-scan method. Accordingly, it is necessary to fill the space between the projection optical system and the wafer with the liquid in the course of moving the wafer. Since the projection optical system contacts the liquid, there is a risk that the tip portion of the projection optical system contacting the liquid may be corroded by the liquid, thereby leading to a failure to obtain a desired optical performance.

An object of this invention is to provide an optical element configured to avoid a tip portion of a projection optical system from being corroded by a liquid when applying the liquid immersion method, and to provide an exposure apparatus including the optical element.

To attain the object the present invention provides the following optical elements and exposure apparatuses applying any of the optical elements.

A first aspect of the present invention provides an optical element to be used for an exposure apparatus, which is configured to illuminate a mask with an exposure light beam for transferring a pattern on the mask onto a substrate through a projection optical system and to interpose a given liquid in a space between a surface of the substrate and the projection optical system. Here, the optical element includes a first anti-dissolution member provided on a surface of a transmissive optical element on the substrate's side of the projection optical system.

According to the optical element of the first aspect, the first anti-dissolution member is formed on the surface (a tip surface) of the optical element. Therefore, it is possible to prevent dissolution of the optical element and thereby to maintain an optical performance of the projection optical system.

A second aspect of the present invention provides the optical element according to the first aspect, in which the first anti-dissolution member includes a single-layer film having a protective function to protect the optical element against the liquid.

A third aspect of the present invention provides the optical element according to the second aspect, in which the single-layer film has solubility in pure water equal to or below $1.0 \times 10^{-7}$ grams per hundred grams of water.

According to the optical elements of the second and third aspects, it is possible to reduce an interface in comparison with a multilayer film. Therefore, it is possible to minimize an adverse effect of a chemical reaction which is apt to occur when the liquid infiltrates into an interface of a protective layer serving as an anti-dissolution film. Moreover, it is easier to form the film as compared to formation of the anti-dissolution film including the multilayer film.

A fourth aspect of the present invention provides the optical element according to the first aspect, in which the first anti-dissolution member includes a multilayer film having a protective function to protect the optical element against the liquid and an anti-reflection function to prevent reflection of the exposure light beam.

A fifth aspect of the present invention provides the optical element according to the fourth aspect, in which the multilayer film at least includes a layer having solubility in pure water equal to or below $1.0 \times 10^{-7}$ grams per hundred grams of water as the outermost layer, and mean reflectance of the multilayer film is equal to or below 2% when an exit angle of the exposure light beam is set to 50 degrees.

A sixth aspect of the present invention provides the optical element according to the fourth aspect, in which the multilayer film includes n layers (n is an integer), and when the layers are defined sequentially as a first layer, a second layer, and so forth to an n-th layer being the outermost layer, an odd-numbered layer has a higher refractive index than a refractive index of any of the adjacent optical element and an adjacent even-numbered layer. Moreover, the first to the n-th layers have the anti-reflection function as a whole.

A seventh aspect of the present invention provides the optical element according to the fourth aspect, in which the multilayer film includes n layers (n is an integer), and when the layers are defined sequentially as a first layer, a second layer, and so forth to an n-th layer being the outermost layer, an odd-numbered layer has a lower refractive index than a refractive index of any of the adjacent optical element and an adjacent even-numbered layer. Moreover, the first to the n-th layers have the anti-reflection function as a whole.

According to the optical element of any one of the fourth to seventh aspects, the multilayer film is formed on the surface of the optical element, and the multilayer film has the protective function to protect the optical element against the liquid and the anti-reflection function to prevent reflection of the exposure light beam (incident light from an exposure light source). Therefore, it is possible to provide the stable optical element without being corroded by the liquid. Hence it is possible to provide the optical element which can realize a high-performance projection exposure apparatus having high resolution and a large depth of focus by use of the liquid immersion method.

An eighth aspect of the present invention provides the optical element according to the first aspect, in which the first anti-dissolution member is made of at least one selected from the group consisting of $MgF_2$, $LaF_3$, $SrF_2$, $YF_3$, $LuF_3$, $HfF_4$, $NdF_3$, $GdF_3$, $YbF_3$, $DyF_3$, $AlF_3$, $Na_3AlF_6$, $5NaF.3AlF_3$, $Al_2O_3$, $SiO_2$, $TiO_2$, $MgO$, $HfO_2$, $Cr_2O_3$, $ZrO_2$, $Ta_2O_5$, and $Nb_2O_5$.

According to the optical element of the eighth aspect, it is possible to select the anti-dissolution member to be formed on the optical element. Therefore, it is possible to select the most appropriate anti-dissolution member based on the material of the optical element, the environment where the optical element is placed, the type of the liquid used for soaking the optical element, and the like.

A ninth aspect of the present invention provides the optical element according to the fourth aspect, in which the multilayer film includes n layers (n is an integer) and has a layer structure, which is expressed as first layer/second layer/other successive layers/n-th layer, of one selected from the group consisting of (i) $LaF_3/MgF_2$, (ii) $MgF_2/SiO_2$, (iii) $MgF_2/SiO_2/SiO_2$, (iv) $LaF_3/MgF_2/SiO_2$, (v) $LaF_3/MgF_2/Al_2O_3$, (vi) $LaF_3/MgF_2/Al_2O_3/SiO_2$, (vii) $LaF_3/MgF_2/LaF_3/MgF_2$, (viii) $LaF_3/MgF_2/LaF_3/SiO_2$, (ix) $LaF_3/MgF_2/LaF_3/MgF_2/SiO_2$, and (x) $LaF_3/MgF_2/LaF_3/Al_2O_3/SiO_2$.

According to the optical element of the ninth aspect, the multilayer film has the protective function for a given time period, and is therefore capable of protecting the optical element against water as the immersion liquid for ten years, for example. Hence it is possible to provide the optical element which can realize a high-performance projection exposure apparatus having high resolution and a large depth of focus by use of the liquid immersion method. At the same time, it is possible to provide the stable optical element without causing corrosion by the liquid for the given time period.

A tenth aspect of the present invention provides the optical element according to the first aspect, in which the first anti-dissolution member is formed by at least one film forming method selected from the group consisting of a vacuum vapor deposition method, an ion beam assisted vapor deposition method, a gas cluster ion beam assisted vapor deposition method, an ion plating method, an ion beam sputtering method, a magnetron sputtering method, a bias sputtering method, an electron cyclotron resonance (ECR) sputtering method, a radio frequency (RF) sputtering method, a thermal chemical vapor deposition (thermal CVD) method, a plasma enhanced CVD method, and a photo CVD method.

According to the optical element of the tenth aspect, it is possible to select the film forming method when forming the anti-dissolution member on the optical element. Therefore, it is possible to form the anti-dissolution member in the optimal condition on the optical element by selecting the most appropriate film forming method for the material of the anti-dissolution member.

An eleventh aspect of the present invention provides the optical element according to the first aspect, in which the first anti-dissolution member includes a film made of an oxide formed by a wet film forming method.

According to the optical element of the eleventh aspect, the oxide anti-dissolution film for preventing dissolution to the liquid is formed on the surface of the transmissive optical element on the substrate's side of the projection optical system by use of the wet film forming method characterized by high homogeneity and a high filling performance relative to voids. Therefore, it is possible to prevent infiltration to and corrosion of the transmissive optical element by the given liquid interposed between the surface of the substrate and the projection optical system, and thereby to maintain the optical performance of the projection optical system. As a result, when this transmissive optical element is applied to the exposure apparatus of the liquid immersion type, it is possible to avoid dissolution of the transmissive optical element in the liquid and thereby to maintain the performance of the exposure apparatus. In addition, it is not necessary to replace the transmissive optical element frequently. Therefore, it is possible to maintain high throughput of the exposure apparatus.

Here, when the transmissive optical element is made of calcium fluoride having a smoothly polished surface, it is preferable to subject the transmissive optical element to a surface treatment for increasing the surface area of the transmissive optical element by roughening the surface of the transmissive optical element to the extent not to degrade the optical performance of the projection optical system in order to enhance adhesion between the transmissive optical element and the oxide anti-dissolution film.

A twelfth aspect of the present invention provides the optical element according to the fourth aspect, in which the multilayer film includes a first film formed by a dry film forming method and a second film made of an oxide formed by a wet film forming method.

According to the optical element of the twelfth aspect, the first film is formed on the surface of the transmissive optical element on the substrate's side of the projection optical system by use of the dry film forming method, and the oxide film serving as the second film is formed on a surface of the first film thus formed by use of the wet film forming method. Therefore, even when the transmissive optical element is made of calcium fluoride having a smoothly polished surface, it is possible to attach the first film firmly to the transmissive optical element as the first film is formed by the dry film forming method. Meanwhile, it is possible to allow the first film to function as an adhesion reinforcing film to achieve firm attachment of the transmissive optical element to the second film.

Moreover, the second film is formed by use of the wet film forming method characterized by high homogeneity and a high filling performance relative to voids. Accordingly, voids on the first film are eliminated by penetration of the second film. Therefore, it is possible to prevent infiltration to and corrosion of the transmissive optical element by the given liquid interposed between the surface of the substrate and the projection optical system, and thereby to maintain the optical performance of the projection optical system. As a result, when this transmissive optical element is applied to the exposure apparatus of the liquid immersion type, it is possible to avoid dissolution of the transmissive optical element in the liquid because the first film and the second film are not detached from the transmissive optical element. In this way, it is possible to maintain the performance of the exposure apparatus. In addition, it is not necessary to replace the transmissive optical element frequently. Therefore, it is possible to maintain high throughput of the exposure apparatus.

A thirteenth aspect of the present invention provides the optical element according to the fourth aspect, in which the multilayer film at least includes a $SiO_2$ film formed by a wet film forming method as the outermost layer.

According to the optical element of the thirteenth aspect, the film on the outermost layer has the protective function for a given time period, and is therefore capable of protecting the optical element against water as the immersion liquid for ten years, for example. Hence it is possible to provide the optical element which can realize a high-performance projection exposure apparatus having high resolution and a large depth of focus by use of the liquid immersion method. At the same time, it is possible to provide the stable optical element without being corroded by the liquid for the given time period.

A fourteenth aspect of the present invention provides the optical element according to the thirteenth aspect, which further includes a $SiO_2$ film formed by a dry film forming method to be provided on the optical element's side of the $SiO_2$ film formed by the wet film forming method.

According to the optical element of the fourteenth aspect, bonding power between the silicon dioxide film formed by the dry film forming method and the silicon dioxide film formed by the wet film forming method is strengthened, and it is thereby possible to attach the both films more firmly. As a result, when this transmissive optical element is applied to the exposure apparatus of the liquid immersion type, it is possible to avoid separation of the both films and to avoid dissolution of the transmissive optical element in the liquid. In this way, it is possible to maintain the performance of the exposure apparatus. In addition, it is not necessary to replace the transmissive optical element frequently. Therefore, it is possible to maintain high throughput of the exposure apparatus.

A fifteenth aspect of the present invention provides the optical element according to the first aspect, in which the first anti-dissolution member includes a thin plate having a protective function to protect the optical element against the liquid and an anti-reflection function to prevent reflection of the exposure light beam. Here, the thin plate is detachably joined to a surface of the optical element.

A sixteenth aspect of the present invention provides the optical element according to the fifteenth aspect, in which the thin plate is joined to the surface of the optical element by optical contact, and mean reflectance of the thin plate is equal to or below 2% when an exit angle of the exposure light beam is set to 50 degrees.

A seventeenth aspect of the present invention provides the optical element according to the fifteenth aspect, in which the thin plate is made of at least one selected from the group consisting of a fluoride, an oxide, and a resin.

An eighteenth aspect of the present invention provides the optical element according to the fifteenth aspect, in which the thin plate is at least one selected from the group consisting of a fused silica thin plate, a magnesium fluoride thin plate, a calcium fluoride thin plate, and a polytetrafluoroethylene thin plate.

According to the optical element of any one of the fifteenth to eighteenth aspects, the thin plate having the protective function to protect the surface of the optical element against the liquid and the function to prevent reflection of the exposure light beam is joined to the surface of the optical element, and this optical member used therein is detachable without damaging the surface condition of the optical element. Therefore, it is possible to provide the stable optical member without being corroded by the liquid. Hence it is possible to provide the optical member which can realize a high-performance projection exposure apparatus having high resolution and a large depth of focus by use of the liquid immersion method. Moreover, when the thin plate is joined to the optical element by the optical contact, it is possible to further enhance the protective function against the liquid.

A nineteenth aspect of the present invention provides the optical element according to the first aspect, which further includes a second anti-dissolution member on a side surface of the transmissive optical element on the substrate's side of the projection optical system.

According to the optical element of the nineteenth aspect, the second anti-dissolution member is formed on the surface (a tip surface) on the substrate's side of the optical element and on the side surface (a tapered surface) of the optical element, or in other words, at portions where the exposure light beam does not pass through. Therefore, it is possible to prevent dissolution of the optical element from the surface on the substrate's side and to prevent dissolution of the optical element from the side surface as well. In this way, it is possible to maintain the optical performance of the projection optical system.

A twentieth aspect of the present invention provides the optical element according to the nineteenth aspect, in which each of the first anti-dissolution member and the second anti-dissolution member includes a film that is formed by use of an identical material.

According to the optical element of the twentieth aspect, it is possible to form the anti-dissolution films on the surface on the substrate's side of the optical element and on the side surface of the optical element at the same time. Therefore, it is possible to form the anti-dissolution films by a simple process.

A twenty-first aspect of the present invention provides the optical element according to the twentieth aspect, in which the film formed by use of the identical material is formed by a wet film forming method.

According to the optical element of the twenty-first aspect, it is possible to form the anti-dissolution films on the surface on the substrate's side of the optical element and on the side surface of the optical element at the same time. Therefore, it is possible to protect the substrate without generating any gaps.

A twenty-second aspect of the present invention provides the optical element according to the twentieth aspect, in which the identical material is any of $MgF_2$ and $SiO_2$.

According to the optical element of the twenty-second aspect, it is possible to protect the substrate because the identical material is either $MgF_2$ or the $SiO_2$.

A twenty-third aspect of the present invention provides the optical element according to the nineteenth aspect, in which the first anti-dissolution member includes a hydrophilic anti-dissolution film, and the second anti-dissolution member includes a hydrophobic anti-dissolution film.

Here, the anti-dissolution film formed on the side surface of the optical element is the anti-dissolution film having an excellent hydrophobic performance as compared to the anti-dissolution film formed on the surface on the substrate's side of the optical element, while the anti-dissolution film formed on the surface on the substrate's side of the optical element is the anti-dissolution film having an excellent hydrophilic performance as compared to the anti-dissolution film formed on the side surface of the optical element.

According to the optical element of the twenty-third aspect, it is possible to guide the liquid attached to the side surface of the optical element easily to the substrate's side because the anti-dissolution film formed on the side surface of the optical element is the hydrophobic anti-dissolution film. Moreover, it is possible to fill the space between the surface on the substrate's side of the optical element and the substrate constantly with the liquid because the anti-dissolution film formed on the surface on the substrate's side of the optical element is the hydrophilic anti-dissolution film.

A twenty-fourth aspect of the present invention provides the optical element according to the nineteenth aspect, in which the second anti-dissolution member includes a metal anti-dissolution film having a protective function to protect the optical element against the liquid.

According to the optical element of the twenty-fourth aspect, the side surface (the tapered surface) of the transmissive optical element on the substrate's side of the projection optical system is provided with the metal anti-dissolution film, which is insoluble to the given liquid interposed between the surface of the substrate and the projection optical system. Therefore, it is possible to prevent infiltration to and corrosion of the transmissive optical element by the liquid and thereby to maintain the optical performance of the projection optical system. As a result, when this transmissive optical element is applied to the exposure apparatus of the liquid immersion type, it is possible to maintain the performance of the exposure apparatus because the transmissive optical element does not dissolve in the liquid. In addition, it is not necessary to replace the transmissive optical element frequently. Therefore, it is possible to maintain high throughput of the exposure apparatus.

A twenty-fifth aspect of the present invention provides the optical element according to the twenty-fourth aspect, in which the second anti-dissolution member further includes an adhesion reinforcing film formed between the side surface of the optical element and the metal anti-dissolution film.

According to the optical element of the twenty-fifth aspect, the metal anti-dissolution film is formed on the surface of the adhesion reinforcing film formed on the side surface of the transmissive optical element on the substrate's side of the projection optical system, and it is possible to attach the metal anti-dissolution film closely to the transmissive optical element. Therefore, it is possible to prevent infiltration to and corrosion of the transmissive optical element by the given liquid interposed between the surface of the substrate and the projection optical system, and thereby to maintain the optical performance of the projection optical system. Moreover, when this transmissive optical element is applied to the exposure apparatus of the liquid immersion type, it is possible to maintain the performance of the exposure apparatus because the metal anti-dissolution film is not detached from the transmissive optical element and the transmissive optical element does not dissolve in the liquid. In addition, it is not necessary to replace the transmissive optical element frequently. Therefore, it is possible to maintain high throughput of the exposure apparatus.

A twenty-sixth aspect of the present invention provides the optical element according to the twenty-fourth aspect, in which the second anti-dissolution member further includes a protective film for the metal anti-dissolution film. Here, the protective film is formed on a surface of the metal anti-dissolution film.

According to the optical element of the twenty-sixth aspect, the protective film for the metal anti-dissolution film is formed on the surface of the metal anti-dissolution film formed on the side surface of the transmissive optical element on the substrate's side of the projection optical system, and it is possible to prevent damage on the soft metal anti-dissolution film having low abrasion resistance and thereby to protect the metal anti-dissolution film. Therefore, it is possible to prevent infiltration to and corrosion of the transmissive optical element by the given liquid interposed between the surface of the substrate and the projection optical system, and thereby to maintain the optical performance of the projection optical system. Moreover, when this transmissive optical element is applied to the exposure apparatus of the liquid immersion type, it is possible to maintain the performance of the exposure apparatus because the transmissive optical element does not dissolve in the liquid. In addition, it is not necessary to replace the transmissive optical element frequently. Therefore, it is possible to maintain high throughput of the exposure apparatus.

A twenty-seventh aspect of the present invention provides the optical element according to the twenty-fourth aspect, in which the metal anti-dissolution film has solubility in water equal to or below 2 ppt and packing density equal to or above 95%.

According to the optical element of the twenty-seventh aspect, the anti-dissolution film having the solubility in water equal to or below 2 ppt is formed on the side surface of the transmissive optical element on the substrate's side of the projection optical system, and it is possible to maintain the optical performance of the projection optical system without causing dissolution of the transmissive optical element to the given liquid interposed between the surface of the substrate and the projection optical system. Moreover, since the anti-dissolution film having the packing density equal to or above 95% is formed on the side surface of the transmissive optical element on the substrate's side of the projection optical system, it is possible to prevent infiltration to and corrosion of the transmissive optical element by the liquid, and thereby to maintain the optical performance of the projection optical system. Therefore, when this transmissive optical element is applied to the exposure apparatus of the liquid immersion type, it is possible to maintain the performance of the exposure apparatus because the transmissive optical element does not dissolve in the liquid. In addition, it is not necessary to replace the transmissive optical element frequently. Therefore, it is possible to maintain high throughput of the exposure apparatus.

A twenty-eighth aspect of the present invention provides the optical element according to the twenty-fourth aspect, in which the metal anti-dissolution film is made of at least one selected from the group consisting of Au, Pt, Ag, Ni, Ta, W, Pd, Mo, Ti, and Cr.

According to the optical element of the twenty-eighth aspect, the metal anti-dissolution film constructed as the film made of at least one of Au, Pt, Ag, Ni, Ta, W, Pd, Mo, Ti, and Cr is formed on the side surface (the tapered surface) of the transmissive optical element on the substrate's side of the projection optical system, or in other words, at a portion where the exposure light beam does not pass through. Therefore, even when this transmissive optical element is applied to the exposure apparatus of the liquid immersion type, it is possible to continue exposure in the optimal condition without shielding the exposure light beam by the metal anti-dissolution film.

A twenty-ninth aspect of the present invention provides the optical element according to the twenty-fifth aspect, in which the adhesion reinforcing film is made of at least one selected from the group consisting of Ta and Cr.

According to the optical element of the twenty-ninth aspect, the adhesion reinforcing film constructed as the film made of at least one of Ta and Cr is formed between the transmissive optical element and the anti-dissolution film. Therefore, it is possible to improve adhesion between the side surface of the transmissive optical element and the anti-dissolution film. As a result, when this transmissive optical element is applied to the exposure apparatus of the liquid immersion type, it is possible to avoid detachment of the anti-dissolution film from the transmissive optical element and to avoid dissolution of the transmissive optical element in the liquid. In this way, it is possible to maintain the performance of the exposure apparatus. In addition, it is not necessary to replace the transmissive optical element frequently. Therefore, it is possible to maintain high throughput of the exposure apparatus.

A thirtieth aspect of the present invention provides the optical element according to the twenty-sixth aspect, in which the protective film for the metal anti-dissolution film is made of at least one selected from the group consisting of $SiO_2$, $Y_2O_3$, $Nd_2F_3$, $Cr_2O_3$, $Ta_2O_5$, $Nb_2O_5$, $TiO_2$, $ZrO_2$, $HfO_2$, and $La_2O_3$.

According to the optical element of the thirtieth aspect, it is possible to select the protective film for the metal anti-dissolution film to be formed on the surface of the metal anti-dissolution film that is formed on the transmissive optical element. Therefore, it is possible to select the most appropriate protective film for the metal anti-dissolution film based on the material of the transmissive optical element, the environment where the transmissive optical element is placed, the type of the given liquid to be interposed between the surface of the substrate and the projection optical system, and the like.

A thirty-first aspect of the present invention provides the optical element according to the nineteenth aspect, in which the second anti-dissolution member includes a light-shielding film.

A thirty-second aspect of the present invention provides the optical element according to the thirty-first aspect, in which the light-shielding film is formed of any of a metal film and a metal oxide film.

A thirty-third aspect of the present invention provides the optical element according to the thirty-second aspect, in which the metal film is made of at least one selected from the group consisting of Au, Pt, Ag, Ni, Ta, W, Pd, Mo, Ti, and Cr, and the metal oxide film is made of at least one selected from the group consisting of $ZrO_2$, $HfO_2$, $TiO_2$, $Ta_2O_5$, $SiO$, and $Cr_2O_3$.

According to the optical element of any one of the thirty-first to thirty-third aspects, it is possible to prevent irradiation of the exposure light beam and reflected light of the exposure light beam from a wafer onto a sealing member formed in a peripheral portion of the side surface (the tapered surface) of the transmissive optical element on the substrate's side of the projection optical system by use of the light-shielding film. In this way, it is possible to prevent deterioration of the sealing member.

A thirty-fourth aspect of the present invention provides the optical element according to the first aspect, which further includes an optical member joined to a surface of the optical element by optical contact through the first anti-dissolution member.

According to the optical element of the thirty-fourth aspect, the optical member optically contacts the optical element through the first anti-dissolution member. Therefore, it is possible to attach the optical member firmly even to the optical element applying a fluoride material as the base material due to the presence of the appropriate anti-dissolution member. As a result, it is possible to protect the optical element by use of the optical member, and thereby to maintain a performance of an optical system incorporating the optical element over a long period of time.

A thirty-fifth aspect of the present invention provides the optical element according to the thirty-fourth aspect, in which the first anti-dissolution member is a film made of $SiO_2$, and the optical member is a member made of silica glass.

According to the optical element of the thirty-fifth aspect, a surface of the first anti-dissolution member used for the optical contact is made of silicon dioxide. Therefore, it is possible to enhance bonding strength to the optical member by use of a hydroxyl group in the silicon dioxide surface. Meanwhile, it is possible to form the silicon dioxide film at high controllability and thereby to achieve high film quality. Moreover, the optical member made of silica glass can achieve particularly excellent water resistance and bonding strength, and favorable transmission of ultraviolet light and the like.

A thirty-sixth aspect of the present invention provides the optical element according to the first aspect, in which the exposure light beam is an ArF laser beam, the optical element is an element made of calcium fluoride, and crystal orientation of the surface of the optical element is defined as a (111) plane.

According to the optical element of the thirty-sixth aspect, the optical element is applied to the exposure apparatus configured to emit the ArF laser beam as the exposure light beam. Therefore, it is possible to achieve a high resolution performance. Moreover, the optical element is made of calcium fluoride and is therefore applicable to a laser having a short wavelength such as the ArF laser. Meanwhile, when the optical element is made of calcium fluoride, the optical element can achieve a favorable transmission performance of ultraviolet light and fine durability against the ultraviolet light and the like. In addition, the anti-dissolution film to be formed thereon, or lanthanum fluoride in particular, is subjected to heteroepitaxial growth when the film is formed on a film forming surface of calcium fluoride having the crystal orientation of the (111) plane. Therefore, the anti-dissolution film formed thereon becomes extremely dense and achieves a crystalline structure with very few defects.

A thirty-seventh aspect of the present invention provides an optical element to be used for an exposure apparatus, which is configured to illuminate a mask with an exposure light beam for transferring a pattern on the mask onto a substrate through a projection optical system and to interpose a given liquid in a space between a surface of the substrate and the projection optical system. Here, the optical element includes a light-shielding film provided on a side surface of a transmissive optical element on the substrate's side of the projection optical system.

A thirty-eighth aspect of the present invention provides the optical element according to the thirty-seventh aspect, in which the light-shielding film is formed of any of a metal film and a metal oxide film.

A thirty-ninth aspect of the present invention provides the optical element according to the thirty-eighth aspect, in which the metal film is made of at least one selected from the group consisting of Au, Pt, Ag, Ni, Ta, W, Pd, Mo, Ti, and Cr, and the metal oxide film is made of at least one selected from the group consisting of $ZrO_2$, $HfO_2$, $TiO_2$, $Ta_2O_5$, SiO, and $Cr_2O_3$.

According to the optical element of any one of the thirty-seventh to thirty-ninth aspects, it is possible to prevent irradiation of the exposure light beam and reflected light of the exposure light beam from a wafer onto the sealing member formed in the peripheral portion of the side surface (the tapered surface) of the transmissive optical element on the substrate's side of the projection optical system by use of the light-shielding film. In this way, it is possible to prevent deterioration of the sealing member.

A fortieth aspect of the present invention provides an exposure apparatus configured to illuminate a mask with an exposure light beam for transferring a pattern on the mask onto a substrate through a projection optical system and to interpose a given liquid in a space between a surface of the substrate and the projection optical system. Here, the exposure apparatus includes a first anti-dissolution member provided on a surface of a transmissive optical element on the substrate's side of the projection optical system.

According to the exposure apparatus of the fortieth aspect, the first anti-dissolution member is formed on the surface (a tip surface) of the optical element. Therefore, the optical element does not dissolve in the liquid filling the space between the tip portion of the projection optical system and the substrate. Accordingly, it is possible to avoid frequent replacement of the optical element, and thereby to maintain high throughput of the exposure apparatus. In addition, since the optical element does not dissolve in the liquid, it is possible to maintain an optical performance of the projection optical system and to continue exposure in the optimal condition.

A forty-first aspect of the present invention provides the exposure apparatus according to the fortieth aspect, in which the first anti-dissolution member includes a single-layer film having a protective function to protect the optical element against the liquid.

According to the exposure apparatus of the forty-first aspect, it is possible to reduce an interface in comparison with a multilayer film. Therefore, it is possible to minimize an adverse effect of a chemical reaction which is apt to occur when the liquid infiltrates into an interface of a protective layer serving as an anti-dissolution film. Moreover, it is easier to form the film as compared to formation of the anti-dissolution film including the multilayer film.

A forty-second aspect of the present invention provides the exposure apparatus according to the fortieth aspect, in which the first anti-dissolution member includes a multilayer film having a protective function to protect the optical element against the liquid and an anti-reflection function to prevent reflection of the exposure light beam.

According to the exposure apparatus of the forty-second aspect, the tip of the optical element is not corroded by the liquid. Therefore, it is not necessary to stop operation of the apparatus in order to replace the corroded optical element, and it is thereby possible to manufacture end products efficiently. Moreover, since the optical element of the present invention has corrosion resistance and a stable optical characteristic, it is possible to stabilize the quality of end products to be manufactured by use of the exposure apparatus embedding the optical element of the present invention.

A forty-third aspect of the present invention provides the exposure apparatus according to the fortieth aspect, in which the first anti-dissolution member is made of at least one selected from the group consisting of $MgF_2$, $LaF_3$, $SrF_2$, $YF_3$, $LuF_3$, $HfF_4$, $NdF_3$, $GdF_3$, $YbF_3$, $DyF_3$, $AlF_3$, $Na_3AlF_6$, $5NaF.3AlF_3$, $Al_2O_3$, $SiO_2$, $TiO_2$, MgO, $HfO_2$, $Cr_2O_3$, $ZrO_2$, $Ta_2O_5$, and $Nb_2O_5$.

According to the exposure apparatus of the forty-third aspect, it is possible to select the anti-dissolution member to be formed on the optical element. Therefore, it is possible to select the most appropriate anti-dissolution member based on the material of the optical element, the environment where the optical element is placed, the type of the liquid used for filling the space between the projection optical system and the substrate, and the like.

A forty-fourth aspect of the present invention provides the exposure apparatus according to the forty-second aspect, in which the multilayer film includes n layers (n is an integer) and has a layer structure, which is expressed as first layer/second layer/other successive layers/n-th layer, of one selected from the group consisting of (i) $LaF_3/MgF_2$, (ii) $MgF_2/SiO_2$, (iii) $MgF_2/SiO_2/SiO_2$, (iv) $LaF_3/MgF_2/SiO_2$, (v) $LaF_3/MgF_2/Al_2O_3$, (vi) $LaF_3/MgF_2/Al_2O_3/SiO_2$, (vii) $LaF_3/MgF_2/LaF_3/MgF_2$, (viii) $LaF_3/MgF_2/LaF_3/SiO_2$, (ix) $LaF_3/MgF_2/LaF_3/MgF_2/SiO_2$, and (x) $LaF_3/MgF_2/LaF_3/Al_2O_3/SiO_2$.

According to the exposure apparatus of the forty-fourth aspect, the multilayer film has the protective function for a given time period, and is therefore capable of protecting the optical element against water as the immersion liquid for ten years, for example. Hence it is possible to provide the high-performance exposure apparatus having high resolution and a large depth of focus by use of the liquid immersion method. At the same time, it is possible to provide the stable exposure apparatus having the stable optical characteristic without being corroded by the liquid for the given time period.

A forty-fifth aspect of the present invention provides the exposure apparatus according to the fortieth aspect, in which the first anti-dissolution member includes a film made of an oxide formed by a wet film forming method.

According to the exposure apparatus of the forty-fifth aspect, the anti-dissolution oxide film for preventing dissolution to the liquid is formed on the surface of the transmissive optical element on the substrate's side of the projection optical system by use of the wet film forming method characterized by high homogeneity and a high filling performance relative to voids. Therefore, it is possible to prevent infiltration to and corrosion of the transmissive optical element by the given liquid interposed between the surface of the substrate and the projection optical system, and thereby to maintain the optical performance of the projection optical system. As a result, it is possible to avoid dissolution of the transmissive optical element in the liquid and thereby to maintain the performance of the exposure apparatus. In addition, it is not necessary to replace the transmissive optical element frequently. Therefore, it is possible to maintain high throughput of the exposure apparatus.

Here, when the transmissive optical element is made of calcium fluoride having a smoothly polished surface, it is preferable to subject the transmissive optical element to a surface treatment for increasing the surface area of the transmissive optical element by roughening the surface of the transmissive optical element to the extent not to degrade the optical performance of the projection optical system in order to enhance adhesion between the transmissive optical element and the anti-dissolution oxide film.

A forty-sixth aspect of the present invention provides the exposure apparatus according to the forty-second aspect, in which the multilayer film includes a first film formed by a dry film forming method and a second film made of an oxide formed by a wet film forming method.

According to the exposure apparatus of the forty-sixth aspect, the first film and the second film formed on the transmissive optical element on the substrate's side of the projection optical system are not detached from the transmissive optical element. Moreover, the transmissive optical element does not dissolve in the liquid filling the space between the tip portion of the projection optical system and the substrate. Hence it is possible to maintain the optical performance of the projection optical system and to continue exposure in the optimal condition. In addition, it is not necessary to replace the transmissive optical element frequently. Therefore, it is possible to maintain high throughput of the exposure apparatus.

A forty-seventh aspect of the present invention provides the exposure apparatus according to the fortieth aspect, in which the first anti-dissolution member includes a thin plate having a protective function to protect the optical element against the liquid and an anti-reflection function to prevent reflection of the exposure light beam. Here, the thin plate is detachably joined to a surface of the optical element.

According to the exposure apparatus of the forty-seventh aspect, the tip of the optical element is not corroded by the liquid. Therefore, it is not necessary to stop operation of the exposure apparatus in order to replace the corroded optical element, and it is thereby possible to manufacture end products efficiently. Moreover, since the optical element of the present invention has the corrosion resistance and the stable optical characteristic, it is possible to stabilize the quality of end products to be manufactured by use of the exposure apparatus embedding the optical element of the present invention.

A forty-eighth aspect of the present invention provides the exposure apparatus according to the fortieth aspect, which further includes a second anti-dissolution member on a side surface of the transmissive optical element on the substrate's side of the projection optical system.

According to the exposure apparatus of the forty-eighth aspect, the second anti-dissolution member is formed on the surface (a tip surface) on the substrate's side of the optical element and on the side surface (a tapered surface) of the optical element, or in other words, at portions where the exposure light beam does not pass through. Therefore, it is possible to prevent dissolution of the optical element in the liquid filling the space between the tip portion of the projection optical system and the substrate. Hence it is not necessary to replace the optical element frequently, and it is possible to maintain high throughput of the exposure apparatus. In addition, since the optical element does not dissolve in the liquid, it is possible to maintain the optical performance of the projection optical system and to continue exposure in the optimal condition.

A forty-ninth aspect of the present invention provides the exposure apparatus according to the forty-eighth aspect, in which each of the first anti-dissolution member and the second anti-dissolution member includes a film that is formed by use of an identical material.

According to the exposure apparatus of the forty-ninth aspect, it is possible to form the anti-dissolution films on the surface on the substrate's side of the optical element and on the side surface of the optical element at the same time. Therefore, it is possible to form the anti-dissolution films by a simple process.

A fiftieth aspect of the present invention provides the exposure apparatus according to the forty-eighth aspect, in which the second anti-dissolution member includes a metal anti-dissolution film having a protective function to protect the optical element against the liquid.

According to the exposure apparatus of the fiftieth aspect, the side surface of the transmissive optical element on the substrate's side of the projection optical system is provided with the metal anti-dissolution film, which is insoluble to the given liquid interposed between the surface of the substrate and the projection optical system. Therefore, it is possible to prevent infiltration to and corrosion of the transmissive optical element by the liquid and thereby to maintain the optical performance of the projection optical system. As a result, it is possible to avoid dissolution of the transmissive optical element in the liquid and thereby to maintain the performance of the exposure apparatus. In addition, it is not necessary to replace the transmissive optical element frequently. Therefore, it is possible to maintain high throughput of the exposure apparatus.

A fifty-first aspect of the present invention provides the exposure apparatus according to the fiftieth aspect, in which the second anti-dissolution member further includes an adhesion reinforcing film formed between the side surface of the optical element and the metal anti-dissolution film.

According to the exposure apparatus of the fifty-first aspect, the metal anti-dissolution film is formed on the surface of the adhesion reinforcing film formed on the side surface of the transmissive optical element on the substrate's side of the projection optical system, and it is possible to attach the metal anti-dissolution film closely to the transmissive optical element. Therefore, it is possible to prevent infiltration to and corrosion of the transmissive optical element by the given liquid interposed between the surface of the substrate and the projection optical system, and thereby to maintain the optical performance of the projection optical system. Moreover, it is possible to maintain the performance of the exposure apparatus because the metal anti-dissolution film is not detached from the transmissive optical element and the transmissive optical element does not dissolve in the liquid. In addition, it is not necessary to replace the transmissive optical element frequently. Therefore, it is possible to maintain high throughput of the exposure apparatus.

A fifty-second aspect of the present invention provides the exposure apparatus according to the fiftieth aspect, in which the second anti-dissolution member further includes a protective film for the metal anti-dissolution film. Here, the protective film is formed on a surface of the metal anti-dissolution film.

According to the exposure apparatus of the fifty-second aspect, the protective film for the metal anti-dissolution film is formed on the surface of the metal anti-dissolution film formed on the side surface of the transmissive optical element on the substrate's side of the projection optical system, and it is possible to prevent damage on the soft metal anti-dissolution film having low abrasion resistance and thereby to protect the metal anti-dissolution film. Therefore, it is possible to prevent infiltration to and corrosion of the transmissive optical element by the given liquid interposed between the surface of the substrate and the projection optical system, and thereby to maintain the optical performance of the projection optical system. Moreover, it is possible to maintain the performance of the exposure apparatus because the transmissive optical element does not dissolve in the liquid. In addition, it is not necessary to replace the transmissive optical element frequently. Therefore, it is possible to maintain high throughput of the exposure apparatus.

A fifty-third aspect of the present invention provides the exposure apparatus according to the fiftieth aspect, in which the metal anti-dissolution film is made of at least one selected from the group consisting of Au, Pt, Ag, Ni, Ta, W, Pd, Mo, Ti, and Cr.

According to the exposure apparatus of the fifty-third aspect, the metal anti-dissolution film constructed as the film made of at least one of Au, Pt, Ag, Ni, Ta, W, Pd, Mo, Ti, and Cr is formed on the side surface (the tapered surface) of the transmissive optical element on the substrate's side of the projection optical system, or in other words, at a portion where the exposure light beam does not pass through. Therefore, it is possible to continue exposure in the optimal condition without shielding the exposure light beam by the metal anti-dissolution film.

A fifty-fourth aspect of the present invention provides the exposure apparatus according to the fifty-second aspect, in which the protective film for the metal anti-dissolution film is made of at least one selected from the group consisting of $SiO_2$, $Y_2O_3$, $Nd_2F_3$, $Cr_2O_3$, $Ta_2O_5$, $Nb_2O_5$, $TiO_2$, $ZrO_2$, $HfO_2$, and $La_2O_3$.

According to the exposure apparatus of the fifty-fourth aspect, it is possible to select the protective film for the metal anti-dissolution film to be formed on the surface of the metal anti-dissolution film that is formed on the transmissive optical element. Therefore, it is possible to select the most appropriate protective film for the metal anti-dissolution film based on the material of the transmissive optical element, the environment where the transmissive optical element is placed, the type of the given liquid to be interposed between the surface of the substrate and the projection optical system, and the like.

A fifty-fifth aspect of the present invention provides the exposure apparatus according to the forty-eighth aspect, in which the second anti-dissolution member includes a light-shielding film.

A fifty-sixth aspect of the present invention provides the exposure apparatus according to the fifty-fifth aspect, in which the light-shielding film is formed of any of a metal film and a metal oxide film.

A fifty-seventh aspect of the present invention provides the exposure apparatus according to the fifty-sixth aspect, in which the metal film is made of at least one selected from the group consisting of Au, Pt, Ag, Ni, Ta, W, Pd, Mo, Ti, and Cr, and the metal oxide film is made of at least one selected from the group consisting of $ZrO_2$, $HfO_2$, $TiO_2$, $Ta_2O_5$, SiO, and $Cr_2O_3$.

According to the exposure apparatus of any one of the fifty-fifth to fifty-seventh aspects, it is possible to prevent irradiation of the exposure light beam and reflected light of the exposure light beam from a wafer onto a sealing member formed in a peripheral portion of the side surface (the tapered surface) of the transmissive optical element on the substrate's side of the projection optical system by use of the light-shielding film. In this way, it is possible to prevent deterioration of the sealing member.

A fifty-eighth aspect of the present invention provides the exposure apparatus according to the fortieth aspect, which further includes an optical member joined to a surface of the optical element by optical contact through the first anti-dissolution member.

According to the exposure apparatus of the fifty-eighth aspect, the exposure apparatus applies the projection optical system which embeds the optical member achieving excellent optical contact. Therefore, it is possible to perform an exposure process of the liquid immersion type while maintaining a high performance for over a long period of time.

A fifty-ninth aspect of the present invention provides the exposure apparatus according to the fortieth aspect, in which the exposure light beam is an ArF laser beam, the optical element is an element made of calcium fluoride, and crystal orientation of the surface of the optical element is defined as a (111) plane.

According to the exposure apparatus of the fifty-ninth aspect, the exposure apparatus configured to emit the ArF laser beam as the exposure light beam can achieve a high resolution performance. Moreover, the optical element is made of calcium fluoride and is therefore applicable to a laser having a short wavelength such as the ArF laser. Meanwhile, when the optical element is made of calcium fluoride, the optical element can achieve a favorable transmission performance of ultraviolet light and the like and fine durability against the ultraviolet light and the like. In addition, the anti-dissolution film to be formed thereon, or lanthanum fluoride in particular, is subjected to heteroepitaxial growth when the film is formed on a film forming surface of calcium fluoride having the crystal orientation of the (111) plane. Therefore, the anti-dissolution film formed thereon becomes extremely dense and achieves a crystalline structure with very few defects.

A sixtieth aspect of the present invention provides an exposure apparatus configured to illuminate a mask with an exposure light beam for transferring a pattern on the mask onto a substrate through a projection optical system, and to interpose a given liquid in a space between a surface of the substrate and the projection optical system. Here, the exposure apparatus includes a light-shielding film provided on a side surface of a transmissive optical element on the substrate's side of the projection optical system.

A sixty-first aspect of the present invention provides the exposure apparatus according to the sixtieth aspect, in which the light-shielding film is formed of any of a metal film and a metal oxide film.

A sixty-second aspect of the present invention provides the exposure apparatus according to the sixty-first aspect, in which the metal film is made of at least one selected from the group consisting of Au, Pt, Ag, Ni, Ta, W, Pd, Mo, Ti, and Cr, and the metal oxide film is made of at least one selected from the group consisting of $ZrO_2$, $HfO_2$, $TiO_2$, $Ta_2O_5$, SiO, and $Cr_2O_3$.

According to the exposure apparatus of any one of the sixtieth to sixty-second aspects, it is possible to prevent irradiation of the exposure light beam and reflected light of the exposure light beam from a wafer onto the sealing member formed in the peripheral portion of the side surface (the tapered surface) of the transmissive optical element on the substrate's side of the projection optical system by use of the light-shielding film. In this way, it is possible to prevent deterioration of the sealing member.

DETAILED DESCRIPTION OF THE PREFERRED EMBODIMENTS

Now, preferred embodiments of the present invention will be described with reference to the accompanying drawings.

Embodiment 1

Figure 1:
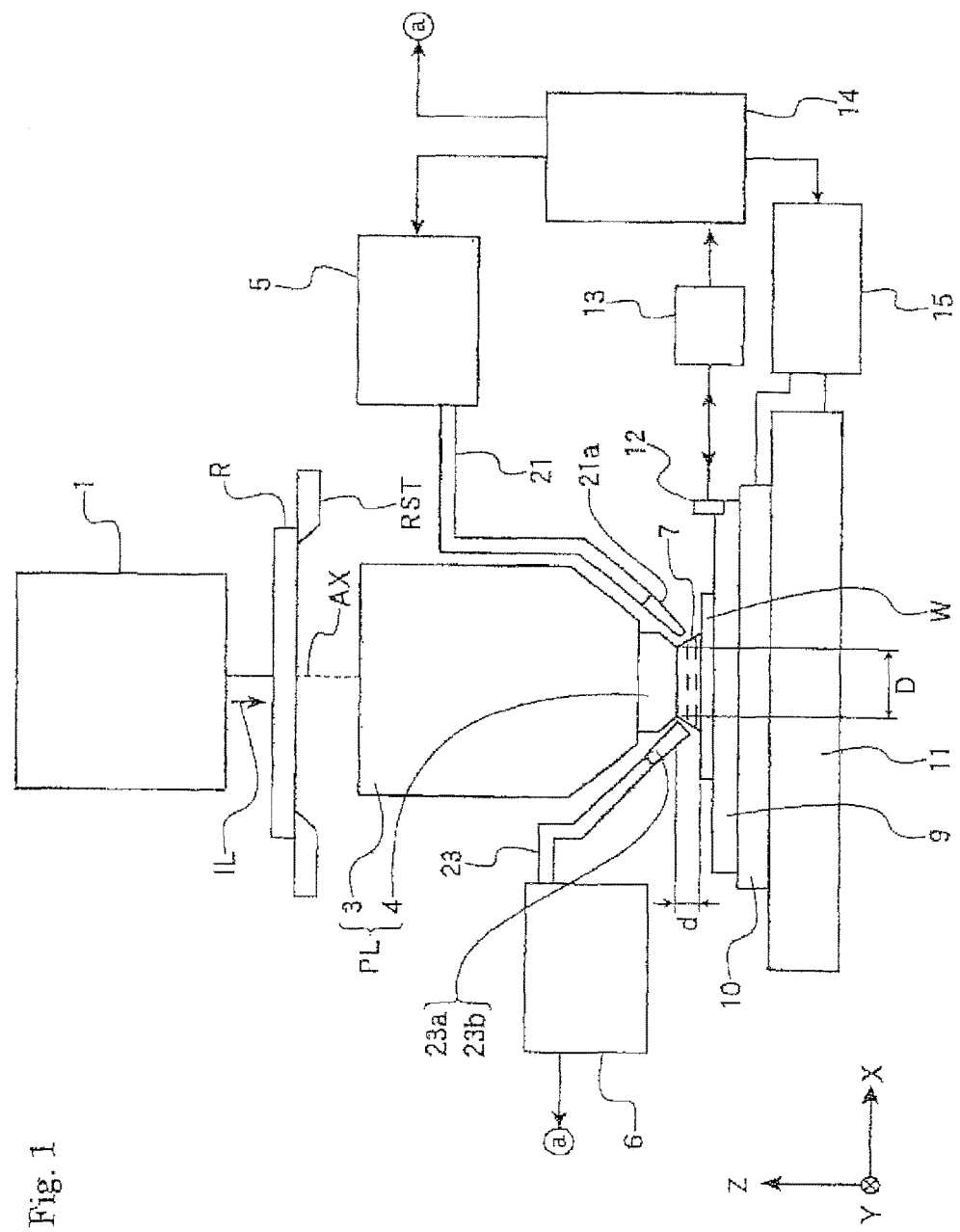
FIG. 1 is a view showing a schematic configuration of a projection exposure apparatus used in Embodiment 1.

A projection exposure apparatus according to Embodiment 1 of this invention will now be described with reference to the accompanying drawings. FIG. 1 is a view showing a schematic configuration of a projection exposure apparatus applying the step and repeat method according to Embodiment 1. It is to be noted that an XYZ orthogonal coordinate system as illustrated in FIG. 1 will be set up in the following explanation, and positional relations of respective members will be described with reference to this XYZ orthogonal coordinate system. In terms of the XYZ orthogonal coordinate system, an X axis and a Y axis are set parallel to a wafer W while a Z axis is set in the orthogonal direction to the wafer W. In terms of the XYZ orthogonal coordinate system in the figure, an XY plane is actually set to a parallel plane to a horizontal plane while the Z axis is set in the vertical direction.

As shown in FIG. 1, the projection exposure apparatus according to this embodiment is provided with an illumination optical system 1 which includes an ArF excimer laser as an exposure light source, an optical integrator (a homogenizer), a field stop, a condenser lens, and the like. Exposure light (an exposure light beam) IL consisting of ultraviolet pulse beams having a wavelength of 193 nm is emitted from the light source, then passes through the illumination optical system 1 and thereby illuminates a pattern formed on a reticle (a mask) R. The light passing through the reticle R is reduced and projected onto an exposure region on the wafer (a substrate) W coated with a photoresist at given projection magnification β (β is set to ¼ or ⅕, for example) through a projection optical system PL which is rendered telecentric on both sides (or on one side toward the wafer W).

Here, as the exposure light IL, it is also possible to use a KrF excimer laser beam (having a wavelength of 248 nm), an $F_2$ laser beam (having a wavelength of 157 nm), an i-line from a mercury lamp (having a wavelength of 365 nm), and the like.

Meanwhile, the reticle R is retained on a reticle stage RST, and the reticle stage RST incorporates a mechanism for finely moving the reticle in the X direction, the Y direction, and the direction of rotation. Positions of the reticle stage RST in terms of the X direction, the Y direction, and the direction of rotation are measured and controlled in real time by a reticle laser interferometer (not shown).

Meanwhile, the wafer W is fixed onto a Z stage 9 by use of a wafer holder (not shown). The Z stage 9 is fixed onto an XY stage 10 configured to travel along the XY plane that is substantially parallel to an image plane of the projection optical system PL, and controls a focal position (a position in the Z direction) and a tilt angle of the wafer W. Positions of the Z stage 9 in terms of the X direction, the Y direction, and the direction of rotation are measured and controlled in real time by a wafer laser interferometer 13 applying a movable mirror 12 located on the Z stage 9. Moreover, the XY stage 10 is placed on a base 11 and configured to control the X direction, the Y direction, and the direction of rotation of the wafer W.

A main control system 14 included in this projection exposure apparatus adjusts the positions of the reticle R in terms of the X direction, the Y direction, and the direction of rotation based on measurement values which are measured with the reticle laser interferometer. Specifically, the main control system 14 transmits a control signal to the mechanism incorporated in the reticle stage RST, and adjusts the positions of the reticle R by finely moving the reticle stage RST.

Moreover, the main control system 14 adjusts the focal position (the position in the Z direction) and the tilt angle of the wafer W in order to align a surface of the wafer W with the image plane of the projection optical system PL by applying the auto-focus method and the auto-leveling method. Specifically, the main control system 14 adjusts the focal position and the tilt angle of the wafer W by transmitting a control signal to a wafer stage drive system 15 and driving the Z stage 9 with the wafer stage drive system 15. In addition, the main control system 14 adjusts the positions of the wafer W in terms of the X direction, the Y direction, and the direction of rotation based on measurement values which are measured with the wafer laser interferometer 13. Specifically, the main control system 14 adjusts the positions and the direction of rotation of the wafer W by transmitting a control signal to the wafer stage drive system 15 and driving the XY stage 10 with the wafer stage drive system 15.

At the time of exposure, the main control system 14 sequentially moves respective shot regions on the wafer W stepwise to a position of exposure by transmitting a control signal to the wafer stage drive system 15 and driving the XY stage 10 with the wafer stage drive system 15. Specifically, the main control system 14 repeats an operation for exposing a pattern image of the reticle R onto the wafer W in accordance with the step and repeat method.

This projection exposure apparatus adopts the liquid immersion method in order to virtually shorten an exposure wavelength and to improve resolution. Here, in the projection exposure apparatus of the liquid immersion type adopting the liquid immersion method, a given liquid 7 fills a space between a surface of the wafer W and a transmissive optical element 4 on the wafer W side of the projection optical system PL at least during the transfer of the pattern image of the reticle R onto the wafer W. The projection optical system PL includes a lens barrel 3 for housing multiple optical elements made of silica glass or calcium fluoride, which collectively constitute the projection optical system PL. In this projection optical system PL, the transmissive optical element 4 located in the closest position to the wafer W is made of calcium fluoride, and surfaces (a tip portion 4A on the wafer W side and a tapered surface 4B (see FIG. 2)) of the transmissive optical element 4 are only allowed to contact the liquid 7. In this way, corrosion and other defects of the lens barrel 3 made of metal are avoided.

Figure 2:
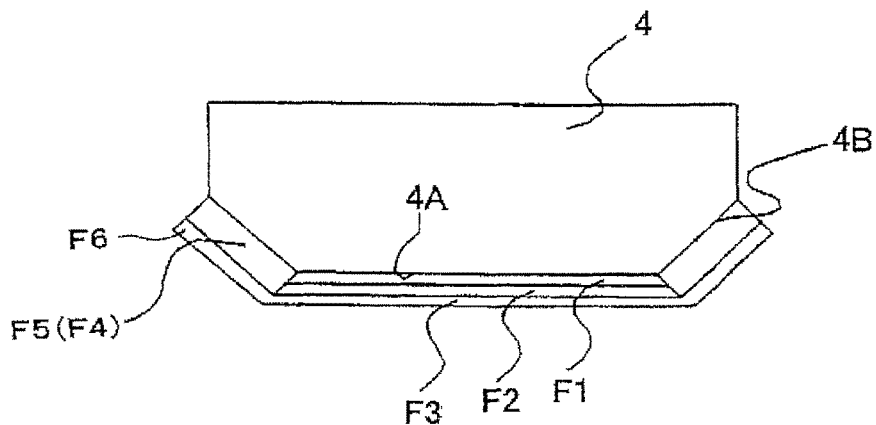
FIG. 2 is a view showing a configuration of an optical element of Embodiment 1.

Here, the base material of the transmissive optical element 4 shown in FIG. 2 is made of calcium fluoride, and crystal orientation of a film forming surface of the calcium fluoride is defined as a (111) plane. Moreover, a magnesium fluoride ($MgF_2$) film F1 and a silicon dioxide ($SiO_2$) film F2 collectively serving as an anti-dissolution film are formed at the tip portion 4A on the wafer W side of the transmissive optical element 4, or a portion where the exposure light passes through, by use of the vacuum vapor deposition method. In addition, another silicon dioxide ($SiO_2$) film F3 is formed thereon by use of a wet film forming method.

Meanwhile, a tantalum (Ta) film F5 (F4) serving as a metal anti-dissolution film (which also functions as an adhesion reinforcing film) is formed on the tapered surface 4B of the transmissive optical element 4, or a portion where the exposure light does not pass through, by use of the sputtering method. In addition, a silicon dioxide ($SiO_2$) film F6 serving as an protective film for the metal anti-dissolution film (a protective film for the anti-dissolution film) for protecting the metal anti-dissolution film is formed on a surface of the metal anti-dissolution film (the anti-dissolution film) F5 by the wet film forming method simultaneously with formation of the silicon dioxide ($SiO_2$) film F3. Here, the metal anti-dissolution film (the anti-dissolution film) F5 to be formed on the tapered surface 4B of the transmissive optical element 4 has solubility in pure water equal to or below 2 ppt and packing density equal to or above 95%. Moreover, mean reflectance of the anti-dissolution film formed on the tip portion 4A of the transmissive optical element 4 is equal to or below 2% when an exit angle of the exposure light beam is set to 50 degrees.

The transmissive optical element 4 shown in FIG. 2 is for instance manufactured by the following steps:
(i) a masking seal is attached to the tip portion 4A on the wafer W side of the transmissive optical element 4, or the portion where the exposure light passes through, so as to avoid attachment of the metal anti-dissolution film F5 which is supposed to be formed on the tapered surface 4B of the transmissive optical element 4 or the portion where the exposure light does not pass through;
(ii) The tantalum (Ta) film is deposited in the thickness of 200 nm on the tapered surface 4B of the transmissive optical element 4 by use of the sputtering method to form the metal anti-dissolution film (also functioning as the adhesion reinforcing film) F5;
(iii) The masking seal attached to the tip portion 4A on the wafer W side of the transmissive optical element 4 is peeled off;
(iv) The magnesium fluoride ($MgF_2$) film F1 in the thickness of 15 nm and the silicon dioxide ($SiO_2$) film F2 in the thickness of 300 nm are formed at the tip portion 4A on the wafer W side of the transmissive optical element 4 by use of the vacuum vapor deposition method;
(v) The silicon dioxide ($SiO_2$) films F3 and F6 in the thickness of 130 nm are simultaneously formed on the tantalum (Ta) film F5 serving as the metal anti-dissolution film that is formed on the tapered surface 4B of the transmissive optical element 4 and on the silicon dioxide ($SiO_2$) film F2 formed at the tip portion 4A on the wafer W side of the transmissive optical element 4 by use of the wet film forming method, and then the films F3 and F6 are heated and sintered at 160° C.; and (vi) The silicon dioxide ($SiO_2$) film F6 formed on the tantalum (Ta) film F5 serving as the metal anti-dissolution film functions as the protective film for the metal anti-dissolution film for protecting the metal anti-dissolution film.

Meanwhile, pure water which is easily available in large quantity at a semiconductor manufacturing plant or the like is used as the liquid 7. Here, the pure water contains very low quantity of impurities and is therefore expected to exhibit a function to clean the surface of the wafer W.

Figure 3:
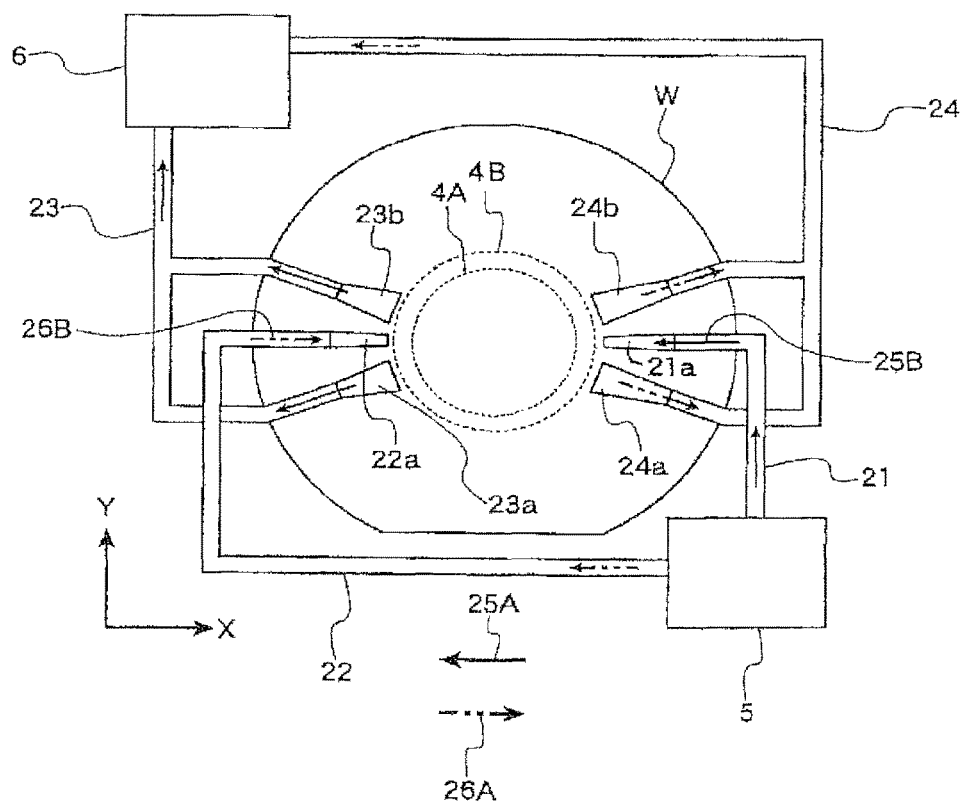
FIG. 3 is a view showing positional relations among a tip portion of the optical element, and exhaust nozzles as well as intake nozzles in an X direction in terms of a projection optical system shown in FIG. 1.
Figure 4:
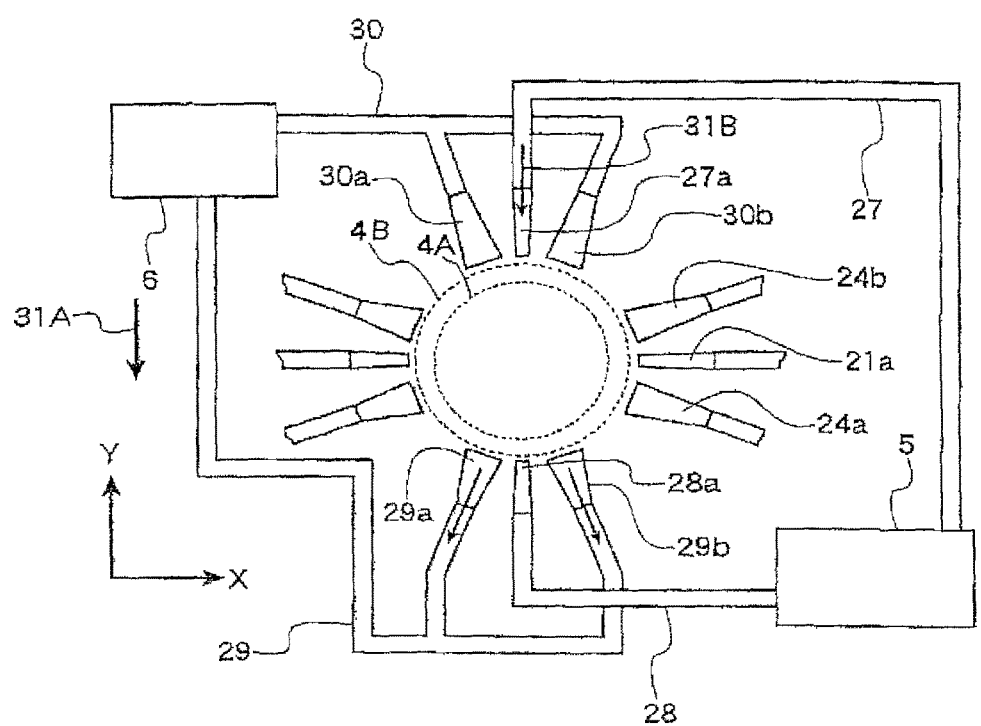
FIG. 4 is a view showing positional relations among the tip portion of the optical element, and exhaust nozzles as well as intake nozzles in a Y direction in terms of the projection optical system shown in FIG. 1.

FIG. 3 is a view showing positional relations among the tip portion 4A and the tapered surface 4B on the wafer W side of the transmissive optical element 4 in the projection optical system PL, the wafer W, and two pairs of exhaust nozzles as well as intake nozzles configured to interpose the tip portion 4A and the tapered surface 4B on the wafer W side in the X direction. Meanwhile, FIG. 4 is a view showing positional relations among the tip portion 4A and the tapered surface 4B on the wafer W side of the transmissive optical element 4 in the projection optical system PL, and two pairs of exhaust nozzles as well as intake nozzles configured to interpose the tip portion 4A and the tapered surface 4B on the wafer W side in the Y direction. The projection exposure apparatus of this embodiment includes a liquid supply device 5 for controlling supply of the liquid 7 and a liquid recovery device 6 for controlling discharge of the liquid 7.

The liquid supply device 5 includes a tank (not shown) for the liquid 7, a booster pump (not shown), a temperature control device (not shown), and the like. Moreover, as shown in FIG. 3, an exhaust nozzle 21a having an elongated tip portion along the +X direction of the tip portion 4A and the tapered surface 4B on the wafer W side is connected to the liquid supply device 5 through a supply tube 21, and an exhaust nozzle 22a having an elongated tip portion along the −X direction of the tip portion 4A and the tapered surface 4B on the wafer W side is also connected thereto through a supply tube 22. Meanwhile, as shown in FIG. 4, an exhaust nozzle 27a having an elongated tip portion along the +Y direction of the tip portion 4A and the tapered surface 4B on the wafer W side is connected to the liquid supply device 5 through a supply tube 27, and an exhaust nozzle 28a having an elongated tip portion along the −Y direction of the tip portion 4A and the tapered surface 4B on the wafer W side is also connected thereto through a supply tube 28. The liquid supply device 5 adjusts the temperature of the liquid 7 by use of the temperature control device, and supplies the temperature-controlled liquid 7 onto the wafer W from at least one exhaust nozzle out of the exhaust nozzles 21a, 22a, 27a, and 28a through at least one supply tube out of the supply tubes 21, 22, 27, and 28. Here, the temperature of the liquid 7 is set to substantially the same degree as the temperature inside a chamber in which the projection exposure apparatus of this embodiment is housed by use of the temperature control device, for example.

The liquid recovery device 6 includes a tank (not shown) for the liquid 7, a suction pump (not shown), and the like. Moreover, as shown in FIG. 3, intake nozzles 23a and 23b each having a tip portion spread in the −X direction of the tapered surface 4B are connected to the liquid recovery device 6 through a recovery tube 23, and intake nozzles 24a and 24b each having a tip portion spread in the +X direction of the tapered surface 4B are also connected thereto through a recovery tube 24. Here, the intake nozzles 23a, 23b, 24a, and 24b are disposed in the manner that are spread into fan shapes relative to an axis that passes through the center of the tip portion 4A on the wafer W side and is parallel to the X axis. Meanwhile, as shown in FIG. 4, intake nozzles 29a and 29b each having a tip portion spread in the −Y direction of the tapered surface 4B are connected to the liquid recovery device 6 through a recovery tube 29, and intake nozzles 30a and 30b each having a tip portion spread in the +Y direction of the tapered surface 4B are also connected thereto through a recovery tube 30. Here, the intake nozzles 29a, 29b, 30a, and 30b are disposed in the manner that are spread into fan shapes relative to an axis that passes through the center of the tip portion 4A on the wafer W side and is parallel to the Y axis.

The liquid recovery device 6 recovers the liquid 7 from the wafer W through at least one intake nozzle out of the intake nozzles 23a, 23b, 24a, 24b, 29a, 29b, 30a, and 30b through at least one recovery tube out of the recovery tubes 23, 24, 29, and 30.

Next, methods of supplying and recovering the liquid 7 will be described. When the wafer W is moved stepwise in a direction (the −X direction) of an arrow 25A indicated with a solid line in FIG. 3, the liquid supply device 5 supplies the liquid 7 to a space between the tip portion 4A as well as the tapered surface 4B on the wafer W side of the transmissive optical element 4 and the wafer W through the supply tube 21 and the exhaust nozzle 21a. The liquid recovery device 6 recovers the liquid 7, which is supplied from the liquid supply device 5 to the space between the tip portion 4A as well as the tapered surface 4B on the wafer W side and the wafer W, from the wafer W through the recovery tube 23 and the intake nozzles 23a and 23b. In this case, the liquid 7 flows on the wafer W in a direction (the −X direction) of an arrow 25B, whereby the space between the wafer W and the transmissive optical element 4 is stably filled with the liquid 7.

On the other hand, when the wafer W is moved stepwise in a direction (the +X direction) of an arrow 26A indicated with a chain line in FIG. 3, the liquid supply device 5 supplies the liquid 7 to the space between the tip portion 4A as well as the tapered surface 4B on the wafer W side of the transmissive optical element 4 and the wafer W through the supply tube 22 and the exhaust nozzle 22a. The liquid recovery device 6 recovers the liquid 7, which is supplied from the liquid supply device 5 to the space between the tip portion 4A as well as the tapered surface 4B on the wafer W side and the wafer W, through the recovery tube 24 and the intake nozzles 24a and 24b. In this case, the liquid 7 flows on the wafer W in a direction (the +X direction) of an arrow 26B, whereby the space between the wafer W and the transmissive optical element 4 is stably filled with the liquid 7.

Meanwhile, when the wafer W is moved stepwise in the Y direction, the liquid 7 is supplied and recovered along the Y direction. Specifically, when the wafer W is moved stepwise in a direction (the −Y direction) of an arrow 31A indicated with a solid line in FIG. 4, the liquid supply device 5 supplies the liquid 7 through the supply tube 27 and the exhaust nozzle 27a. The liquid recovery device 6 recovers the liquid 7, which is supplied from the liquid supply device 5 to the space between the tip portion 4A as well as the tapered surface 4B on the wafer W side and the wafer W, through the recovery tube 29 and the intake nozzles 29a and 29b. In this case, the liquid 7 flows on the exposure region in a direction (the −Y direction) of an arrow 31B, whereby the space between the wafer W and the transmissive optical element 4 is stably filled with the liquid 7.

On the other hand, when the wafer W is moved stepwise in the +Y direction, the liquid supply device 5 supplies the liquid 7 through the supply tube 28 and the exhaust nozzle 28a. The liquid recovery device 6 recovers the liquid 7, which is supplied from the liquid supply device 5 to the space between the tip portion 4A on the wafer W side and the wafer W, through the recovery tube 30 and the intake nozzles 30a and 30b. In this case, the liquid 7 flows on the exposure region in the +Y direction, whereby the space between the wafer W and the transmissive optical element 4 is stably filled with the liquid 7.

Here, in addition to the nozzles configured to supply and recover the liquid 7 along the X direction and the Y direction, it is also possible to provide nozzles for supplying and recovering the liquid 7 along oblique directions, for example.

Figure 5:
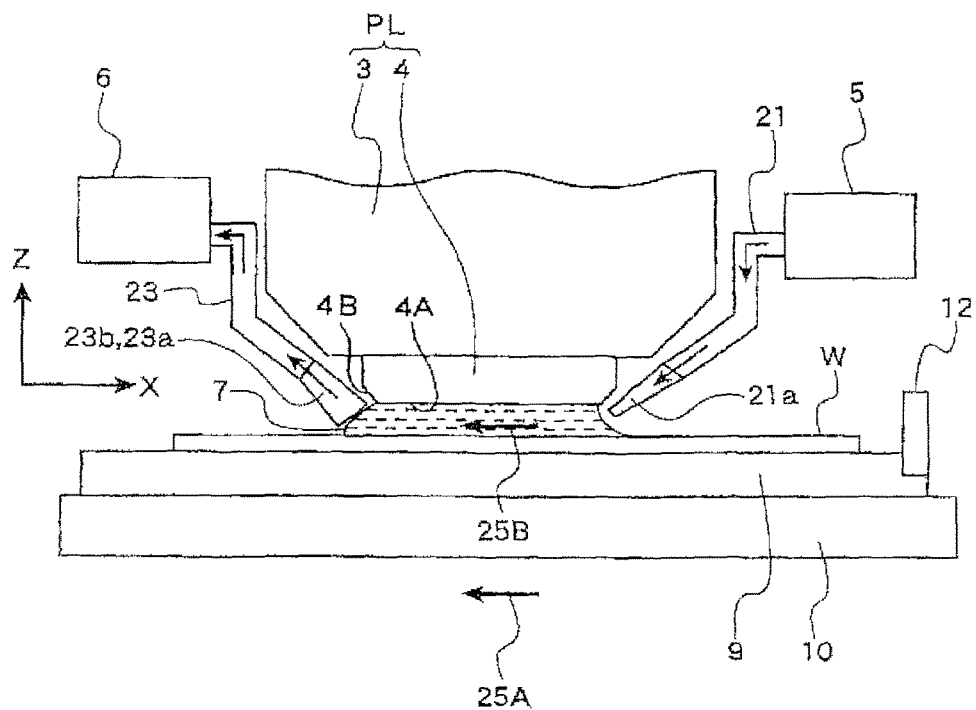
FIG. 5 is an enlarged view of a substantial part in the projection optical system shown in FIG. 1, which illustrates aspects of supply and recovery of a liquid to and from a space between the optical element in the projection optical system and a wafer W.

Next, methods of controlling an amount of supply and an amount of recovery of the liquid 7 will be described. FIG. 5 is a view showing the state of supplying and recovering the liquid 7 to and from the space between the optical element 4 constituting the projection optical system PL and the wafer W. As shown in FIG. 5, when the wafer W is traveling in the direction (the −X direction) of the arrow 25A, the liquid 7 supplied from the exhaust nozzle 21a flows in the direction (the −X direction) of an arrow 25B and is recovered by the intake nozzles 23a and 23b. In order to maintain a constant amount of the liquid 7 to fill the space between the optical element 4 and the wafer W even when the wafer W is traveling, an amount of supply Vi (m³/s) and an amount of recovery Vo (m³/s) of the liquid 7 are set equal. Moreover, the amount of supply Vi and the amount of recovery Vo of the liquid 7 are adjusted based on a traveling speed v of the XY stage 10 (the wafer W). Specifically, the amount of supply Vi and the amount of recovery Vo of the liquid 7 are calculated by the following formula 1.

$$Vi = Vo = D \cdot v \cdot d \quad \text{(Formula 1)}$$

Here, D denotes a diameter (m) of the tip portion 4A of the optical element 4 as shown in FIG. 1. Meanwhile, v denotes the traveling speed (m/s) of the XY stage 10 and d denotes a working distance (m) of the projection optical system PL. The speed v for moving the XY stage 10 stepwise is set up by the main control system 14, while the values D and d are preset. Accordingly, the liquid 7 always fills the space between the optical element 4 and the wafer W by calculating and adjusting the amount of supply Vi and the amount of recovery Vo of the liquid 7 based on the formula 1.

Here, the working distance d of the projection optical system PL is preferably set as narrow as possible so as to retain the liquid 7 stably between the optical element 4 and the wafer W. For example, the working distance d of the projection optical system PL may be set approximately equal to 2 mm.

According to the projection exposure apparatus of this Embodiment 1, it is possible to prevent dissolution of the optical element because the anti-dissolution film is formed on the surface of the optical element. Therefore, the optical element is prevented from dissolving in the liquid filling the space between the tip portion of the projection optical system and the substrate. As a result, it is not necessary to replace the optical element frequently and it is possible to maintain high throughput of the exposure apparatus. Moreover, it is not necessary to stop operation of the exposure apparatus in order to replace the corroded optical element, and it is thereby possible to manufacture end products efficiently. In addition, the optical element does not dissolve in the liquid and it is thereby possible to maintain an optical performance of the projection optical system. Hence it is possible to stabilize the quality of the manufactured end products and to continue exposure in the optimal condition.

Moreover, according to the projection exposure apparatus of this Embodiment 1, the metal anti-dissolution film that also functions as the adhesion reinforcing film is formed on the tapered surface 4B of the transmissive optical element 4 on the wafer W side of the projection optical system PL. Therefore, it is possible to attach the metal anti-dissolution film closely to the transmissive optical element 4. Meanwhile, since the silicon dioxide ($SiO_2$) film is formed on the surface of the metal anti-dissolution film, it is possible to prevent damage on the soft metal anti-dissolution film having low abrasion resistance and thereby to protect the metal anti-dissolution film. Therefore, it is possible to prevent infiltration to and corrosion of the transmissive optical element 4 by the liquid 7 interposed between the surface of the wafer W and the projection optical system PL, and thereby to maintain the optical performance of the projection optical system PL. Moreover, it is possible to maintain the performance of the exposure apparatus because the transmissive optical element 4 does not dissolve in the liquid 7. In addition, it is not necessary to replace the transmissive optical element 4 frequently. Therefore, it is possible to maintain high throughput of the projection exposure apparatus.

Furthermore, the metal anti-dissolution film is formed on the tapered surface 4B of the transmissive optical element 4, or in other words, at a portion where the exposure light beam IL does not pass through. Therefore, it is possible to continue exposure in the optimal condition without shielding the exposure light beam IL by the metal anti-dissolution film formed on the surface of the transmissive optical element 4.

Meanwhile, a refractive index n of pure water relative to the exposure light beam having the wavelength around 200 nm is approximately equal to 1.44, whereby the ArF excimer laser beam having the wavelength of 193 nm becomes 1/n times shorter on the wafer W, or in other words, is reduced to 134 nm. In this way, it is possible to obtain high resolution. In addition, a depth of focus is magnified by about n times, i.e. about 1.44 times as compared to the depth of focus in the air. Accordingly, when it is only necessary to secure the same degree of the depth of focus as the case of using the exposure light beam in the air, it is possible to increase the numerical aperture of the projection optical system PL and thereby to improve the resolution as well.

Moreover, the projection exposure apparatus of this Embodiment 1 includes the two pairs of exhaust nozzles and intake nozzles which are mutually inverted in the X direction and in the Y direction. Accordingly, it is possible to fill the space between the wafer and the optical element stably with the liquid when moving the wafer in the +X direction, the −X direction, the +Y direction or the −Y direction.

Meanwhile, since the liquid flows on the wafer, it is possible to rinse off a foreign object that may be attached onto the wafer by using the liquid. Moreover, since the liquid is adjusted to a given temperature by a liquid supply device, the temperature of the surface of the wafer is set to a constant temperature. Accordingly, it is possible to prevent degradation of alignment accuracy attributable to thermal expansion of the wafer caused in the course of exposure. Therefore, it is possible to prevent degradation of alignment accuracy attributable to thermal expansion of the wafer even when there is a time difference between alignment and exposure as in the case of alignment in accordance with the enhanced global alignment (EGA) method, for example.

Further, according to the projection exposure apparatus of this Embodiment 1, the liquid flows in the same direction as the direction of movement of the wafer. Therefore, it is possible to recover the liquid that absorbs foreign objects and the heat by use of the liquid recovery device without accumulating the liquid on the exposure region immediately below the surface of the transmissive optical element.

In the above-described embodiment, the anti-dissolution film applies magnesium fluoride ($MgF_2$) and silicon dioxide ($SiO_2$). Instead, the anti-dissolution film may apply at least one of lanthanum fluoride ($LaF_3$), strontium fluoride ($SrF_2$), yttrium fluoride ($YF_3$), ruthenium fluoride ($RuF_3$), hafnium fluoride ($HfF_4$), neodymium fluoride ($NdF_3$), gadolinium fluoride ($GdF_3$), ytterbium fluoride ($YbF_3$), dysprosium fluoride ($DyF_3$), aluminum fluoride ($AlF_3$), cryolite ($Na_3AlF_6$), chiolite ($5NaF.3AlF_3$), aluminum oxide ($Al_2O_3$), silicon dioxide ($SiO_2$), titanium oxide ($TiO_2$), magnesium oxide (MgO), hafnium oxide ($HfO_2$), chromium oxide ($Cr_2O_3$), zirconium oxide ($ZrO_2$), tantalum pentoxide ($Ta_2O_5$), and niobium pentoxide ($Nb_2O_5$).

Moreover, in the above-described embodiment, the anti-dissolution film made of magnesium fluoride ($MgF_2$) and silicon dioxide ($SiO_2$) is formed on the optical element by use of the vacuum vapor deposition method. Instead, the anti-dissolution film may be formed by use of at least one of film forming methods out of an ion beam assisted vapor deposition method, a gas cluster ion beam assisted vapor deposition method, an ion plating method, an ion beam sputtering method, a magnetron sputtering method, a bias sputtering method, an electron cyclotron resonance (ECR) sputtering method, a radio frequency (RF) sputtering method, a thermal chemical vapor deposition (thermal CVD) method, a plasma enhanced CVD method, and a photo CVD method.

When forming a fluoride as the anti-dissolution film for the optical element, the optimal optical film forming method may be the vacuum vapor deposition method, the ion beam assisted vapor deposition method, the gas cluster ion beam assisted vapor deposition method or the ion plating method. However, in terms of magnesium fluoride ($MgF_2$) and yttrium fluoride ($YF_3$), it is possible to form such a film by use of the sputtering method. In the meantime, when forming an oxide film as the anti-dissolution film for the optical element, it is possible to apply all the film forming methods cited above.

Moreover, when calcium fluoride having a crystal orientation of (111) plane is used as a base material of the optical element, the anti-dissolution film to be formed thereon, or lanthanum fluoride ($LaF_3$) in particular, achieves heteroepitaxial growth when deposited on a film forming surface thereof. In this case, the anti-dissolution film thus formed becomes extremely dense and constitutes a crystalline structure with very few defects.

Furthermore, in the projection exposure apparatus according to Embodiment 1, the metal film constructed as the film made of tantalum (Ta) is used as the metal anti-dissolution film (the anti-dissolution film). Instead, it is possible to use a metal film constructed as a film made of at least one of gold (Au), platinum (Pt), silver (Ag), nickel (Ni), tungsten (W), palladium (Pd), molybdenum (Mo), titanium (Ti), and chromium (Cr).

Meanwhile, the projection exposure apparatus according to Embodiment 1 applies the adhesion reinforcing film constructed as the film made of tantalum (Ta). Instead, it is possible to apply the adhesion reinforcing film constructed as a film made of chromium (Cr).

Moreover, the projection exposure apparatus of this Embodiment 1 applies the protective film for the metal anti-dissolution film (a protective film for anti-dissolution film) constructed as the film made of silicon dioxide ($SiO_2$). Instead, it is possible to apply the protective film for the metal anti-dissolution film constructed as a film made of at least one of yttrium oxide ($Y_2O_3$), neodymium fluoride ($Nd_2F_3$), chromium oxide ($Cr_2O_3$), tantalum pentoxide ($Ta_2O_5$), niobium pentoxide ($Nb_2O_5$), titanium dioxide ($TiO_2$), zirconium dioxide ($ZrO_2$), hafnium dioxide ($HfO_2$), and lanthanum oxide ($La_2O_3$). In other words, it is possible to select the protective film for the metal anti-dissolution film. Therefore, it is possible to select the most appropriate protective film for the metal anti-dissolution film (the protective film for the anti-dissolution film) based on the material of the transmissive optical element, the environment where the transmissive optical element is placed, the type of the liquid interposed between the surface of the material and the projection optical system, and the like.

Meanwhile, in the projection exposure apparatus of this Embodiment 1, the silicon dioxide ($SiO_2$) film serving as the anti-dissolution film as well as the protective film for the metal anti-dissolution film is formed by use of the wet film forming method. Instead, it is possible to form the film by use of a dry film forming method such as the sputtering method.

Moreover, the metal anti-dissolution film (which also functions as the adhesion reinforcing film) and the protective film for the metal anti-dissolution film are formed on the tapered surface of the transmissive optical element of this Embodiment 1. However, it is also possible to form only the metal anti-dissolution film (the anti-dissolution film). Alternatively, it is also possible to separate the adhesion reinforcing film from the metal anti-dissolution film. In other words, it is possible to form the adhesion reinforcing film and the metal anti-dissolution film separately, or to form the adhesion reinforcing film, the metal anti-dissolution film, and the protective film for the metal anti-dissolution film separately.

Furthermore, in the projection exposure apparatus of this Embodiment 1, the transmissive optical element 4 located closest to the wafer W is made of calcium fluoride, and the adhesion reinforcing film, the metal anti-dissolution film (the anti-dissolution film), and the protective film for the metal anti-dissolution film (the protective film for the anti-dissolution film) are formed on the tapered surface thereof. Instead, it is also possible to form the transmissive optical element 4 located closest to the wafer W by use of fused silica, and then to form the aforementioned films on the tapered surface thereof.

Meanwhile, in the above-described embodiment, the space between the surface of the wafer and the optical element made of calcium fluoride and formed on the wafer's side of the projection optical system is filled with the liquid. Instead, it is possible to interpose the liquid partially between the surface of the wafer and the optical element made of calcium fluoride and formed on the wafer's side of the projection optical system.

Moreover, although pure water is used as the liquid 7 in the above-described embodiment, the liquid is not limited only to the pure water. It is also possible to use another material (such as cedar oil) for the liquid 7, which allows transmission of the exposure light beam and has a high refractive index as much as possible, and remains stable against the photoresist with which the projection optical system and the surface of the wafer are coated.

Embodiment 2

A projection exposure apparatus is configured as similar to that of Embodiment 1 except that a magnesium fluoride ($MgF_2$) film is formed at the tip portion 4A of the optical element 4, or in other words, at the portion contacting the liquid 7, as the single-layered anti-dissolution film by use of the vacuum vapor deposition method.

According to the projection exposure apparatus of this Embodiment 2, the single-layered anti-dissolution film is formed on the surface of the optical element, and it is thereby possible to prevent dissolution of the optical element. Further, it is possible to reduce the interface as compared to the multilayer film. Therefore, it is possible to minimize an adverse effect attributable to a chemical reaction which is apt to occur when the liquid infiltrates into the interface of the protective layer serving as the anti-dissolution film. Moreover, it is easier to form the film as compared to formation of the anti-dissolution film including the multilayer film.

In addition, by forming the single-layered anti-dissolution film such that the refractive index of the optical element becomes equal to or lower than the refractive index of the liquid in the case of soaking the surface of the optical element into the liquid, it is possible to obtain the same optical performance as that of the optical element including the multilayer film.

Embodiment 3

Figure 6:
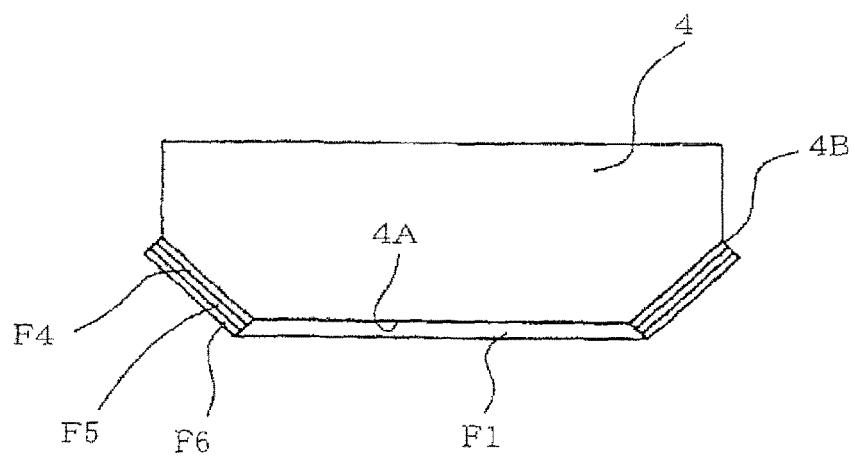
FIG. 6 is a view showing a configuration of an optical element of Embodiment 3.

A projection exposure apparatus is configured as similar to Embodiment 1 except that the transmissive optical element 4 is modified as shown in FIG. 6 and as described below.

(i) The magnesium fluoride ($MgF_2$) film F1 is formed at the tip portion 4A of the optical element 4 on the wafer W side, or in other words, at the portion where the exposure light beam passes through, constituted of the single-layered anti-dissolution film by use of the vacuum vapor deposition method.

(ii) The tantalum (Ta) film serving as the adhesion reinforcing film F4 is formed on the tapered surface 4B of the transmissive optical element 4, or in other words, at the portion where the exposure light beam does not pass through by use of the sputtering method. The adhesion reinforcing film F4 is used for improving adhesion between the tapered surface 4B of the transmissive optical element 4 and the metal anti-dissolution film (the anti-dissolution film) F5 to be described later.

(iii) A metal film made of gold (Au) is formed in the thickness of 150 nm on the surface of the adhesion reinforcing film F4 as the metal anti-dissolution film (the anti-dissolution film) F5 for preventing dissolution in the liquid 7 by use of the sputtering method.

(iv) A silicon dioxide ($SiO_2$) film is formed on the surface of the metal anti-dissolution film (the anti-dissolution film) F5 as the protective film F6 for the metal anti-dissolution film (the protective film for the anti-dissolution film) for protecting the metal anti-dissolution film (the anti-dissolution film) by use of the sputtering method. Here, the metal anti-dissolution film (the anti-dissolution film) F5 to be formed on the tapered surface 4B of the transmissive optical element 4 has solubility in pure water equal to or below 2 ppt and packing density equal to or above 95%.

According to the projection exposure apparatus of this Embodiment 3, the metal film is formed on the surface of the adhesion reinforcing film that is formed on the tapered surface 4B of the transmissive optical element 4 on the wafer W side of the projection optical system PL. Therefore, it is possible to attach the metal film closely to the transmissive optical element 4. Moreover, since the silicon dioxide ($SiO_2$) film is formed on the surface of the metal film, it is possible to prevent damage on the soft metal film having low abrasion resistance and thereby to protect the metal film. Therefore, it is possible to prevent infiltration to and corrosion of the transmissive optical element 4 by the liquid 7 interposed between the surface of the wafer W and the projection optical system PL, and thereby to maintain the optical performance of the projection optical system PL. Moreover, it is possible to maintain the performance of the projection exposure apparatus because the transmissive optical element 4 does not dissolve in the liquid 7. In addition, it is not necessary to replace the transmissive optical element 4 frequently. Therefore, it is possible to maintain high throughput of the projection exposure apparatus.

Embodiment 4

A projection exposure apparatus is configured as similar to Embodiment 1 except that magnesium fluoride ($MgF_2$) films are formed at the tip portion 4A and the side surface portion (the tapered portion) 4B of the optical element 4, or in other words, at the portions contacting the liquid 7 as the anti-dissolution films.

According to the projection exposure apparatus of this Embodiment 4, the anti-dissolution films are formed on the surface on the substrate's side of the optical element and on the side surface of the optical element, and it is thereby possible to prevent dissolution of the optical element. Further, the anti-dissolution films are formed on the surface on the substrate's side of the optical element and on the side surface of the optical element by use of an identical material. Accordingly, it is possible to form the anti-dissolution films at the same time, and thereby to form the anti-dissolution films by a simple process.

Embodiment 5

A projection exposure apparatus is configured as similar to Embodiment 1 except that the transmissive optical element 4 is modified as described below.

(i) A silicon dioxide ($SiO_2$) film is formed at the tip portion 4A on the wafer W side of the transmissive optical element 4, or in other words, at the portion where the exposure light beam passes through, as a first film by use of the sputtering method which is a dry film forming method.

(ii) Another silicon dioxide ($SiO_2$) film is formed on a surface of the first film as a second film by spin coating which is a wet film forming method.

(iii) The tapered surface 4B of the transmissive optical element 4, or in other words, the portion where the exposure light beam does not pass through is polished with a #2000 grind stone, for example, to increase surface roughness and the surface area thereof. On the tapered surface 4B subjected to the surface treatment of polishing with the grind stone, a silicon dioxide ($SiO_2$) film is formed as an anti-dissolution oxide film by spin coating which is the wet film forming method.

According to the projection exposure apparatus of this Embodiment 5, the silicon dioxide ($SiO_2$) film is formed at the tip portion on the wafer W side of the transmissive optical element, which is the portion of the projection optical system that is located closest to the wafer, as the first film by use of the sputtering method. Meanwhile, the silicon dioxide ($SiO_2$) film is formed on the surface of the first film as the second film by spin coating. Therefore, it is possible to attach the first film closely to the transmissive optical element made of calcium fluoride, and thereby possible to utilize the first film as the adhesion reinforcing layer to attach the transmissive optical element closely to the second film.

Moreover, the second film is formed by use of the wet film forming method characterized by high homogeneity and a high filling performance relative to voids. Therefore, it is possible to prevent infiltration to and corrosion of the transmissive optical element by the liquid interposed between the surface of the wafer and the projection optical system by eliminating the voids as a consequence of penetration of the second film into the voids on the first film. In this way, it is possible to maintain the optical performance of the projection optical system. Moreover, since both of the first film and the second film are the silicon dioxide ($SiO_2$) films, bonding power between the first film formed by the sputtering method and the second film formed by spin coating is strengthened, and it is thereby possible to attach the both films more firmly. As a result, it is possible to avoid separation of the first film and the second film from the transmissive optical element and to avoid dissolution of the transmissive optical element in the liquid. In this way, it is possible to maintain the performance of the exposure apparatus. In addition, it is not necessary to replace the transmissive optical element frequently. Therefore, it is possible to maintain high throughput of the exposure apparatus.

Moreover, the tapered surface of the transmissive optical element, which is located closest to the wafer, of the projection optical system is polished with a #2000 grind stone, for example, to increase the surface roughness and surface area thereof. On the tapered surface thus polished, a silicon dioxide ($SiO_2$) film is formed as an anti-dissolution oxide film by spin coating. Since the anti-dissolution oxide film is formed by use of the wet film forming method characterized by high homogeneity and a high filling performance relative to voids, it is possible to prevent infiltration to and corrosion of the transmissive optical element by the liquid, and thereby to maintain the optical performance of the projection optical system. As a result, it is possible to avoid dissolution of the transmissive optical element in the liquid. In this way, it is possible to maintain the performance of the exposure apparatus. In addition, it is not necessary to replace the transmissive optical element frequently. Therefore, it is possible to maintain high throughput of the exposure apparatus.

Here, in the projection exposure apparatus of this Embodiment 5, the silicon dioxide ($SiO_2$) film is formed at the tip portion 4A on the wafer W side of the transmissive optical element 4, or in other words, at the portion where the exposure light beam passes through, as the first film by use of the dry film forming method. Moreover, the silicon dioxide ($SiO_2$) film is formed on the surface of the first film as the second film by use of the wet film forming method. Instead, it is possible to form the silicon dioxide ($SiO_2$) film as the anti-dissolution oxide film at the tip portion 4A on the wafer's side of the transmissive optical element 4 by use of only the wet film forming method. In this case, the tip portion 4A of the transmissive optical element 4 is subjected to the surface treatment to the extent not to degrade the optical performance of the projection optical system PL in order to enhance adhesion between the transmissive optical element 4 and the anti-dissolution oxide film. Specifically, the surface of the tip portion 4A is polished with a #2000 grind stone, for example, so as to increase the surface roughness and the surface area of the tip portion 4A.

Moreover, in the projection exposure apparatus of this Embodiment 5, the silicon dioxide ($SiO_2$) film is formed on the tapered surface 4B of the transmissive optical element 4, or in other words, the portion where the exposure light beam does not pass through, as the anti-dissolution oxide film, by use of only the wet film forming method. However it is possible to form the silicon dioxide (SiO$_2$) film as the first film on the tapered surface 4B by use of the dry film forming method and then to form the silicon dioxide (SiO$_2$) film as the second film on the surface of the first film by use of the wet film forming method.

Embodiment 6

A projection exposure apparatus is configured as similar to Embodiment 1 except applying the transmissive optical element 4 described below.

Figure 7:
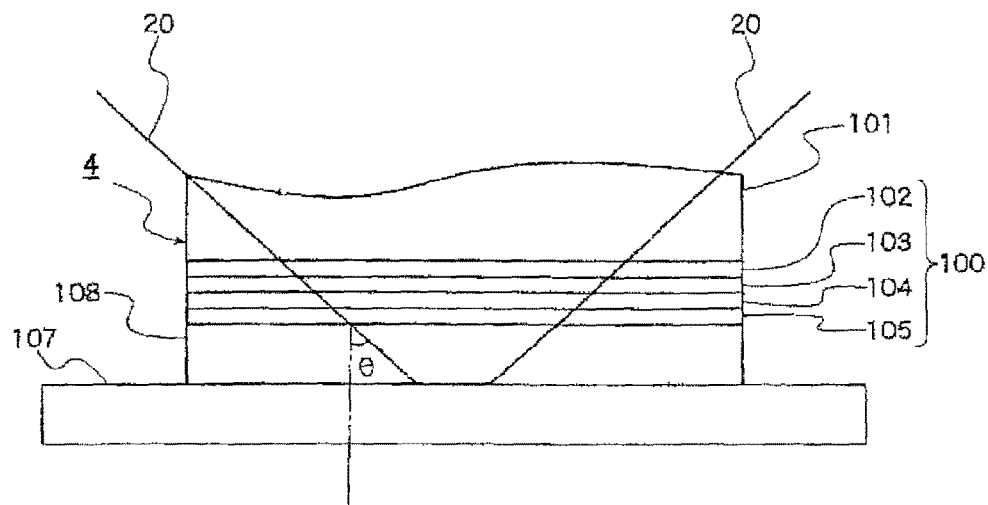
FIG. 7 is a view showing a configuration of an optical element of Embodiment 6.

Specifically, FIG. 7 is a view showing a configuration of an optical element used in Embodiment 6 of the present invention. Here, an optical element 1 includes an optical substrate 101 and a multilayer film 100. The optical substrate 101 is made of calcium fluoride. Meanwhile, the multilayer film 100 has a four-layered structure including lanthanum fluoride (hereinafter expressed as LaF$_3$) as a first layer 102, magnesium fluoride (hereinafter expressed as MgF$_2$) as a second layer 103, aluminum oxide (hereinafter expressed as Al$_2$O$_3$) as a third layer 104, and a silicon oxide (hereinafter expressed as SiO$_2$) as a fourth layer 105 laminated in this order from the optical substrate 101 side. An immersion liquid 108 is water and a substrate 107 is silicon coated with a photoresist.

Solubility of the fourth layer (SiO$_2$) 105 or the third layer (Al$_2$O$_3$) 104 in water indicates the lower limit of a measuring instrument equal to $1.0 \times 10^{-7}$ grams per hundred grams of water. Therefore, the fourth layer (SiO$_2$) 105 and the third layer (Al$_2$O$_3$) 104 are substances that are insoluble in water. Accordingly, the films made of these substances have a protective function against water.

Here, the vacuum vapor deposition method is used as the film forming method. It is to be noted, however, that the film forming method is not limited only to this method. It is possible to apply various sputtering methods, ion beam assisted methods, and ion plating methods that can produce dense structures.

Refractive indices and optical film thicknesses based on a designed dominant wavelength λ of the first layer (LaF$_3$) 102, the second layer (MgF$_2$) 103, the third layer (Al$_2$O$_3$) 104, and the fourth layer (SiO$_2$) 105 are shown in Table 1.

TABLE 1

| | Substance | Refractive index | Optical film thickness |
|---|---|---|---|
| Immersion liquid | water | 1.44 | — |
| Fourth layer | SiO$_2$ | 1.55 | 0.12λ |
| Third layer | Al$_2$O$_3$ | 1.85 | 0.54λ |
| Second layer | MgF$_2$ | 1.43 | 0.66λ |
| First layer | LaF$_3$ | 1.69 | 0.60λ |
| Optical substrate | calcium fluoride | 1.50 | — |

As shown in Table 1, it is apparent that the refractive indices of the first layer 102 and the third layer 104 being odd-numbered layers are higher than the refractive indices of the calcium fluoride substrate 101, the second layer 103, and the fourth layer 105 which are adjacent thereto. By forming the multilayer film 100 in the order shown in Table 1 on the optical substrate 101, the multilayer film 100 has an anti-reflection function as a whole.

Figure 8:
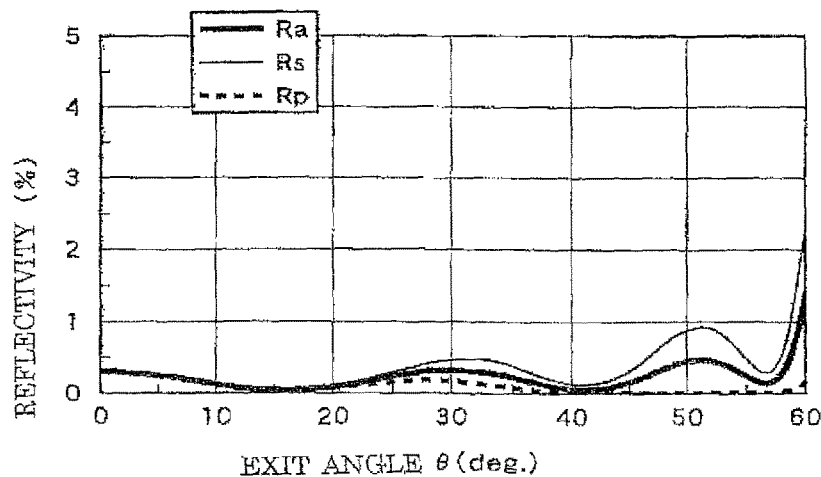
FIG. 8 is a graph showing a relation between reflectivity and an exit angle in terms of the optical element of Embodiment 6 applied to an ArF excimer laser.

FIG. 8 is a graph showing a relation between reflectivity and an exit angle in terms of the optical element used in Embodiment 6 of the present invention in terms of the wavelength of 193 nm. An ArF (having the wavelength of 193 nm) excimer laser is applied hereto. As it is apparent from FIG. 8, mean reflectance Ra between S polarization Rs and P polarization Rp relative to incident light 20 is approximately equal to or below 0.3% even when the exit angle θ is equal to 40 degrees or approximately equal to or below 0.5% even when the exit angle θ is equal to 50 degrees. Therefore, the optical element exhibits excellent characteristic and is usable enough.

Embodiment 7

A projection exposure apparatus is configured as similar to Embodiment 1 except applying the transmissive optical element 4 described below.

Figure 9:
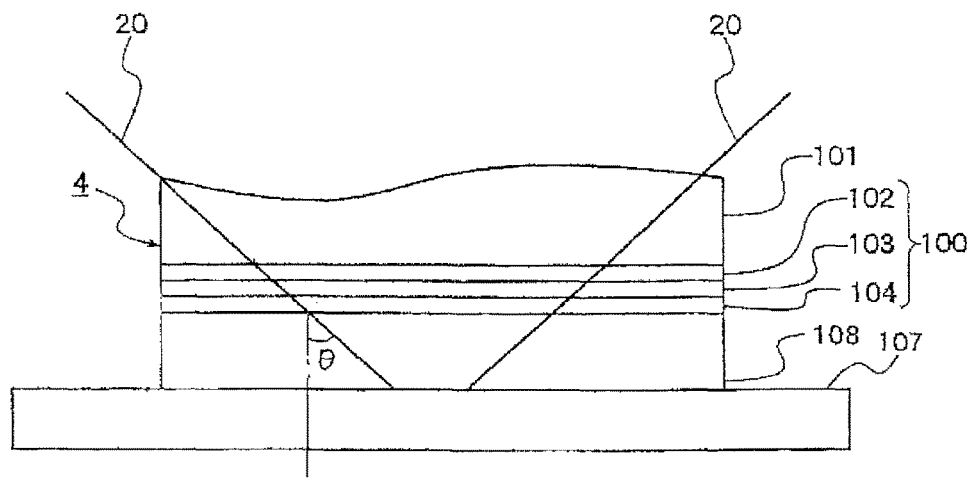
FIG. 9 is a view showing a configuration of an optical element of Embodiment 7.

FIG. 9 is a view showing a configuration of the optical element 1 of the present invention. Here, the optical element 1 includes the optical substrate 101 and the multilayer film 100. The multilayer film 100 has a three-layered structure including lanthanum fluoride (hereinafter expressed as LaF$_3$) as the first layer 102, magnesium fluoride (hereinafter expressed as MgF$_2$) as the second layer 103, and aluminum oxide (hereinafter expressed as Al$_2$O$_3$) as the third layer 104 laminated in this order on the optical substrate 101. The immersion liquid 108 is water and the substrate 107 is silicon coated with the photoresist.

Refractive indices and optical film thicknesses based on the designed dominant wavelength λ of the first layer (LaF$_3$) 102, the second layer (MgF$_2$) 103, and the third layer (Al$_2$O$_3$) 104 are shown in Table 2.

TABLE 2

| | Substance | Refractive index | Optical film thickness |
|---|---|---|---|
| Immersion liquid | water | 1.44 | — |
| Third layer | Al$_2$O$_3$ | 1.85 | 0.54λ |
| Second layer | MgF$_2$ | 1.43 | 0.66λ |
| First layer | LaF$_3$ | 1.69 | 0.60λ |
| Optical substrate | calcium fluoride | 1.50 | — |

As shown in Table 2, it is apparent that the refractive index of LaF$_3$ of the first layer 102 is higher than the refractive indices of the optical substrate 101 and MgF$_2$ of the second layer 103 which are adjacent thereto. By arranging the refractive indices as described above, the multilayer film 100 has the anti-reflection function as a whole.

Figure 10:
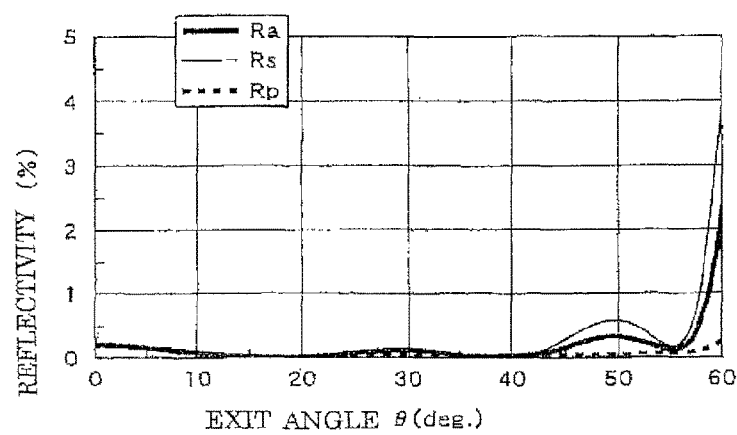
FIG. 10 is a graph showing a relation between reflectivity and an exit angle in terms of the optical element of Embodiment 7 applied to the ArF excimer laser.

FIG. 10 is a graph showing a relation between reflectivity and an exit angle in terms of the optical element used in Embodiment 7 of the present invention in terms of the wavelength of 193 nm. The ArF (having the wavelength of 193 nm) excimer laser is applied hereto. As it is apparent from FIG. 10, the mean reflectance Ra between the S polarization Rs and the P polarization Rp relative to the incident light 20 is approximately equal to or below 0.3% even when the exit angle θ is equal to 40 degrees or approximately equal to or below 0.8% even when the exit angle θ is equal to 50 degrees. Therefore, the optical element exhibits excellent characteristic and is usable enough.

Embodiment 8

A projection exposure apparatus is configured as similar to Embodiment 1 except applying the transmissive optical element 4 described below.

Figure 11:
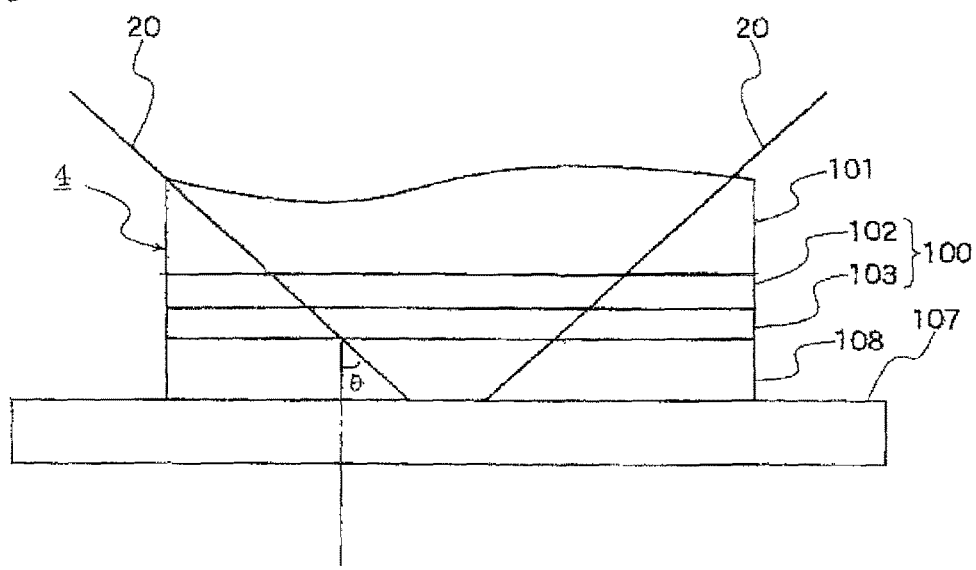
FIG. 11 is a view showing a configuration of an optical element of Embodiment 8.

FIG. 11 is a view showing a configuration of the optical element 1 of the present invention. Here, the optical element 1 includes the optical substrate 101 and the multilayer film 100. The multilayer film 100 has a two-layered structure including lanthanum fluoride (hereinafter expressed as $LaF_3$) as the first layer 102 and magnesium fluoride (hereinafter expressed as $MgF_2$) as the second layer 103, which are sequentially laminated on the optical substrate 101. The immersion liquid 108 is water and the substrate 107 is silicon coated with the photoresist.

Refractive indices and optical film thicknesses based on the designed dominant wavelength λ of the first layer ($LaF_3$) 102 and the second layer ($MgF_2$) 103 are shown in Table 3.

TABLE 3

|  | Substance | Refractive index | Optical film thickness |
|---|---|---|---|
| Immersion liquid | water | 1.44 | — |
| Second layer | $MgF_2$ | 1.43 | 0.60λ |
| First layer | $LaF_3$ | 1.69 | 0.55λ |
| Optical substrate | calcium fluoride | 1.50 | — |

As shown in Table 3, it is apparent that the refractive index of the first layer 102 is higher than the refractive indices of the optical substrate 101 and $MgF_2$ of the second layer 103 which are adjacent thereto. By arranging the refractive indices as shown in Table 3, the multilayer film 100 has the anti-reflection function as a whole.

Figure 12:
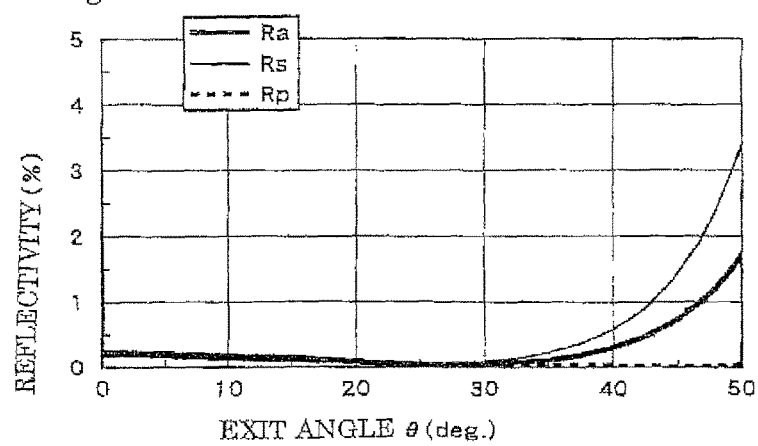
FIG. 12 is a graph showing a relation between reflectivity and an exit angle in terms of the optical element of Embodiment 8 applied to the ArF excimer laser.

FIG. 12 is a graph showing a relation between reflectivity and an exit angle in terms of the optical element used in Embodiment 8 of the present invention in terms of the wavelength of 193 nm. The ArF (having the wavelength of 193 nm) excimer laser is applied hereto. As it is apparent from FIG. 12, the mean reflectance Ra between the S polarization Rs and the P polarization Rp relative to the incident light 20 is approximately equal to or below 0.3% when the exit angle θ is equal to 40 degrees or approximately equal to or below 2% even when the exit angle θ is equal to 50 degrees. Therefore, the optical element is usable enough.

Since the second layer ($MgF_2$) 103 has some solubility in water ($2\times10^{-4}$ grams per hundred grams of water according to literature data) and therefore dissolves in water when used over a long period of time. However, Embodiment 8 of the present invention applies water (the refractive index=1.44) and therefore has an advantage of relatively small variation in the optical performance even when the second layer ($MgF_2$) 103 is eluted.

Figure 13:
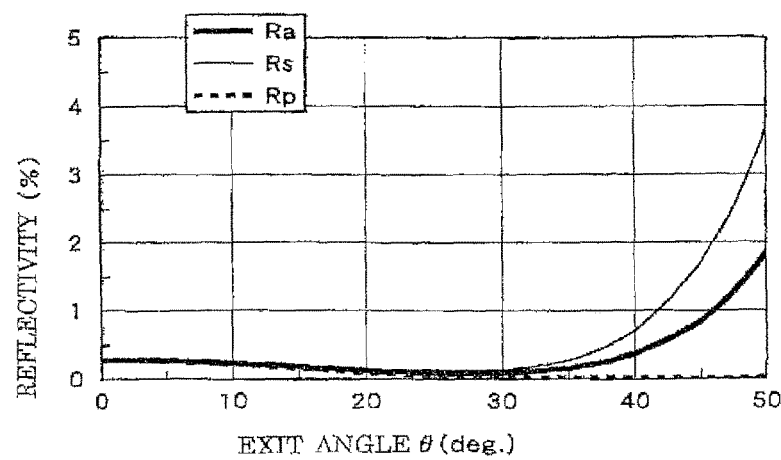
FIG. 13 is a graph showing a relation between reflectivity and an exit angle θ in terms of the optical element of Embodiment 8 applied to the ArF excimer laser when a film thickness of a second layer is reduced by half.

FIG. 13 is a graph showing a relation between reflectivity and an exit angle θ of the optical element relative to the ArF (having the wavelength of 193 nm) excimer laser 10 when the film thickness of the second layer ($MgF_2$) 103 is reduced by half (0.3λ). As it is apparent from FIG. 13, the mean reflectance Ra between the S polarization Rs and the P polarization Rp relative to the incident light 20 changes very little. Therefore, the optical element is usable enough. Accordingly, it is possible to use the optical element approximately for 10 years by forming the $MgF_2$ film 103 in the thickness of about 40 nm.

Although FIG. 11 is described by using the two-layered multilayer film 100 including the first layer ($LaF_3$) 102 and the second layer ($MgF_2$) 103, it is also possible to use a four-layer structured multilayer film formed by alternately laminating the first layer ($LaF_3$) 102 and the second layer ($MgF_2$) 103.

Embodiment 9

A projection exposure apparatus is configured as similar to Embodiment 1 except applying the transmissive optical element 4 described below.

Figure 14:
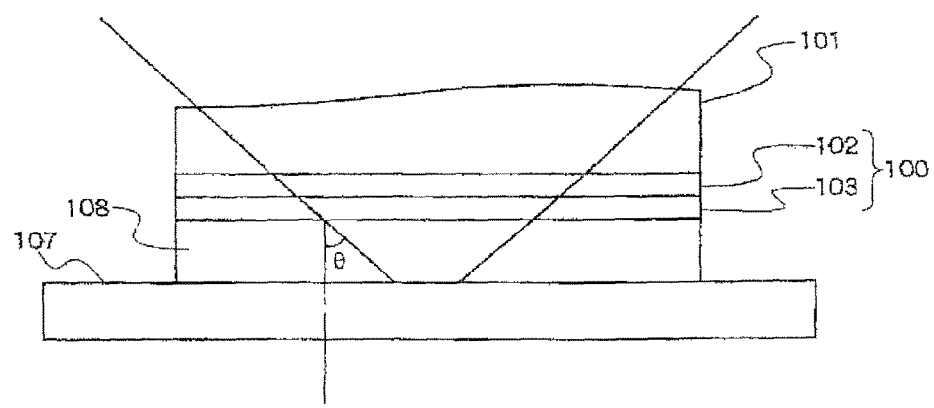
FIG. 14 is a view showing a configuration of an optical element of Embodiment 9.

FIG. 14 is a view showing a configuration of the optical element 1 of the present invention. This optical element 1 is formed by laminating the multilayer film 100 on the calcium fluoride substrate 101. This multilayer film 100 has a two-layered structure including $MgF_2$ as the first layer 102 and $SiO_2$ as the second layer 103, which are sequentially laminated on the optical substrate 101. The immersion liquid 108 is water and the substrate 107 is silicon coated with the photoresist.

Here, refractive indices of the first layer ($MgF_2$) 102 and the second layer ($SiO_2$) 103, and optical film thicknesses as well as film thickness ranges of the respective layers 102 and 103 based on the designed dominant wavelength λ are shown below.

TABLE 4

|  | Substance | Refractive index | Optical film thickness | Film thickness range |
|---|---|---|---|---|
| Immersion liquid | water | 1.44 |  |  |
| Second layer | $SiO_2$ | 1.55 | 2.50λ | 1.50~4.00λ |
| First layer | $MgF_2$ | 1.43 | 0.10λ | 0.03~0.10λ |
| Optical substrate | calcium fluoride | 1.50 |  |  |

Here, the vacuum vapor deposition method is used as the film forming method. It is to be noted, however, that the film forming method is not limited only to this method. It is possible to apply various sputtering methods, ion beam assisted methods, and ion plating methods that can produce dense structures.

Figure 15:
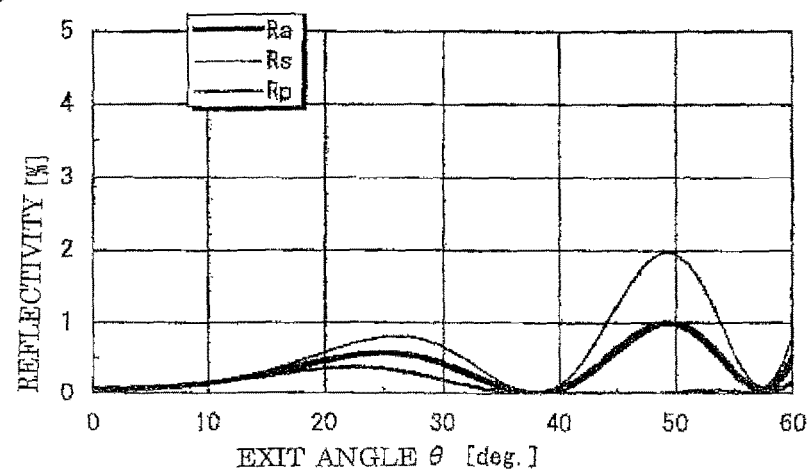
FIG. 15 is a graph showing a relation between reflectivity and an exit angle in terms of the optical element of Embodiment 9 applied to the ArF excimer laser.

FIG. 15 is a graph showing a relation between reflectivity and an exit angle in terms of the optical element 1 of this Embodiment 9 relative to the ArF (having the wavelength of 193 nm) excimer laser. As it is apparent from FIG. 15, the mean reflectance between the S polarization and the P polarization relative to the incident light 20 is approximately equal to or below 0.6% even when the exit angle θ is equal to 40 degrees or approximately equal to or below 1% even when the exit angle θ is equal to 60 degrees. Therefore, the optical element exhibits excellent characteristic and is usable enough.

As shown in Table 4, it is apparent that the refractive index of the first layer ($MgF_2$) 102 is lower than the refractive indices of the optical substrate 101 and the second layer ($SiO_2$) 103 which are adjacent thereto. By arranging the refractive indices as described above, the multilayer film 100 has the anti-reflection function as a whole.

Embodiment 10

A projection exposure apparatus is configured as similar to Embodiment 1 except applying the transmissive optical element 4 described below.

Figure 16:
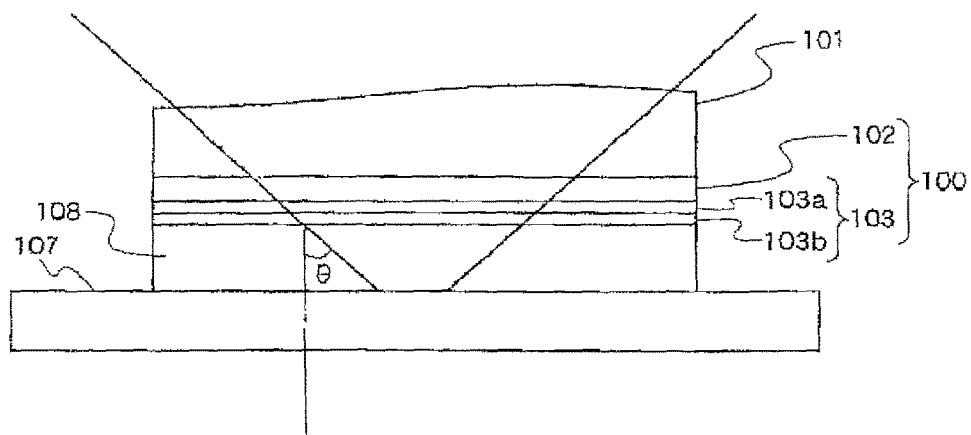
FIG. 16 is a view showing a configuration of an optical element of Embodiment 10.

FIG. 16 is a view showing a configuration of the optical element 1 of the present invention. This optical element 1 is formed by laminating the multilayer film 100 on the calcium fluoride substrate 101. This multilayer film 100 includes $MgF_2$ as the first layer 102 and $SiO_2$ as the second layer 103. Moreover, this second layer 103 includes two separate layers. Specifically, a separate first layer 103a formed by use of the dry film forming method and a separate second layer 103b formed by use of the wet film forming method are sequentially laminated. The immersion liquid 108 is water and the substrate 107 is silicon coated with the photoresist.

Here, refractive indices of the first layer ($MgF_2$) 102, $SiO_2$ film formed by the dry method of the separate first layer 103a, and $SiO_2$ film formed by the wet method of the separate second layer 103b, and optical film thicknesses as well as film thickness ranges of the respective layers 102 and so forth based on the designed dominant wavelength $\lambda$ are shown below.

TABLE 5

| | Substance | Refractive index | Optical film thickness | Film thickness range |
|---|---|---|---|---|
| Immersion liquid | water | 1.44 | | |
| Second layer (separate second layer) | $SiO_2$ film formed by wet method | 1.55 | 0.40$\lambda$ | 0.40$\lambda$ (constant) |
| Second layer (separate first layer) | $SiO_2$ film formed by dry method | 1.55 | 2.10$\lambda$ | 1.15~3.60$\lambda$ |
| First layer | $MgF_2$ | 1.43 | 0.10$\lambda$ | 0.03~0.10$\lambda$ |
| Optical substrate | calcium fluoride | 1.50 | | |

Here, the first layer 102 and the separate first layer 103a are formed by use of the vacuum vapor deposition method. It is to be noted, however, that the film forming method is not limited only to this method. It is possible to apply other dry film forming methods including various sputtering methods, ion beam assisted methods, and ion plating methods.

It is known that a structure of a thin film varies in this dry film forming method depending on conditions including a substrate heating temperature, a film deposition rate, and the like. In the case of a structure having insufficient density, there is an increasing risk of penetration of water into the film which may reach the calcium fluoride substrate 101. Since calcium fluoride dissolves in water, there is an increasing risk of a loss of the desired optical performance attributable to immersion in water. In general, it is known that a $SiO_2$ film formed by the vacuum vapor deposition method at a low substrate heating temperature allows penetration of water or water vapor.

In this case, by providing the $SiO_2$ layer formed by the wet film forming method as the separate second layer 103b, the $SiO_2$ layer formed by the wet film forming method enters into voids on the $SiO_2$ layer formed by the dry film forming method, and the voids are thereby eliminated. In this way, it is possible to prevent infiltration to and corrosion of the optical element 1 by the given immersion liquid 108 interposed between the surface of the substrate 107 and the projection optical system PL, and thereby to maintain the optical performance of the projection optical system PL. As a result, when this optical element 1 is applied to the projection exposure apparatus of the liquid immersion type, it is possible to avoid detachment of the multilayer film 100 of the present invention from the calcium fluoride substrate 101 and to avoid dissolution of the optical element 1 in the liquid. In this way, it is possible to maintain the performance of the projection exposure apparatus. In addition, it is not necessary to replace the optical element 1 frequently. Therefore, it is possible to maintain high throughput of the projection exposure apparatus.

The $SiO_2$ layer formed by the wet film forming method, which serves as the separate second layer 103b, is formed by spin coating using a conventional $SiO_2$ solution. Here, a sol-gel silica solution is used as the $SiO_2$ solution and the calcium fluoride substrate 101 is coated with the solution while being rotated at a rotating speed in a range from 1000 to 2000 revolutions per minute. The film thickness to be achieved by the coating process depends on conditions including the concentration of the $SiO_2$ solution, the rotating speed of the calcium fluoride substrate 101 in the spin coating process, temperature, humidity, and the like. Accordingly, by preparing an analytical curve concerning the film thickness in advance based on the concentration as a parameter, it is possible to obtain a desired film thickness afterwards.

Here, the film thickness of the $SiO_2$ layer formed by the wet film forming method serving as the separate second layer 103b is set to 0.40$\lambda$ (50 nm). However, the film thickness is not limited only to this value. Nevertheless, it is necessary to pay attention to occurrence of cracks attributable to membrane stress when coating in a large film thickness such as 1.2$\lambda$ (150 nm) or above. Moreover, after coating the $SiO_2$ layer formed by the wet film forming method serving as the separate second layer 103b, an annealing process is performed in the air at 160° C. for 2 hours as a post treatment. This process is intended to evaporate alcohol which is a main solvent of the $SiO_2$ solution, and to sinter the $SiO_2$ layer itself formed by the wet film forming method.

Figure 17:
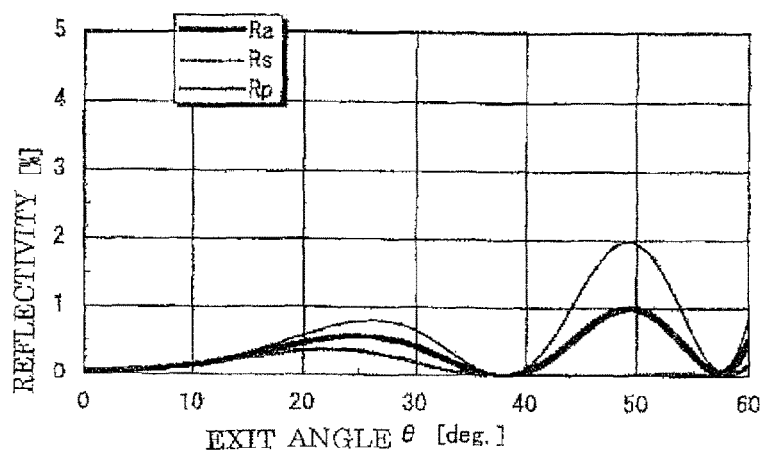
FIG. 17 is a graph showing a relation between reflectivity and an exit angle in terms of the optical element of Embodiment 10 applied to the ArF excimer laser.

FIG. 17 is a graph showing a relation between reflectivity and an exit angle in terms of the optical element 1 of this Embodiment 10 relative to the ArF (having the wavelength of 193 nm) excimer laser. As it is apparent from FIG. 17, the mean reflectance between the S polarization and the P polarization is approximately equal to or below 0.6% even when the exit angle $\theta$ is equal to 40 degrees or approximately equal to or below 1% even when the exit angle $\theta$ is equal to 60 degrees. Therefore, the optical element exhibits excellent characteristic and is usable enough.

Moreover, as shown in Table 5 described above, it is apparent that the refractive index of the first layer ($MgF_2$) 102 is lower than the refractive indices of the optical substrate 101 and the second layer ($SiO_2$) 103 which are adjacent thereto. By arranging the refractive indices as described above, the multilayer film 100 has the antireflection function as a whole. Incidentally, although the second layer ($SiO_2$) 103 is composed of the separate first layer 103a formed by use of the dry film forming method and the separate second layer 103b formed by use of the wet film forming method, these layers are made of the identical material and are therefore regarded as the single layer from the optical perspective.

Embodiment 11

A projection exposure apparatus is configured as similar to Embodiment 1 except applying the transmissive optical element 4 described below.

Figure 18:
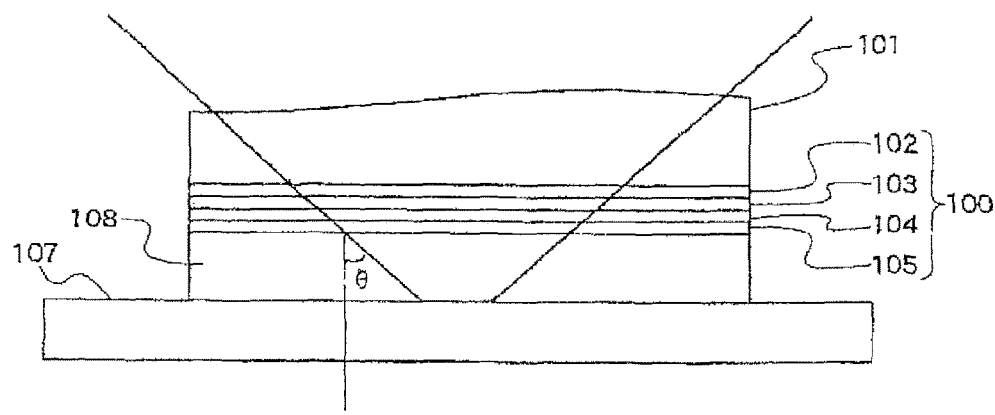
FIG. 18 is a view showing a configuration of an optical element of Embodiment 11.

FIG. 18 is a view showing a configuration of the optical element 1 of the present invention. This optical element 1 is formed by laminating the multilayer film 100 on the calcium fluoride substrate 101. The multilayer film 100 has a four-layered structure including $LaF_3$ as the first layer 102, $MgF_2$ as the second layer 103, $LaF_3$ as the third layer 104, and $SiO_2$ as the fourth layer 105, which are sequentially laminated on the calcium fluoride substrate 101. The immersion liquid 108 is water and the substrate 107 is silicon coated with the photoresist.

Here, refractive indices of LaF$_3$ in the first layer 102, MgF$_2$ in the second layer 103, LaF$_3$ in the third layer 104, and SiO$_2$ in the fourth layer 105, and optical film thicknesses as well as film thickness ranges of the respective layers 102 and so forth based on the designed dominant wavelength λ are shown below.

TABLE 6

| | Substance | Refractive index | Optical film thickness | Film thickness range |
|---|---|---|---|---|
| Immersion liquid | water | 1.44 | | |
| Fourth layer | SiO$_2$ | 1.55 | 0.37λ | 0.15~1.50λ |
| Third layer | LaF$_3$ | 1.69 | 0.70λ | 0.40~0.90λ |
| Second layer | MgF$_2$ | 1.43 | 0.10λ | 0.03~0.15λ |
| First layer | LaF$_3$ | 1.69 | 0.11λ | 0.03~0.20λ |
| Optical substrate | calcium fluoride | 1.50 | | |

Here, the vacuum vapor deposition method is used as the film forming method. It is to be noted, however, that the film forming method is not limited only to this method. It is possible to apply various sputtering methods, ion beam assisted methods, and ion plating methods that can produce dense structures.

Figure 19:
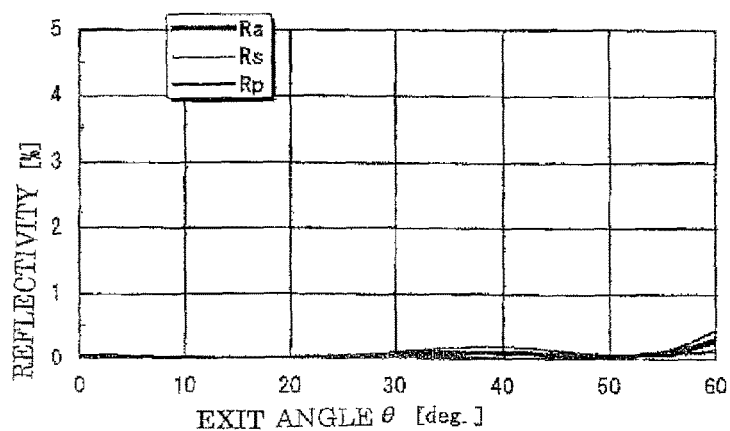
FIG. 19 is a graph showing a relation between reflectivity and an exit angle in terms of the optical element of Embodiment 11 applied to the ArF excimer laser.

FIG. 19 is a graph showing a relation between reflectivity and an exit angle in terms of the optical element 1 of this Embodiment 11 relative to the ArF (having the wavelength of 193 nm) excimer laser. As it is apparent from FIG. 19, the mean reflectance between the S polarization and the P polarization is approximately equal to or below 0.3% even when the exit angle θ is equal to 50 degrees or approximately equal to or below 0.5% even when the exit angle θ is equal to 60 degrees. Therefore, the optical element exhibits excellent characteristic and is usable enough.

Moreover, as shown in Table 6 described above, it is apparent that the refractive index of the first layer (LaF$_3$) 102 is higher than the refractive indices of the optical substrate 101 and the second layer (MgF$_2$) 103 which are adjacent thereto. Meanwhile, it is also apparent that the refractive index of the third layer (LaF$_3$) 104 is higher than the refractive indices of the second layer (MgF$_2$) 103 and the fourth layer (SiO$_2$) 105 which are adjacent thereto. By arranging the refractive indices as described above, the multilayer film 100 has the anti-reflection function as a whole.

Although SiO$_2$ of the fourth layer 105 is formed by use of the vacuum vapor deposition method in this Embodiment 11, it is also possible to form this film by use of the wet film forming method as similar to the separate second layer 103b as described in Embodiment 5. In this case, by providing the SiO$_2$ layer formed by the wet film forming method, the SiO$_2$ layer formed by the wet film forming method enters the voids on the third layer (LaF$_3$) 104 formed by use of the dry film forming method, and the voids are thereby eliminated. In this way, it is possible to prevent infiltration to and corrosion of the optical element 1 by the given immersion liquid 108 interposed between the surface of the substrate 107 and the projection optical system PL, and thereby to maintain the optical performance of the projection optical system PL. As a result, when this optical element 1 is applied to the projection exposure apparatus of the liquid immersion type, it is possible to avoid detachment of the multilayer film 100 of the present invention from the calcium fluoride substrate 101 and to avoid dissolution of the optical element 1 in the liquid. In this way, it is possible to maintain the performance of the projection exposure apparatus. In addition, it is not necessary to replace the optical element 1 frequently. Therefore, it is possible to maintain high throughput of the projection exposure apparatus.

Embodiment 12

A projection exposure apparatus is configured as similar to Embodiment 1 except applying the transmissive optical element 4 described below.

Figure 20:
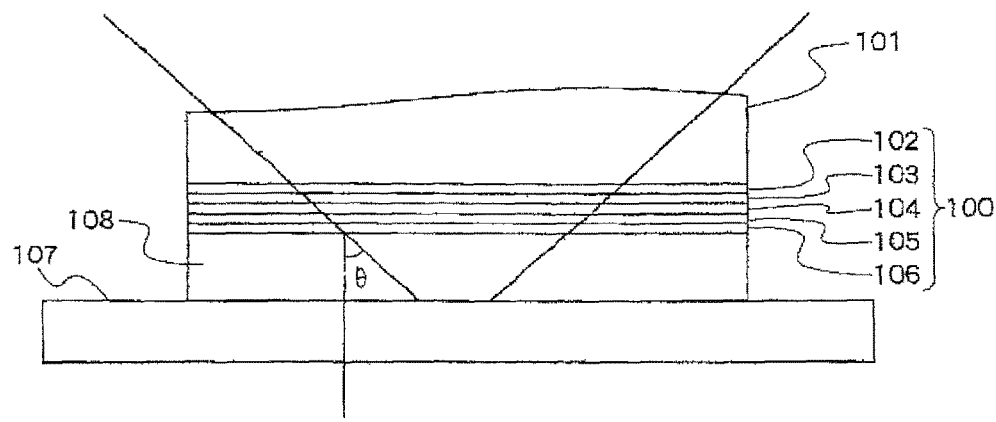
FIG. 20 is a view showing a configuration of an optical element of Embodiment 12.

FIG. 20 is a view showing a configuration of the optical element 1 of the present invention. This optical element 1 is formed by laminating the multilayer film 100 on the calcium fluoride substrate 101. The multilayer film 100 has a five-layered structure including LaF$_3$ as the first layer 102, MgF$_2$ as the second layer 103, LaF$_3$ as the third layer 104, MgF$_2$ as the fourth layer 105, and SiO$_2$ as a fifth layer 106, which are sequentially laminated on the calcium fluoride substrate 101. The immersion liquid 108 is water and the substrate 107 is silicon coated with the photoresist.

Here, refractive indices of LaF$_3$ in the first layer 102, MgF$_2$ in the second layer 103, LaF$_3$ in the third layer 104, MgF$_2$ in the fourth layer 105, and SiO$_2$ in the fifth layer 106, and optical film thicknesses as well as film thickness ranges of the respective layers 102 and so forth based on the designed dominant wavelength 2 are shown below.

TABLE 7

| | Substance | Refractive index | Optical film thickness | Film thickness range |
|---|---|---|---|---|
| Immersion liquid | water | 1.44 | | |
| Fifth layer | SiO$_2$ | 1.55 | 0.20λ | 0.05~0.35λ |
| Fourth layer | MgF$_2$ | 1.43 | 0.10λ | 0.03~0.18λ |
| Third layer | LaF$_3$ | 1.69 | 0.70λ | 0.55~0.82λ |
| Second layer | MgF$_2$ | 1.43 | 0.10λ | 0.03~0.18λ |
| First layer | LaF$_3$ | 1.69 | 0.11λ | 0.03~0.20λ |
| Optical substrate | calcium fluoride | 1.50 | | |

Here, the vacuum vapor deposition method is used as the film forming method. It is to be noted, however, that the film forming method is not limited only to this method. It is possible to apply various sputtering methods, ion beam assisted methods, and ion plating methods that can produce dense structures.

Figure 21:
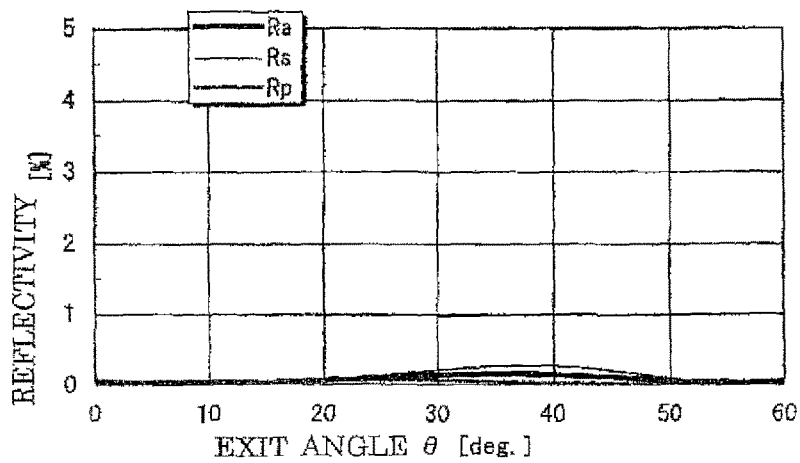
FIG. 21 is a graph showing a relation between reflectivity and an exit angle in terms of the optical element of Embodiment 12 applied to the ArF excimer laser.

FIG. 21 is a graph showing a relation between reflectivity and an exit angle in terms of the optical element of Embodiment 12 relative to the ArF (having the wavelength of 193 nm) excimer laser. As it is apparent from FIG. 21, the mean reflectance between the S polarization and the P polarization is approximately equal to or below 0.3% even when the exit angle θ is equal to 50 degrees or approximately equal to or below 0.5% even when the exit angle θ is equal to 60 degrees. Therefore, the optical element exhibits excellent characteristic and is usable enough.

Moreover, as shown in Table 7 described above, it is apparent that the refractive index of the first layer (LaF$_3$) 102 is higher than the refractive indices of the optical substrate 101 and the second layer (MgF$_2$) 103 which are adjacent thereto. Meanwhile, it is also apparent that the refractive index of the third layer (LaF$_3$) 104 is higher than the refractive indices of the second layer (MgF$_2$) 103 and the fourth layer (MgF$_2$) 105 which are adjacent thereto. By arranging the refractive indices as described above, the multilayer film 100 has the anti-reflection function as a whole.

Although SiO$_2$ of the fifth layer 106 is formed by use of the vacuum vapor deposition method in this Embodiment 12, it is also possible to form this film by use of the wet film forming method as similar to the separate second layer 103b as described in Embodiment 10. In this case, by providing the SiO$_2$ layer formed by the wet film forming method, the SiO$_2$ layer formed by the wet film forming method enters the voids on the fourth layer (MgF$_2$) 105 formed by use of the dry film forming method, and the voids are thereby eliminated. In this way, it is possible to prevent infiltration to and corrosion of the optical element 1 by the given immersion liquid 108 interposed between the surface of the substrate 107 and the projection optical system PL, and thereby to maintain the optical performance of the projection optical system PL. As a result, when this optical element 1 is applied to the projection exposure apparatus of the liquid immersion type, it is possible to avoid detachment of the multilayer film 100 of the present invention from the calcium fluoride substrate 101 and to avoid dissolution of the optical element 1 in the liquid. In this way, it is possible to maintain the performance of the projection exposure apparatus. In addition, it is not necessary to replace the optical element 1 frequently. Therefore, it is possible to maintain high throughput of the projection exposure apparatus.

Embodiment 13

A projection exposure apparatus is configured as similar to Embodiment 1 except applying the transmissive optical element 4 described below.

In this Embodiment 13, the material of the fourth layer 105 is different from that used in Embodiment 12. Specifically, in This Embodiment 13, Al$_2$O$_3$ is formed as the fourth layer 105.

Here, refractive indices of LaF$_3$ in the first layer 102, MgF$_2$ in the second layer 103, LaF$_3$ in the third layer 104, Al$_2$O$_3$ in the fourth layer 105, and SiO$_2$ in the fifth layer 106, and optical film thicknesses as well as film thickness ranges of the respective layers 102 and so forth based on the designed dominant wavelength $\lambda$ are shown below.

TABLE 8

| | Substance | Refractive index | Optical film thickness | Film thickness range |
|---|---|---|---|---|
| Immersion liquid | water | 1.44 | | |
| Fifth layer | SiO$_2$ | 1.55 | 0.37λ | 0.28~0.55λ |
| Fourth layer | Al$_2$O$_3$ | 1.85 | 0.10λ | 0.03~0.18λ |
| Third layer | LaF$_3$ | 1.69 | 0.51λ | 0.38~0.65λ |
| Second layer | MgF$_2$ | 1.43 | 0.10λ | 0.03~0.20λ |
| First layer | LaF$_3$ | 1.69 | 0.11λ | 0.03~0.25λ |
| Optical substrate | calcium fluoride | 1.50 | | |

Here, the vacuum vapor deposition method is used as the film forming method. It is to be noted, however, that the film forming method is not limited only to this method. It is possible to apply various sputtering methods, ion beam assisted methods, and ion plating methods that can produce dense structures.

In this Embodiment 13, the mean reflectance between the S polarization and the P polarization is approximately equal to or below 0.3% even when the exit angle θ is equal to 50 degrees or approximately equal to or below 0.5% even when the exit angle θ is equal to 60 degrees as similar to that of Embodiment 12. Therefore, the optical element exhibits excellent characteristic and is usable enough.

Moreover, as shown in Table 8, it is apparent that the refractive index of the first layer (LaF$_3$) 102 is higher than the refractive indices of the optical substrate 101 and the second layer (MgF$_2$) 103 which are adjacent thereto. Meanwhile, it is also apparent that the refractive index of the third layer (LaF$_3$) 104 is higher than the refractive indices of the second layer (MgF$_2$) 103 and the fourth layer (Al$_2$O$_3$) 105 which are adjacent thereto. By arranging the refractive indices as described above, the multilayer film 100 has the anti-reflection function as a whole.

Although SiO$_2$ of the fifth layer 106 is formed by use of the vacuum vapor deposition method in this Embodiment 13, it is also possible to form this film by use of the wet film forming method as similar to the separate second layer 103b as described in Embodiment 10. In this case, by providing the SiO$_2$ layer formed by the wet film forming method, the SiO$_2$ layer formed by the wet film forming method enters the voids on the fourth layer (Al$_2$O$_3$) 105 formed by use of the dry film forming method, and the voids are thereby eliminated. In this way, it is possible to prevent infiltration to and corrosion of the optical element 1 by the given immersion liquid 108 interposed between the surface of the substrate 107 and the projection optical system PL, and thereby to maintain the optical performance of the projection optical system PL. As a result, when this optical element 1 is applied to the projection exposure apparatus of the liquid immersion type, it is possible to avoid detachment of the multilayer film 100 of the present invention from the calcium fluoride substrate 101 and to avoid dissolution of the optical element 1 in the liquid. In this way, it is possible to maintain the performance of the projection exposure apparatus. In addition, it is not necessary to replace the optical element 1 frequently. Therefore, it is possible to maintain high throughput of the projection exposure apparatus.

According to the projection exposure apparatus of any of the above-described Embodiments 6 to 13, the multilayer film is formed on the surface of the optical element and the multilayer film has the protective function to protect the optical element against the liquid and an anti-reflection function to prevent reflection of the exposure light beam (the incident light). Therefore, it is possible to provide the stable optical element without being corroded by the liquid. Hence it is possible to provide the optical element which can realize a high-performance projection exposure apparatus having high resolution and large depth of focus by use of the liquid immersion method. Moreover, the multilayer film has the protective function for a given time period, and is therefore capable of protecting the optical element against water as the immersion liquid for ten years, for example. Hence it is possible to provide the optical element which can realize a high-performance projection exposure apparatus having high resolution and large depth of focus by use of the liquid immersion method. At the same time, it is possible to provide the stable optical element without being corroded by the liquid for the given time period.

Embodiment 14

A projection exposure apparatus is configured as similar to Embodiment 1 except applying the transmissive optical element 4 described below.

Figure 22:
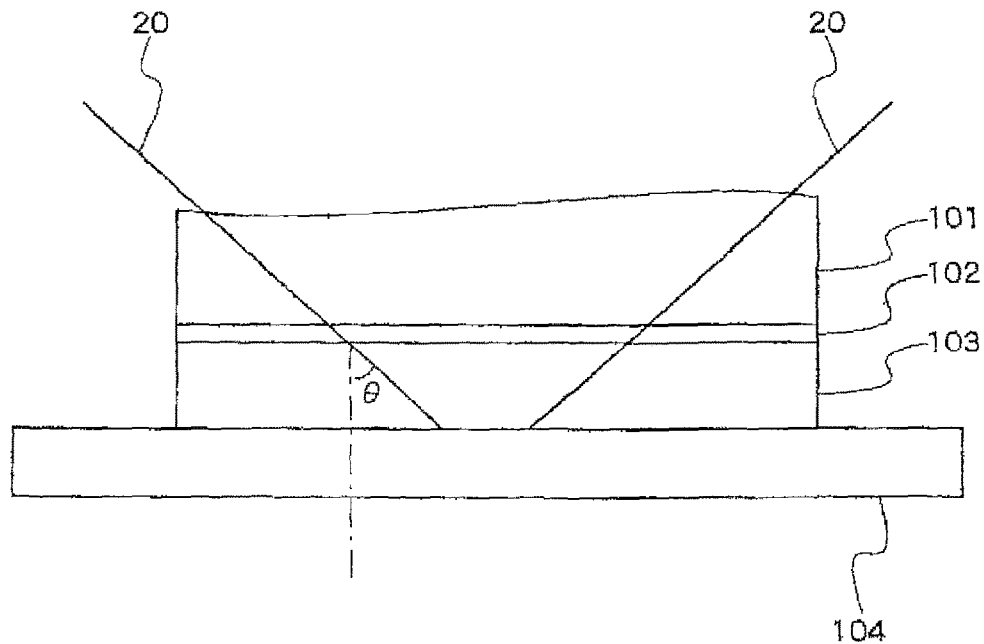
FIG. 22 is a view showing a configuration of an optical member used in Embodiment 14.

FIG. 22 is a view showing a configuration of an optical member used in Embodiment 14 of the present invention. The optical member 1 is formed by joining a fused silica thin plate 102 onto an optical element 101 made of calcium fluoride. Here, an immersion liquid 103 is water and a substrate is a silicon substrate 104 coated with photoresist. As for the joining method, when the exposure wavelength corresponds to that of ultraviolet rays such as the ArF laser, two composition surfaces are formed into planar surfaces and subjected to optical contact. The optical contact means a phenomenon of virtual contact of solids owing to an intermolecular force, which is observed by attaching two planar surfaces closely to each other. From the optical point of view, there is only an interface between a solid and another solid.

If it is not possible to obtain desired adhesion due to poor plane accuracy of the two interfaces subject to the optical contact, it is also possible to enhance adhesion by slightly coating pure water in a space between the interfaces to the extent not to cause corrosion on the surface of the optical element 101. Refractive indices of the optical element 101 and the fused silica thin plate 102 are 1.50 and 1.55, respectively.

Figure 23:
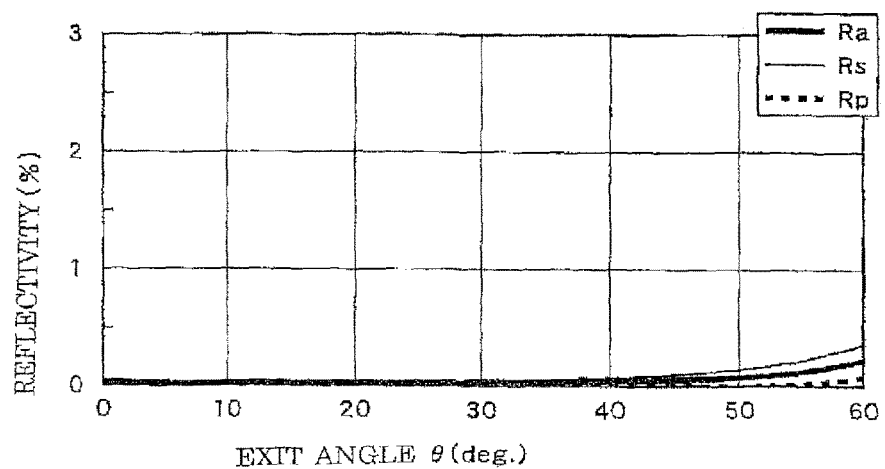
FIG. 23 is a graph showing angle-reflectance characteristics on an interface of optical contact shown in FIG. 22.

FIG. 23 is a graph showing an angle-reflectance characteristics on an interface of optical contact (the fused silica/calcium fluoride) shown in FIG. 22. As it is apparent from FIG. 23, the mean reflectance Ra between the S polarization Rs and the P polarization Rp relative to the incident light 20 is equal to or below 0.3% even when the exit angle θ is equal to 60 degrees. Therefore, the optical member exhibits excellent characteristic and is usable enough.

The reason why the optical element 101 as the optical substrate is not made of fused silica is that the fused silica thin plate 102 may cause compaction upon laser irradiation and is not therefore suitable. On the other hand, the reason for adopting the fused silica thin plate 102 is that it is possible to minimize an adverse effect even if the compaction occurs therein.

According to the projection exposure apparatus of the above-described Embodiment 14, the fused silica thin plate 102 has a very low solubility in water and is therefore applicable without causing degradation in the performance attributable to corrosion. It is possible to realize a liquid immersion optical system without causing optical degradation by using this element for the liquid immersion method.

Embodiment 15

A projection exposure apparatus is configured as similar to Embodiment 1 except applying the transmissive optical element 4 described below.

Figure 24:
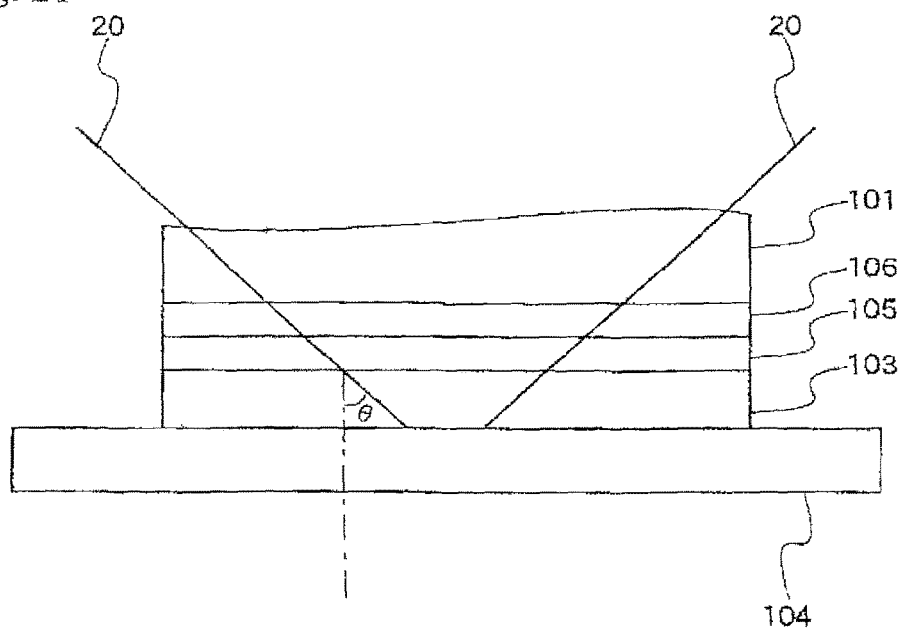
FIG. 24 is a view showing a configuration of an optical member used in Embodiment 15.

FIG. 24 is a view showing a configuration of the optical member used in Embodiment 15 of the present invention. The optical member 1 is formed by joining a crystalline magnesium fluoride (hereinafter expressed as $MgF_2$) thin plate 105 onto the optical element 101 made of calcium fluoride. Here, the immersion liquid 103 is water and the substrate is the silicon substrate 104 coated with photoresist. A space between the optical element 101 and the $MgF_2$ thin plate 105 is filled with a liquid (a filler liquid) 106 with a small difference in refractive index therefrom. If this filler liquid 106 has a difference in the refractive index equal to or below 0.2 relative to those of respective substrates, the filler liquid has small residual reflection and can be used favorably.

Since $MgF_2$ has some solubility in water ($2 \times 10^{-4}$ grams per hundred grams of water according to the literature data) and therefore dissolves in water when used over a long period of time. As the dissolution progresses, there is a risk of damaging a transmission wavefront of a projector lens. If the optical element 101 is directly coated with a magnesium fluoride ($MgF_2$) which is in an inappropriate film thickness, there is the risk of distorting the transmission wavefront due to the elution. In this event, it may be necessary to carry out an extensive operation for replacing the optical element 101. Particularly, when the optical element 101 is formed into a lens shape, it is necessary to perform delicate alignment with an optical axis of the projector lens upon replacement which is not easy. In the case of Embodiment 15 of the present invention, it is possible to replace only the thin plate. Accordingly, it is possible to perform replacement while minimizing an adverse effect on an image-forming performance.

Although Embodiment 15 of the present invention applies the crystalline magnesium fluoride ($MgF_2$) thin plate, it is also possible to apply a crystalline magnesium fluoride ($MgF_2$) sintered body instead. Alternatively, it is also possible to apply a calcium fluoride thin plate coated with magnesium fluoride ($MgF_2$) or a very thin PTFE (polytetrafluoroethylene or Teflon (registered trademark)) thin plate. As for the coating method in this case, it is possible to apply not only a typical vapor deposition method but also any appropriate methods including ion plating method and various sputtering methods.

Here, the thin plate described in the description of the preferred embodiments of the present invention may be formed into a parallel plate as well.

According to the projection exposure apparatus of the above-described Embodiment 15, the tip portion of the projection optical system is not corroded by the liquid. Therefore, it is not necessary to stop operation of the projection exposure apparatus in order to replace the optical member 1 corroded by water or the like, and it is thereby possible to manufacture end products efficiently. Moreover, the optical member 1 of the present invention is not corroded for a given period of time while the projection exposure apparatus is in operation. Accordingly, the optical member 1 has a stable optical characteristic. In this way, it is possible to stabilize the quality of end products to be manufactured by use of the projection exposure apparatus embedding the optical member of the present invention.

Although the present invention has been described with reference to Embodiments 1 to 15, it should be understood that the present invention is not limited only to the features described in Embodiments 1 to 15. For example, in Embodiment 4 and the like, the anti-dissolution films are formed on the surface on the substrate's side and on the side surface of the optical element on the substrate's side of the projection optical system by use of magnesium fluoride ($MgF_2$) as the anti-dissolution films. Instead, it is possible to form an anti-dissolution film on the surface on the substrate's side of the optical element on the substrate's side of the projection optical system by use of hydrophilic silicon oxide ($SiO_2$), and meanwhile, to form a hydrophobic anti-dissolution film on the side surface of the optical element on the substrate's side of the projection optical system by use of alkyl ketene dimer.

Here, the anti-dissolution film formed on the side surface of the optical element is the anti-dissolution film having an excellent hydrophobic performance as compared to the anti-dissolution film formed on the surface on the substrate's side of the optical element, while the anti-dissolution film formed on the surface on the substrate's side of the optical element is the anti-dissolution film having an excellent hydrophilic performance as compared to the anti-dissolution film formed on the side surface of the optical element. It is possible to guide the liquid attached to the side surface of the optical element easily to the substrate's side because the anti-dissolution film formed on the side surface of the optical element is the hydrophobic anti-dissolution film. Moreover, it is possible to fill the space between the surface on the substrate's side of the optical element and the substrate constantly with the liquid because the anti-dissolution film formed on the surface on the substrate's side of the optical element is the hydrophilic anti-dissolution film.

Meanwhile, in the above-described Embodiment 5 and the like, the first film constructed as the silicon dioxide ($SiO_2$) film is formed on the transmissive optical element by use of the sputtering method. Instead, it is possible to form this film by use of a different dry film forming method such as the vacuum vapor deposition method or the CVD method.

Moreover, in the above-described Embodiment 5 and the like, the silicon dioxide ($SiO_2$) film is formed as the first film by use of the dry film forming method and the other silicon dioxide ($SiO_2$) film is formed as the second film by use of the wet film forming method. Instead, it is possible to form the magnesium fluoride ($MgF_2$) film as the first film by use of the dry film forming method and to form the silicon dioxide ($SiO_2$) film as the second film by use of the wet film forming method.

Meanwhile, in the above-described embodiments, the space between the surface of the wafer and the optical element made of calcium fluoride and formed on the wafer's side of the projection optical system is filled with the liquid. Instead, it is possible to interpose the liquid partially between the surface of the wafer and the optical element made of calcium fluoride and formed on the wafer's side of the projection optical system.

Moreover, although pure water is used as the liquid in the above-described embodiments, the liquid is not limited only to the pure water. It is also possible to use another liquid (such as cedar oil), which allows is transmission of the exposure light beam and has a high refractive index as much as possible, and remains stable against the photoresist with which the projection optical system and the surface of the wafer are coated. When a $F_2$ laser beam is used as the exposure light beam, it is possible to use a fluorinated liquid that allows transmission of the $F_2$ laser beam. Such a fluorinated liquid may be fluorinated oil or perfluoropolyether (PFPE), for example.

Moreover, in the above-described embodiments, the optical element used in the present invention is formed into a lens shape. However, the shape of the optical element is not limited only to the lens shape. For example, it is also possible to form the optical element of the present invention by forming a film on a calcium fluoride plate substrate as a cover glass in a space between a conventional calcium fluoride lens and the liquid.

In addition, Embodiments 14 and 15 explain the example of slightly coating pure water on the two joining interfaces. Instead, it is possible to use fluorinated solvents such as perfluorocarbon (PFC), hydrofluoroether (HFE) or perfluoropolyether (PFPE).

Moreover, the number and shapes of the nozzles used in the embodiments are not particularly limited. For example, it is possible to provide two pairs of nozzles along a long side of the tip portion 4A to perform supply and recovery of the liquid. In this case, it is also possible to arrange the exhaust nozzles and the intake nozzles vertically so as to effectuate the supply and recovery of the liquid both in the +X direction and in the −X direction.

Embodiment 16

A projection exposure apparatus is configured as similar to Embodiment 1 except applying an optical element with which an optical member optically contacts through a film as described below.

As shown in FIG. 1, the projection exposure apparatus of this Embodiment 16 applying the step and repeat method includes an illumination optical system 1 for illuminating a reticle (a mask) R, a reticle stage device RST for supporting the reticle R, a wafer stage device for supporting a wafer (a substrate) W, a wafer stage drive system 15 for driving the wafer stage device and thereby moving the wafer W three-dimensionally, a projection optical system PL for projecting a pattern image formed on the reticle R onto the wafer W, a liquid circulation device for supplying a liquid 7 to a space between the projection optical system PL and the wafer W, and a main control system 14 for comprehensively controlling overall operation of the projection exposure apparatus.

The illumination optical system 1 includes an ArF excimer laser as an exposure light source, an optical integrator (a homogenizer), a field stop, a condenser lens, and the like. An exposure light beam IL consisting of ultraviolet pulse beams having a wavelength of 193 nm is emitted from the light source, and then passes through the illumination optical system 1 and thereby illuminates the pattern image provided on the reticle R. The imaging light passing through the reticle R is projected onto an exposure region on the wafer W coated with a photoresist through a projection optical system PL. Here, as the exposure light beam IL, it is also possible to use the KrF excimer laser beam (having the wavelength of 248 nm), the $F_2$ laser beam (having the wavelength of 157 nm), the i-line from a mercury lamp (having the wavelength of 365 nm), and the like.

The reticle stage device RST is configured to be capable of adjusting the position and posture of the reticle R while retaining the reticle R. Specifically, the reticle stage device RST incorporates a mechanism for finely moving the reticle R in an X direction and a Y direction which are substantially perpendicular to an optical axis AX of the projection optical system PL, and in a direction of rotation around the optical axis AX. Positions of the reticle R in terms of the X direction, the Y direction, and the direction of rotation are measured in real time by a reticle laser interferometer (not shown) and are controlled by a reticle stage drive system (not shown).

The wafer stage device is configured to be capable of adjusting the position and posture of the wafer W while retaining the wafer W. To be more precise on the structure, the wafer W is fixed onto a Z stage 9 by use of a wafer holder, and this Z stage 9 allows adjustment of a focal position of the wafer W, i.e. a position in a Z direction substantially parallel to the optical axis AX, and a tilt angle thereof corresponding to that position. The Z stage 9 is fixed onto an XY stage 10 and this XY stage 10 is supported on a base 11. The XY stage 10 is capable of moving the wafer holder along the XY plane that is substantially parallel to an image plane of the projection optical system PL, changing a shot region on the wafer W, and so on. Here, positions of the Z stage 9 in terms of the X direction, the Y direction, and the direction of rotation are measured in real time by a movable mirror 12 located on the wafer holder and by a wafer laser interferometer 13 configured to supply measuring light to the movable mirror 12.

The wafer stage drive system 15 is operated in response to a control signal from the main control system 14, and is capable of moving the wafer W to a target position at appropriate timing while retaining the posture in a desired condition.

The projection optical system PL includes a lens barrel 3 for housing multiple optical elements such as lenses or optical components formed by processing silica glass or calcium fluoride. This projection optical system PL is an image-forming optical system rendered telecentric on both sides or on one side toward the wafer W. The pattern image on the reticle R is reduced and projected onto a shot region on the wafer W at given projection magnification β of ¼ or ⅕, for example, through the projection optical system PL.

Here, this projection optical system PL constitutes a liquid immersion optical system to be used in the state of filling the given liquid 7 in a space defined with the wafer W. In other words, this projection exposure apparatus adopts the liquid immersion method in order to virtually shorten an exposure wavelength and to improve resolution. In the projection exposure apparatus of the liquid immersion type, the liquid 7 fills a space between a surface of the wafer W and tip surface of an optical element 4 exposed on the wafer W side of the projection optical system PL at least during the transfer of the pattern image of the reticle R onto the wafer W. Pure water which is easily available in large quantity at a semiconductor manufacturing plant or the like is used as the liquid 7. Here, the pure water contains very low quantity of impurities and is therefore expected to exhibit a function to clean the surface of the wafer W. Here, in the course of exposure, only the tip portion on the wafer W side of the optical element 4 out of the projection optical system PL is configured to contact the liquid 7. In this way, corrosion and other defects of the lens barrel 3 made of metal are prevented.

Figure 25:
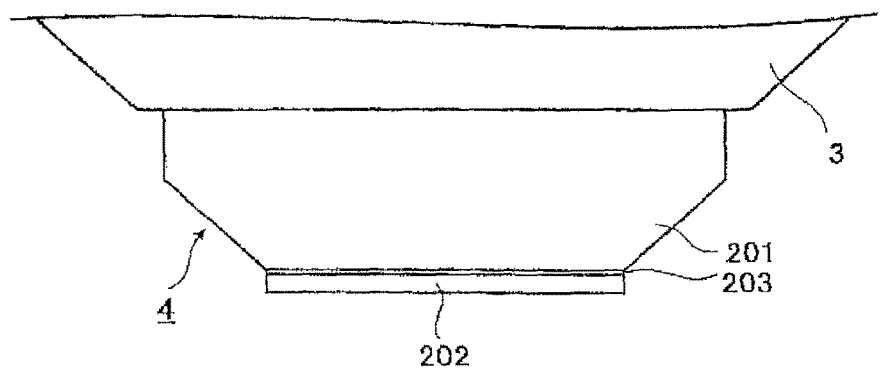
FIG. 25 is a view showing a configuration of an optical element used in Embodiment 16.

FIG. 25 is a sectional side view for conceptually explaining a structure of the optical element 4, which protrudes toward the wafer W of the projection optical system PL used in this embodiment.

As it is apparent from FIG. 25, the optical element 4 is formed by establishing optical contact between a substrate member 201 which is the optical element made of calcium fluoride and an optical member 202 formed of a substrate member made of synthetic silica. In this projection optical system PL, only the optical member 202 on the tip side of the optical element 4 contact the liquid 7 which is pure water or the like, while the substrate member 201 located in the back does not directly contact the liquid 7. The reason why the tip of the projection optical system PL is covered with the optical member 202 is that the optical element 4 made of calcium fluoride has slight solubility in the liquid 7 which is pure water or the like. Accordingly, the optical member 202 made of synthetic silica having high water resistance is provided for protecting the optical element 4.

When the optical member 202 is retained and fixed onto the optical element 4 by use of the optical contact, it is necessary to increase bond strength between the optical element 4 and the optical member 202 so that the optical member 202 is not misaligned to or detached from the optical element 4. For this reason, a thin coating film 203 made of an oxide is formed on a surface of the side of the substrate member 201 of the optical element 4 used for the optical contact. On the other hand, no coating film is formed on a surface of the side of the optical member 202 used for the optical contact. As described above, the bond strength between the substrate member 201 and the optical member 202 of the optical element 4 is enhanced by interposing the coating film 203 between the substrate member 201 and the optical member 202.

The reason why the bond strength between the substrate member 201 and the optical member 202 of the optical element 4 is enhanced will be briefly described below. As disclosed in Japanese Patent Application Laid-Open Gazette No. Hei 9-221342 (JP 9-221342 A), surface roughness of a composition surface is known as a factor that affects the bond strength in the optical contact. However, it is recently known that a chemical factor also has an influence in addition to the surface roughness in the case of the optical contact. The inventor of the present invention has found out that it is possible to enhance the bonding strength between the substrate member 201 and the optical member 202, which collectively constitute the optical element 4 at the tip of the projection optical system PL, by controlling such a chemical factor.

In the conventional optical contact among oxide optical materials, hydroxyl groups (—OH) exist in high density on both of the surfaces used for bonding. Accordingly, it is conceivable that covalent bonding attributable to hydrogen bonding or dehydrative condensation occurs when closely attaching these surfaces to each other, which brings about firm bond. Meanwhile, in terms of the optical element 4 of this embodiment, a surface of a fluoride ($CaF_2$, specifically) constituting the substrate member 201 of the optical element 4 has low density of hydroxyl groups as compared to a surface of an oxide. Therefore, it is conceivable that it is difficult to obtain firm bond even when the fluoride is closely attached to the optical member 202 without any treatment. Accordingly, a sufficient amount of hydroxyl groups are introduced to the composition surface by coating the fluoride surface of the substrate member 201 with the coating film 203 made of an oxide. In this way, it is possible to achieve firm optical contact between the substrate member 201 and the optical member 202. To be more precise, the thin coating film 203 made of silicon dioxide ($SiO_2$) is uniformly deposited on the substrate member 201 by use of the vacuum vapor deposition method.

Moreover, since the coating film 203 made of silicon dioxide is formed on the substrate member 201 made of calcium fluoride by use of the vacuum vapor deposition method, it is possible to suppress the occurrence of cracks or the like on the coating film 203. That is, there is not a large difference between the thermal expansion coefficient of calcium fluoride and the thermal expansion coefficient of silicon dioxide. Accordingly, it is possible to prevent occurrence of cracks or persistence of pressure distortion on the coating film 203 when the coating film 203 is formed on the heated substrate member 201 and then these constituents are cooled down to a room temperature. Incidentally, when a fluoride film is formed on silica, cracks are likely to occur on the film because there is a large difference in the thermal expansion coefficient (approximately one order of difference) therebetween.

Figure 26:
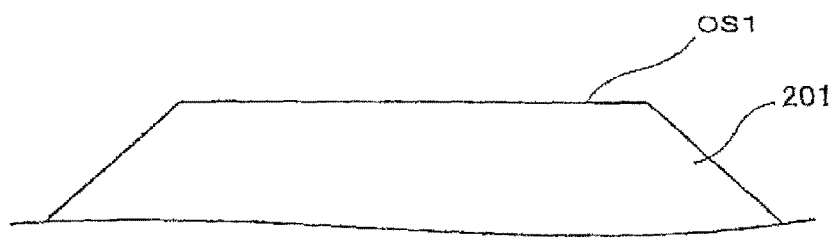
FIG. 26 is a view conceptually showing a first step in a manufacturing process for an optical element 4 shown in FIG. 25.
Figure 27:
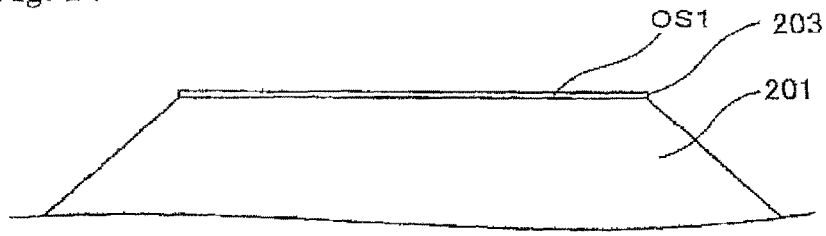
FIG. 27 is a view conceptually showing a second step in the manufacturing process for the optical element 4 shown in FIG. 25.
Figure 28:
FIG. 28 is a view conceptually showing a third step in the manufacturing process for the optical element 4 shown in FIG. 25.
Figure 29:
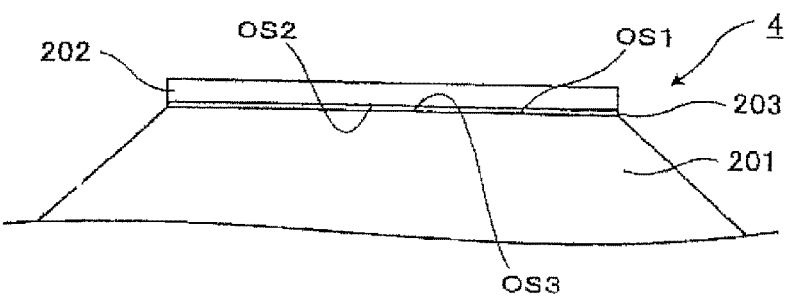
FIG. 29 is a view conceptually showing a fourth step in the manufacturing process for the optical element 4 shown in FIG. 25.

FIG. 26 to FIG. 29 are views for briefly explaining a manufacturing process for the optical element 4 shown in FIG. 25. Firstly, as shown in FIG. 26, the substrate member 201 being the optical element having a given optical surface OS1 is prepared by processing calcium fluoride ($CaF_2$). Then, as shown in FIG. 27, a $SiO_2$ layer is deposited on the optical surface OS1 while heating the substrate member 201, thereby forming the coating film 203. In this way, it is possible to prepare the substrate member 201 having the coating film 203. In this case, it is possible to form the high-density coating film 203 having a high degree of adhesion to the substrate member 201 by use of the vacuum vapor deposition method. Next, as shown in FIG. 28, the optical member 202 having a given optical surface OS2 is prepared by processing synthetic silica (SiO$_2$). Lastly, as shown in FIG. 29, the substrate member 201 and the optical member 202 are attached to each other to form the optical contact between a surface OS3 of the coating film 203 on the substrate member 203 and the optical surface OS2 of the optical member 202. The optical element 4 is finished accordingly.

In a concrete example of fabrication, the optical surface OS1 on the outgoing side of calcium fluoride (CaF$_2$) constituting the substrate member 201 of the optical element 4 is formed into a planar surface. Further, the substrate material 201 is heated at the time of film formation by vacuum deposition, and the coating film 203 is formed in a film thickness of about 10 nm. Meanwhile, in terms of the optical member 202, a synthetic silica substrate is formed into a parallel plate having a thickness of 1 mm. Thereafter, an optical contact surface of the substrate member 201 and an optical contact surface of the optical member 202 of the optical element 4 are attached and joined to each other without using an adhesive. Then, an experiment described below is carried out to confirm strength of the optical contact of the optical element 4 thus formed.

Specifically, optical transmittance (%) at the wavelength of 193.4 nm is measured with an ultraviolet spectrophotometer to evaluate the optical transmittance of the optical element 4. Moreover, a tension load test is carried out by use of a high-precision universal material testing machine in order to evaluate the strength of the optical element 4. Here, in the tension load test, a tension load is applied in the direction of tearing the optical member 202 off the substrate member 201 of the optical element 4, or in other words, a tension load in the perpendicular direction to the optical contact surfaces. The value of the load consumed to detach the optical member 202 is defined as a detachment load (Kgf/cm$^2$). For the purpose of comparison, another substrate member 201 without the coating film 203 is prepared and a comparative sample is formed by subjecting this substrate member 201 and the optical member 202 directly to the optical contact. Results are show in Table 9 below.

TABLE 9

|  | Transmittance (%) | Detachment load (Kgf/cm$^2$) |
|---|---|---|
| Example (with SiO$_2$ layer) | 91.5 | 31.8 |
| Comparative Example (without SiO$_2$ layer) | 91.5 | 10.3 |

As it is apparent in Table 9 shown above, the optical element 4 of this embodiment (Example: with the SiO$_2$ layer) has several times as large anti-detachment strength as the optical element of the comparative sample (Comparative Example: without the SiO$_2$ layer) concerning the optical contact. It is also apparent that a loss in light intensity concerning the exposure light wavelength is almost equal between these optical elements.

Back to FIG. 1, the liquid circulation device includes a liquid supply device 5 and a liquid recovery device 6. Of these devices, the liquid supply device 5 includes a tank for the liquid 7, a booster pump (not shown), a temperature control device, and the like. The liquid supply device 5 supplies the temperature-controlled liquid 7 into a space between the wafer W and the tip portion of the optical element 4 through a supply tube 21 and an exhaust nozzle 21a. Meanwhile, the liquid recovery device 6 includes a tank for the liquid 7, a suction pump, and the like. The liquid recovery device 6 recovers the liquid 7 in the space between the wafer W and the tip portion of the optical element 4 through a recovery tube 23 and intake nozzles 23a and 23b. The temperature of the liquid 7 circulated by the liquid circulation device is set to substantially the same degree as the temperature inside a chamber in which the projection exposure apparatus of this embodiment is housed, for example. Here, the refractive index of pure water n relative to an exposure light beam having a wavelength around 200 nm is approximately equal to 1.44, and the ArF excimer laser beam having the wavelength of 193 nm is therefore reduced by 1/n times on the wafer W or is virtually reduced to 134 nm. In this way, it is possible to achieve high resolution.

FIG. 3 is a plan view showing positional relations concerning the X direction among the exhaust nozzle 21a and the intake nozzles 23a and 23b of FIG. 1, and FIG. 4 is a plan view showing positional relations concerning the Y direction among the exhaust nozzle 21a and the intake nozzles 23a and 23b of FIG. 1.

As shown in FIG. 3, a first exhaust nozzle 21a having an elongated tip portion is disposed in the +X direction so as to sandwich a tip portion 4A of the optical element 4 which is an object lens of spotlight of the projection optical system, and a second exhaust nozzle 22a having an elongated tip portion is disposed in the −X direction. These first and second exhaust nozzles 21a and 22a are connected to the liquid supply device 5 through first and second supply tubes 21 and 22, respectively. Meanwhile, a pair of first intake nozzles 23a having spread tip portions are disposed in the +X direction so as to sandwich the tip portion 4A of the optical element 4, and a pair of second intake nozzle 24a having spread tip portions are disposed in the −X direction. These first and second intake nozzles 23a and 24a are connected to the liquid recovery device 6 through first and second recovery tubes 23 and 24, respectively.

When the wafer W is moved stepwise in a direction (the −X direction) of an arrow 25A indicated with a solid line, the liquid 7 is supplied to the space between the tip portion 4A of the optical element 4 and the wafer W through the first supply tube 21 and the first exhaust nozzle 21a. At the same time, the liquid 7 supplied to the space between the tip portion 4A of the optical element 4 and the wafer W is recovered through the second recovery tube 24 and the second intake nozzles 24a. On the other hand, when the wafer W is moved stepwise in a direction (the +X direction) of an arrow 26A indicated with a dot line, the liquid 7 is supplied to the space between the tip portion 4A of the optical element 4 and the wafer W through the second supply tube 22 and the second exhaust nozzle 22a. At the same time, the liquid 7 supplied to the space between the tip portion 4A of the optical element 4 and the wafer W is recovered through the first recovery tube 23 and the first intake nozzles 23a.

As shown in FIG. 4, a third exhaust nozzle 27a having an elongated tip portion is disposed in the +Y direction so as to sandwich the tip portion 4A of the optical element 4, and a fourth exhaust nozzle 28a having an elongated tip portion is disposed in the −Y direction. These third and fourth exhaust nozzles 27a and 28a are connected to the liquid supply device 5 through third and fourth supply tubes 27 and 28, respectively. Meanwhile, a pair of third intake nozzles 29a having spread tip portions are disposed in the +Y direction so as to sandwich the tip portion 4A of the optical element 4, and a pair of fourth intake nozzle 30a having spread tip portions are disposed in the −Y direction. These third and fourth intake nozzles 29a and 30a are connected to the liquid recovery device 6 through third and fourth recovery tubes 29 and 30, respectively.

When the wafer W is moved stepwise in the ±Y directions, it is similar to the above-described stepwise movement in the ±X directions. Specifically, the liquid 7 is discharged from the corresponding nozzle out of the third and fourth nozzles 27a and 28a by switching the third and fourth supply tubes 27 and 28. At the same time, the liquid 7 is aspirated through the corresponding pair of nozzles out of the third and fourth intake nozzles 29a and 30a by switching the third and fourth recovery tubes 29 and 30.

Here, in addition to the nozzles 23a to 30a configured to supply and recover the liquid 7 along the X direction and the Y direction as described above, it is also possible to provide nozzles for supplying and recovering the liquid 7 along oblique directions, for example.

Back to FIG. 1, the main control system 14 adjusts positions and posture of the reticle R by transmitting a control signal to the drive mechanism incorporated in the reticle stage device RST and thereby finely moving the reticle stage. At this time, the positions in terms of the X direction, the Y direction, and the direction of rotation of the reticle R are measured with the unillustrated reticle laser interferometer.

Moreover, the main control system 14 adjusts a focal position and a tilt angle of the wafer W by transmitting a control signal to the wafer stage drive mechanism 15 and finely moving the Z stage 9 through the wafer stage drive system 15. Meanwhile, the main control system 14 adjusts the positions in terms of the X direction, the Y direction, and the direction of rotation of the wafer W by transmitting a control signal to the wafer stage drive mechanism 15 and finely moving the XY stage 10 through the wafer stage drive system 15. At this time, the positions in terms of the X direction, the Y direction, and the direction of rotation of the wafer W are measured with the wafer laser interferometer 13.

At the time of exposure, the main control system 14 sequentially moves respective shot regions on the wafer W stepwise to a position of exposure by transmitting a control signal to the wafer stage drive system 15 and driving the XY stage 10 with the wafer stage drive system 15. Specifically, an operation for exposing the pattern image of the reticle R onto the wafer W is repeated in accordance with the step and repeat method.

In the course of the exposure as well as before and after the exposure, the main control system 14 appropriately operates the liquid circulation device including the liquid supply device 5 and the liquid recovery device 6, thereby controlling an amount of supply and an amount of recovery of the liquid 7 to fill the space between a lower end of the projection optical system PL and the wafer W in the course of movement of the wafer W. As shown in FIG. 5, when the wafer W is traveling in the –X direction along the arrow 25A, for example, the liquid 7 supplied from the first exhaust nozzle 21a flows in the direction (the –X direction) of an arrow 25A and is recovered by the second intake nozzles 23a and 23b. In order to maintain a constant amount of the liquid 7 to fill the space between the optical element 4 and the wafer W in the course of movement of the wafer W, an amount of supply Vi ($m^3$/s) and an amount of recovery Vo ($m^3$/s) of the liquid 7 are set equal. Moreover, in order to avoid excessive or insufficient circulation of the liquid 7, a total amount of the amount of supply Vi and the amount of recovery Vo of the liquid 7 is adjusted based on a traveling speed v of the XY stage 10, i.e. the wafer W. For example, the amount of supply Vi and the amount of recovery Vo of the liquid 7 are calculated by the following formula 1.

$$Vi=Vo=D \cdot v \cdot d \qquad (1)$$

Here, D denotes a diameter (m) of the tip portion 4A of the optical element 4. Meanwhile, v denotes the traveling speed (m/s) of the wafer W on the XY stage 10 and d denotes a working distance (m) of the projection optical system PL. The main control system 14 controls the stepwise movement of the XY stage 10, and is able to fill the liquid 7 in the space between the optical element 4 and the wafer W constantly in the stable state by calculating the amount of supply Vi and the amount of recovery Vo of the liquid 7 based on the formula 1 corresponding to the stepwise movement of the XY stage 10. By controlling amount of supply Vi and the amount of recovery Vo of the liquid 7 as described above, it is possible to prevent the liquid 7 from leaking out of the optical element and to prevent the optical member 202 at the tip of the optical element 4 from being soaked in the liquid 7. Accordingly, it is possible to prevent corrosion of the optical element 4 and damage on the optical contact with the optical member 202, and thereby to maintain the performance of the optical element 4 over a long period of time. In other words, it is possible to reduce the frequency of replacement of the optical element 4 and to maintain high throughput in the exposure process on the wafer W. Eventually, it is possible to efficiently manufacture end products in high quality.

The foregoing explanation relates to the case of moving the wafer W in the ±X directions. It is also possible to maintain the amount of the liquid 7 between the optical element 4 and the wafer W stably by performing similar control in the case of moving the wafer W in the ±Y directions as well.

Here, it is preferable to adjust the working distance d of the projection optical system PL as narrow as possible in order to retain the liquid 7 stably between the optical element 4 and the wafer W. The working distance d of the projection optical system PL is set to about 2 mm, for example.

As it is apparent from the above description, the projection exposure apparatus of this embodiment applies the projection optical system PL incorporating the optical element 4 having high optical transmittance, which system is obtained by firmly joining the optical element 4 to the optical member 202 by the excellent optical contact. In this way, it is possible to perform the exposure process of the liquid immersion type which can maintain the high performance over a long period of time.

Although the present invention has been described in terms of Embodiment 16, it is to be noted that the present invention is not limited only to this Embodiment 16. For example, as for the material of the substrate member 201 of the optical element 4, it is possible to use barium fluoride ($BaF_2$), magnesium fluoride ($MgF_2$), and the like instead of calcium fluoride depending on the wavelength used therein.

Meanwhile, as for the material of the coating film 203 of the optical element 4, it is possible to use aluminum oxide ($Al_2O_3$) and the like instead of silicon dioxide ($SiO_2$) depending on the wavelength used therein. Here, the coating film 203 is not limited to a single-layer film and it is also possible to form the coating film 203 by depositing two or more different types of films. Nevertheless, it is possible to form an oxide film such as silicon dioxide as the outermost layer.

Meanwhile, as for the material of the optical member 202, it is possible to use sapphire instead of silica depending on the wavelength used therein. In addition, the optical member 202 may be formed by depositing a thin film of silicon dioxide ($SiO_2$) or the like on a surface of fluoride glass or the like.

Meanwhile, the shapes of the substrate member 201 and the optical member 202 of the optical element 4 are not limited those described in this embodiment. For example, the surfaces of the substrate member 201 and the optical member 202 are not limited to flat surfaces, and it is possible to apply various curved surfaces having a variety of curvature.

Moreover, in this embodiment, the silicon dioxide ($SiO_2$) film is formed on the substrate member 201 by use of the vacuum vapor deposition method. Instead, it is possible to use other film forming methods including the ion beam assisted vapor deposition method, the gas cluster ion beam assisted vapor deposition method, the ion plating method, the ion beam sputtering method, the magnetron sputtering method, the bias sputtering method, the ECR sputtering method, the RF sputtering method, the thermal CVD method, the plasma enhanced CVD method, and the photo CVD method.

Further, the clearance between the tip portion 4A of the optical element 4 and the surface of the wafer W is entirely filled with the liquid 7 in this embodiment. Instead, it is also possible to interpose the liquid partially in this clearance.

Although pure water is used as the liquid 7 in this embodiment, the liquid is not limited only to the pure water. It is also possible to use various other liquids (such as cedar oil), which allow transmission of the exposure light beam and remain stable against the photoresist with which the projection optical system and the surface of the wafer were coated. Here, when a $F_2$ laser beam is used as the exposure light beam, it is possible to use a fluorinated liquid that allows transmission of the $F_2$ laser beam as the liquid 7. Such a fluorinated liquid may be fluorinated oil or perfluoropolyether (PFPE), for example.

Moreover, the layout and the number of the nozzles and the like in this embodiment are shown merely as an example. It is therefore possible to change the layout and the number of the nozzles as appropriate so as to correspond to the size, the traveling speed, and other factors of the wafer W.

Embodiment 17

Figure 30:
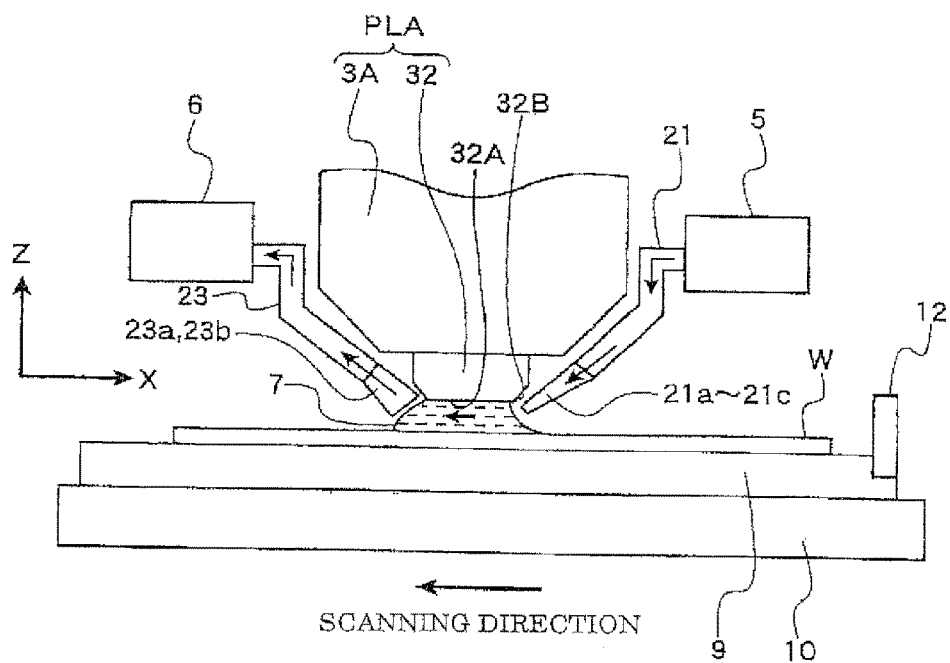
FIG. 30 is a view showing a schematic configuration of a projection exposure apparatus used in Embodiment 17.

Next, a projection exposure apparatus of Embodiment 17 will be described with reference to the accompanying drawings. FIG. 30 is a front view showing a lower part of a projection optical system PLA, the liquid supply device 5, the liquid recovery device 6, and the like of the projection exposure apparatus applying the step-and-scan method according to Embodiment 17. It is to be noted that an XYZ orthogonal coordinate system as illustrated in FIG. 1 will be set up in the following explanation, and positional relations of respective members will be described with reference to this XYZ orthogonal coordinate system. In terms of the XYZ orthogonal coordinate system, an X axis and a Y axis are set parallel to a wafer W while a Z axis is set in the orthogonal direction to the wafer W. In the XYZ orthogonal coordinate system in the drawing, an XY plane is actually set to a parallel plane to a horizontal plane while the Z axis is set in the vertical direction. Moreover, in the description concerning FIG. 30, constituents of this embodiment which are identical to those in the projection exposure apparatus of Embodiment 1 are designated by the same reference numerals.

In this projection exposure apparatus, a transmissive optical element 32 at the bottom end of a lens barrel 3A of the projection optical system PLA includes a tip portion 32A, which is reduced into a rectangle having a longitudinal edge in the Y direction (a non-scanning direction) while leaving only a necessary part for scanning exposure. At the time of scanning exposure, part of a pattern image of a reticle (not shown) is projected on a rectangular exposure region immediately below the tip portion 32A on the wafer W side. When the reticle (not shown) travels in the −X direction (or in the +X direction) at a speed V, the wafer W travels in the +X direction (or in the −X direction) by use of the XY stage 10 at a speed of β·V (β denotes the projection magnitude) synchronously, with respect to the projection optical system PLA. Then, after completing exposure on one shot region, the next shot region moves to a scanning start position by moving the wafer W stepwise. Thereafter, the respective shot regions are sequentially subjected to exposure in accordance with the step-and-scan method.

This embodiment applies the transmissive optical element 32 which is similar to the transmissive element 4 (see FIG. 2) used in Embodiment 1. Specifically, the base material of the transmissive optical element 32 is made of calcium fluoride, and crystal orientation of the film forming surface of the calcium fluoride element is defined as the (111) plane. Moreover, the magnesium fluoride ($MgF_2$) film F1 and the silicon dioxide ($SiO_2$) film F2 collectively serving as the anti-dissolution film are formed at the tip portion 32A on the wafer W side of the transmissive optical element 32, or the portion where the exposure light passes through, by use of the vacuum vapor deposition method. In addition, the silicon dioxide ($SiO_2$) film F3 is formed thereon by use of the wet film forming method.

Meanwhile, the tantalum (Ta) film F5 (F4) serving as the metal anti-dissolution film (which also functions as the adhesion reinforcing film) is formed on a tapered surface 32B of the transmissive optical element 32, or a portion where the exposure light does not pass through, by use of the sputtering method. In addition, the silicon dioxide ($SiO_2$) film F6 serving as the protective film for the metal anti-dissolution film (the protective film for the anti-dissolution film) for protecting the metal anti-dissolution film is formed on the surface of the metal anti-dissolution film (the anti-dissolution film) F5 by the wet film forming method simultaneously with formation of the silicon dioxide ($SiO_2$) film F3. Here, the metal anti-dissolution film (the anti-dissolution film) F5 to be formed on the tapered surface 32B of the transmissive optical element 32 has solubility to pure water equal to or below 2 ppt and packing density equal to or above 95%. Moreover, mean reflectance of the anti-dissolution films F1 to F3 formed on the tip portion 32A of the transmissive optical element 32 is equal to or below 2% when an exit angle of the exposure light beam is set to 50 degrees.

The liquid immersion method is also applied to this Embodiment 17 as similar to Embodiment 1. Accordingly, a liquid 7 fills the space between the transmissive optical element 32 and the surface of the wafer W in the course of scanning exposure. Pure water is used as the liquid 7. Moreover, supply and recovery of the liquid 7 are performed by use of the liquid supply device 5 and the liquid recovery device 6, respectively.

Figure 31:
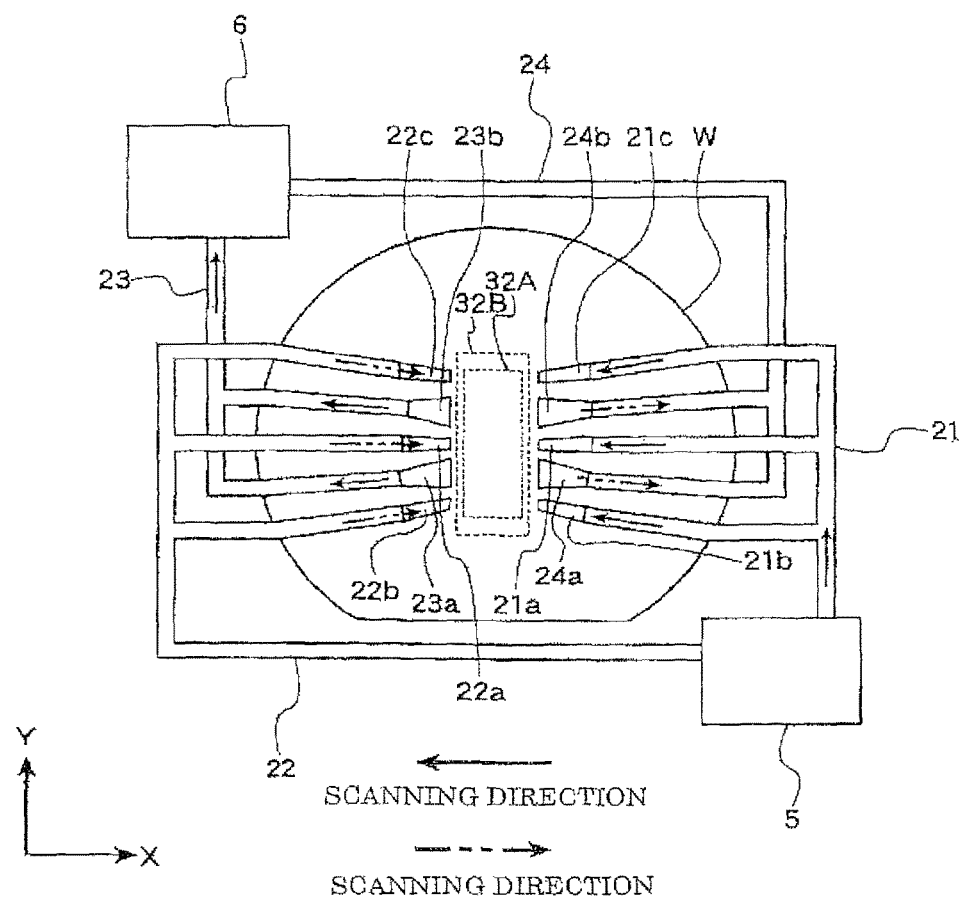
FIG. 31 is a view showing positional relations among a tip portion of the optical element, and exhaust nozzles as well as intake nozzles in an X direction in terms of a projection optical system shown in FIG. 30.

FIG. 31 is a view showing positional relations among the surface (the tip portion 32A and the tapered surface 32B on the wafer W side) of the transmissive optical element 32 in the projection optical system PLA, and exhaust nozzles as well as intake nozzles configured to supply and recover the liquid 7 in the X direction. As shown in FIG. 31, three exhaust nozzles 21a to 21c located on the +X side of the tip portion 32A and the tapered surface 32B, which have the elongated rectangular shapes in the Y direction, are connected to the liquid supply device 5 through the supply tube 21. Moreover, three exhaust nozzles 22a to 22c located on the −X side of the tip portion 32A and the tapered surface 32B are connected to the liquid supply device 5 through the supply tube 22. Meanwhile, as shown in FIG. 31, two intake nozzles 23a and 23b located on the −X side of the tip portion 32A and the tapered surface 32B are connected to the liquid recovery device 6 through the recovery tube 23, and two intake nozzles 24a and 24b located on the +X side of the tip portion 32A and the tapered surface 32B are connected to the liquid recovery device 6 through the recovery tube 24.

When the wafer W is moved in a scanning direction (the −X direction) of an arrow indicated with a solid line for performing the scanning exposure, the liquid supply device 5 supplies the liquid 7 to the space between the tip portion 32A as well as the tapered surface 32B of the transmissive optical element 32 and the wafer W through the supply tube 21 and the exhaust nozzles 21a to 21c. The liquid recovery device 6 recovers the liquid 7, which is supplied from the liquid supply device 5 to the space between the tip portion 32A as well as the tapered surface 32B and the wafer W, through the recovery tube 23 and the intake nozzles 23a and 23b. In this case, the liquid 7 flows on the wafer W in the −X direction, whereby the space between the transmissive optical element 32 and the wafer W is filled with the liquid 7.

On the other hand, when the wafer W is moved in a direction (the +X direction) of an arrow indicated with a chain double-dashed line for performing the scanning exposure, the liquid supply device 5 supplies the liquid 7 to the space between the tip portion 32A of the transmissive optical element 32 and the wafer W through the supply tube 22 and the exhaust nozzles 22a to 22c. The liquid recovery device 6 recovers the liquid 7, which is supplied from the liquid supply device 5 to the space between the tip portion 32A and the wafer W, through the recovery tube 24 and the intake nozzles 24a and 24b. In this case, the liquid 7 flows on the wafer W in the +X direction, whereby the space between the transmissive optical element 32 and the wafer W is filled with the liquid 7.

In the meantime, the amount of supply Vi (m$^3$/s) and the amount of recovery Vo (m$^3$/s) of the liquid 7 are calculated by the following formula 2.

$$Vi=Vo=DSY\cdot v\cdot d \quad \text{(Formula 2)}$$

Here, DSY denotes the length (m) of the tip portion 32A of the optical element 32 in the X direction. Since DSY is preset, the liquid 7 always fills the space between the optical element 32 and the wafer W stably in the course of scanning exposure by calculating and adjusting the amount of supply Vi (m$^3$/s) and the amount of recovery Vo (m$^3$/s) of the liquid 7 based on the formula 2.

Meanwhile, when the wafer W is moved stepwise in the Y direction, the liquid 7 is supplied and recovered along the Y direction in accordance with the same method as that of Embodiment 1.

Figure 32:
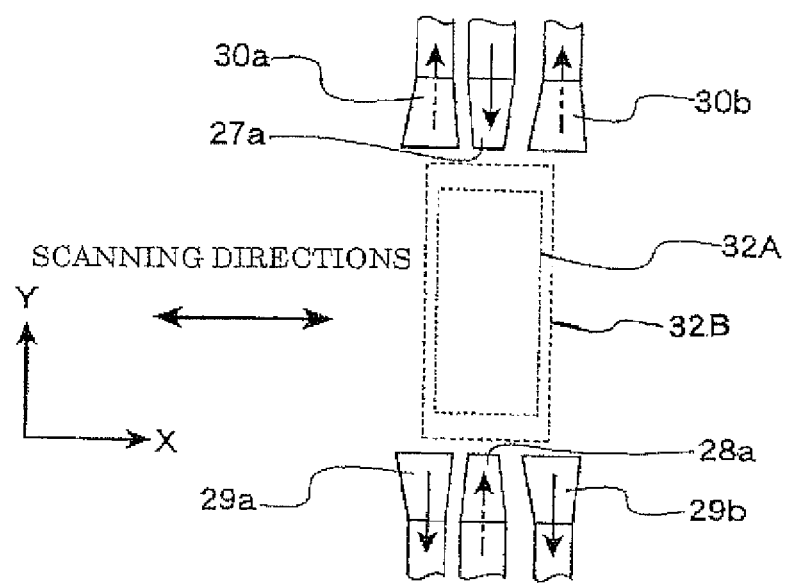
FIG. 32 is a view showing positional relations among the tip portion of the optical element, and exhaust nozzles as well as intake nozzles in a Y direction in terms of the projection optical system shown in FIG. 30.

FIG. 32 is a view showing positional relations among the tip portion 32A of the transmissive optical element 32 in the projection optical system PLA, and exhaust nozzles as well as intake nozzles in the Y direction. As shown in FIG. 32, when the wafer W is moved stepwise in the non-scanning direction (the −Y direction) orthogonal to the scanning direction, the liquid 7 is supplied and recovered by use of an exhaust nozzle 27a and intake nozzles 29a and 29b which are arranged in the Y direction. On the other hand, when the wafer W is moved stepwise in the +Y direction, the liquid 7 is supplied and recovered by use of an exhaust nozzle 28a and intake nozzles 30a and 30b which are arranged in the Y direction. In this case, the amount of supply Vi (m$^3$/s) and the amount of recovery Vo (m$^3$/s) of the liquid 7 are calculated by the following formula 3.

$$Vi=Vo=DSX\cdot v\cdot d \quad \text{(Formula 3)}$$

Here, DSX denotes the length (m) of the tip portion 32A of the optical element 32 in the Y direction. As similar to Embodiment 1, the liquid 7 continuously fills the space between the optical element 32 and the wafer W, even in the course of stepwise movement in the X direction, by adjusting the amount of supply of the liquid 7 in response to the traveling speed v of the wafer W.

The projection exposure apparatus of this Embodiment 17 exerts similar operations and effects to that of Embodiment 1.

Specifically, it is possible to prevent dissolution of the optical element in the first place because the anti-dissolution film is formed on the surface of the optical element. Therefore, the optical element is prevented from dissolving in the liquid filling the space between the tip portion of the projection optical system and the substrate. As a result, it is not necessary to replace the optical element frequently and it is possible to maintain high throughput of the exposure apparatus. Moreover, it is not necessary to stop operations of the exposure apparatus in order to replace the corroded optical element, and it is thereby possible to manufacture end products efficiently. In addition, the optical element does not dissolve in the liquid and it is thereby possible to maintain the optical performance of the projection optical system. Hence it is possible to stabilize the quality of the manufactured end products and to continue exposure in the optimal condition.

Moreover, according to the projection exposure apparatus of this Embodiment 17, the metal anti-dissolution film that also functions as the adhesion reinforcing film is formed on the tapered surface 32B of the transmissive optical element 32 on the wafer W side of the projection optical system PLA. Therefore, it is possible to attach the metal anti-dissolution film closely to the transmissive optical element 32. Meanwhile, since the silicon dioxide (SiO$_2$) film is formed on the surface of the metal anti-dissolution film, it is possible to prevent damage on the soft metal anti-dissolution film having low abrasion resistance and thereby to protect the metal anti-dissolution film. Therefore, it is possible to prevent infiltration to and corrosion of the transmissive optical element 32 by the liquid 7 interposed between the surface of the wafer W and the projection optical system PLA, and thereby to maintain the optical performance of the projection optical system PLA. Moreover, it is possible to maintain the performance of the exposure apparatus because the transmissive optical element 32 does not dissolve in the liquid 7. In addition, it is not necessary to replace the transmissive optical element 32 frequently. Therefore, it is possible to maintain high throughput of the projection exposure apparatus.

Embodiments 18 to 31

Projection exposure apparatuses of Embodiments 18 to 31 are configured as similar to Embodiment 17 except that the transmissive optical elements 4 used in Embodiments 2 to 15 are respectively applied as the transmissive optical elements 32.

The projection exposure apparatuses of Embodiments 18 to 31, which respectively have the above-described configuration, exert similar operations and effects to those of Embodiments 2 to 15, respectively.

Embodiment 32

A projection exposure apparatus is configured as similar to Embodiment 17 except applying an optical element with which an optical member optically contacts through a film as described below. Note that the projection exposure apparatus of Embodiment 32 is configured to perform exposure in accordance with the step-and-scan method by partially modifying the projection exposure apparatus of Embodiment 16. Accordingly, constituents common to those in Embodiment 16 will be designated by the same reference numerals and duplicate explanations will be omitted herein.

In the projection exposure apparatus of Embodiment 32 shown in FIG. 30, the transmissive optical element 32, which protrudes from the bottom end of the lens barrel 3A of the projection optical system PLA includes a tip portion 32B, is reduced into a rectangle having a longitudinal edge in the Y direction (a non-scanning direction) while leaving only a necessary part for scanning exposure. At the time of scanning exposure, part of a pattern image of a reticle (not shown) is projected on a rectangular exposure region immediately below the tip portion 32B. When the reticle (not shown) travels in the −X direction (or in the +X direction) at the speed V, the wafer W travels in the +X direction (or in the −X direction) by use of the XY stage 10 at the speed of β·V (β denotes the projection magnitude) synchronously, with regard to the projection optical system PLA. Then, after completing exposure on one shot region, the next shot region moves to a scanning start position by moving the wafer W stepwise. Thereafter, the respective shot regions are sequentially subjected to exposure in accordance with the step-and-scan method.

The liquid immersion method is also applied to this Embodiment 32 as similar to Embodiment 16. Accordingly, the liquid 7 fills the space between the lower surface of the optical element 32 and the surface of the wafer W in the course of scanning exposure. Here, as similar to Embodiment 16, the optical element 32 includes the substrate member 201 made of calcium fluoride and the optical member 202 made of silica (See FIG. 25). Moreover, the thin coating film 203 made of silicon dioxide ($SiO_2$) is uniformly deposited on the substrate member 201 of the optical element 32 to achieve firm optical contact. In this way, it is possible to protect the substrate member 201 made of calcium fluoride against the liquid 7, and thereby to enhance durability of the optical element 32 and eventually durability of the projection optical system PLA.

FIG. 31 is a view showing positional relations among exhaust nozzles and intake nozzles configured to supply and recover the liquid to and from the space immediately below the projection optical system PLA. Three exhaust nozzles 21a to 21c located on the +X side of the tip portion 32A are connected to the liquid supply device 5 through the supply tube 21. Moreover, three exhaust nozzles 22a to 22c located on the −X side of the tip portion 32A are connected to the liquid supply device 5 through the supply tube 22. Meanwhile, two intake nozzles 23a and 23b located on the −X side of the tip portion 32A are connected to the liquid recovery device 6 through the recovery tube 23, and two intake nozzles 24a and 24b located on the +X side of the tip portion 32A are connected to the liquid recovery device 6 through the recovery tube 24.

When the wafer W is moved in the scanning direction (the −X direction) of the arrow indicated with the solid line for performing the scanning exposure, the liquid supply device 5 supplies the liquid 7 to the space between the tip portion 32A of the optical element 32 and the wafer W through the supply tube 21 and the exhaust nozzles 21a to 21c. The liquid recovery device 6 recovers the liquid 7 retained in the space between the tip portion 32A and the wafer W through the recovery tube 23 and the intake nozzles 23a and 23b. In this case, the liquid 7 flows on the wafer W in the −X direction, whereby the space between the optical element 32 and the wafer W is constantly filled with the liquid 7.

On the other hand, when the wafer W is moved in the direction (the +X direction) of the arrow indicated with the chain double-dashed line for performing the scanning exposure, the liquid supply device 5 supplies the liquid 7 to the space between the tip portion 32A of the optical element 32 and the wafer W through the supply tube 22 and the exhaust nozzles 22a to 22c. The liquid recovery device 6 recovers the liquid 7 retained in the space between the tip portion 32A and the wafer W through the recovery tube 24 and the intake nozzles 24a and 24b. In this case, the liquid 7 flows on the wafer W in the +X direction, whereby the space between the optical element 32 and the wafer W is constantly filled with the liquid 7.

Here, the layout and other features of the exhaust nozzles and the intake nozzles, which are used for circulating the liquid 7 in the space between the optical element 32 and the wafer W, when moving the wafer W in the ±Y directions are substantially similar to those in Embodiment 16.

The scanning projection exposure apparatus of Embodiment 32 applies the projection optical system PLA incorporating the optical element 32 having high optical transmittance, which system is obtained by firmly joining the optical element 32 to the optical member 202 by the excellent optical contact. In this way, it is possible to perform the exposure process of the liquid immersion type which can maintain the high performance over a long period of time.

Embodiment 33

Figure 33:
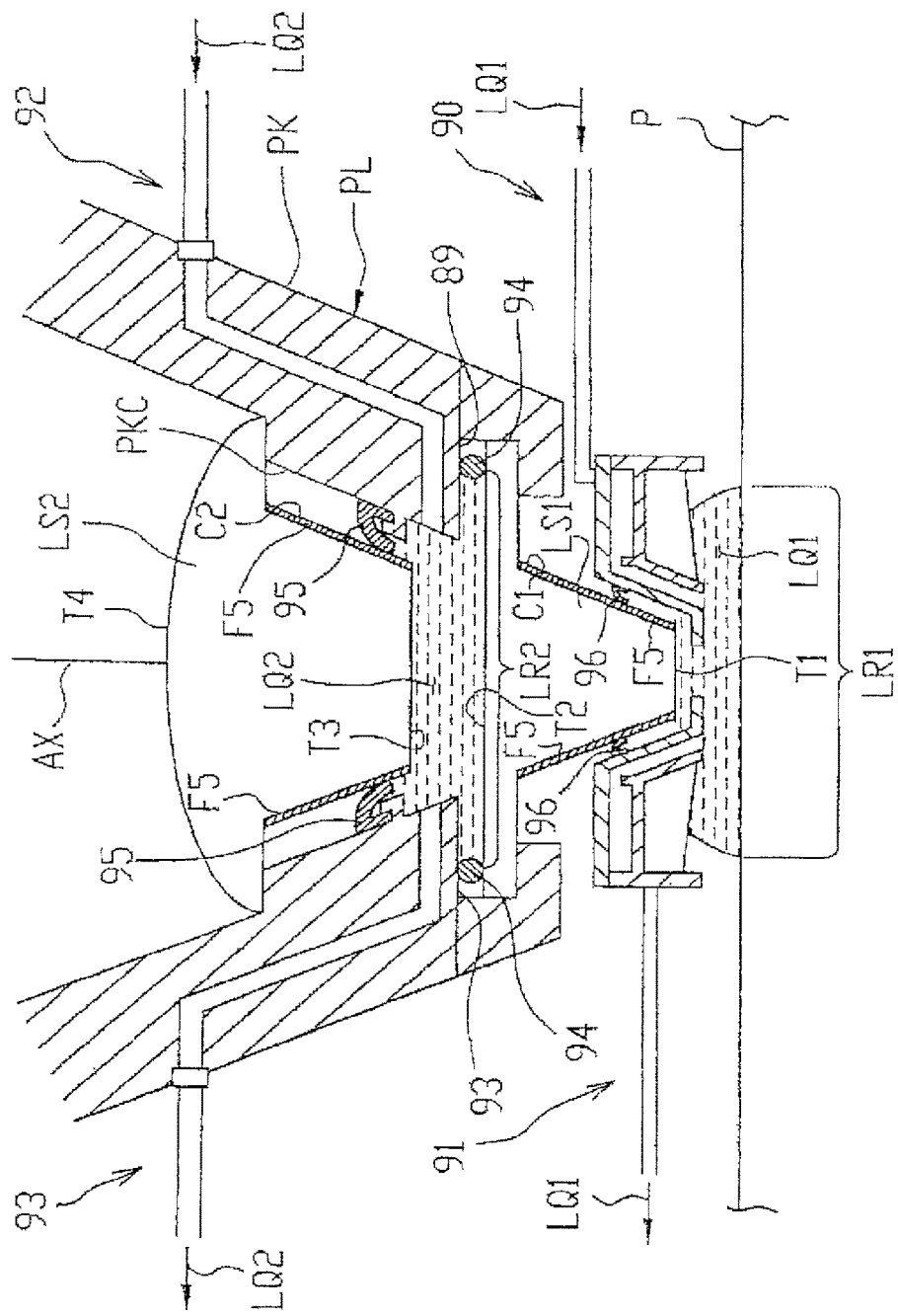
FIG. 33 is a view showing a schematic configuration of an exposure apparatus according to Embodiment 33.

An exposure apparatus according to Embodiment 33 will be described with reference to the accompanying drawings. The exposure apparatus of this embodiment is a liquid immersion type exposure apparatus adopting the liquid immersion method in order to improve resolution and to virtually widen a depth of focus by virtually shortening an exposure wavelength. FIG. 33 is a view showing a first optical element LS1 located closest to an image plane of a projection optical system PL, a second optical element LS2 located second closest to the imaging surface of the projection optical system PL after the first optical element LS1, and the like out of multiple optical elements made of calcium fluoride which collectively constitute the projection optical system PL of the exposure apparatus of this embodiment. As illustrated by FIG. 33, the first optical element LS1 has a body, a protruding; part and a reentrant profile, the reentrant profile being directed inwardly and formed with at least a surface of the body and a side surface of the protruding part.

This exposure apparatus includes a first liquid immersion mechanism for filling a space between a lower surface T1 of the first optical element LS1, which is the closest optical element to the image plane of the projection optical system PL among the multiple optical elements constituting the projection optical system PL, and a substrate P with a first liquid LQ1. The substrate P is provided on the image plane side of the projection optical system PL, and the lower surface T1 of the first optical element LS1 is disposed opposite to a surface of the substrate P. The first liquid immersion mechanism includes a first liquid supply mechanism 90 for supplying the first liquid LQ1 to the space between the lower surface T1 of the first optical element LS1 and the substrate P, and a first liquid recovery mechanism 91 for recovering the first liquid LQ1 supplied from the first liquid supply mechanism 90.

Moreover, this exposure apparatus includes a second liquid immersion mechanism for filling a space between the first optical element LS1 and the second optical element LS2, which is the second closest optical element to the image plane of the projection optical system PL, with a second liquid LQ2. The second optical element LS2 is disposed above the first optical element LS1. The upper surface T2 of the first optical element LS1 is disposed opposite to the lower surface T3 of the second optical element LS2. The second liquid immersion mechanism includes a second liquid supply mechanism 92 for supplying the second liquid LQ2 to the space between the first optical element LS1 and the second optical element LS2, and a second liquid recovery mechanism 93 for recovering the second liquid LQ2 supplied from the second liquid supply mechanism 92.

A lens barrel PK includes a counter surface 89 which faces a peripheral region of the upper surface T2 of the first optical element LS1. Moreover, a first sealing member 94 is provided between the peripheral region of the upper surface T2 and the counter surface 89. The first sealing member 94 is formed of an O-ring (such as "Kalrez" made by DuPont-Dow) or a C-ring, for example. The first sealing member 94 prevents leakage of the second liquid LQ2 located on the upper surface T2 to the outside of the upper surface T2, or to the outside of the lens barrel PK. Meanwhile, a second sealing member 95 is provided between a side surface C2 of the second optical element LS2 and an inner side surface PKC of the lens barrel PK. The second sealing member 95 is formed of a V-ring, for example. The second sealing member 95 regulates circulation of the second liquid LQ2, damp gas derived from the second liquid LQ2, and the like to an upper part of the second optical element LS2 inside the lens barrel PK.

Moreover, a third sealing member 96 is provided between a side surface C1 of the first optical element LS1 and the inner side surface PKC of the lens barrel PK. The third sealing member 96 is formed of a V-ring, for example. The third sealing member 96 regulates circulation of the first liquid LQ1, damp gas derived from the first liquid LQ1, and the like to an upper part of the first optical element LS1 inside the lens barrel PK.

A light-shielding film made of gold (Au) is formed in a thickness of 150 nm on each of the side surface (a tapered surface) C1 of the first optical element LS1 and the side surface (a tapered surface) C2 of the second optical element LS2. Therefore, by using these light-shielding films, it is possible to prevent irradiation of the exposure light beam and reflection of the exposure light beam by the wafer onto the first sealing member 94, the second sealing member 95, and the third sealing member 96 which are provided in the periphery of the tapered surfaces of the transmissive optical element on the substrate's side of the projection optical system. In this way, it is possible to prevent deterioration of the sealing members.

In the above-described Embodiment 33, the light-shielding film which is the metal film made of gold (Au) is formed on each of the side surface (the tapered surface) C1 of the first optical element LS1 and the side surface (the tapered surface) C2 of the second optical element LS2. Instead, the light-shielding film formed as the metal film may be formed of at least one of gold (Au), platinum (Pt), silver (Ag), nickel (Ni), tantalum (Ta), tungsten (W), palladium (Pd), molybdenum (Mo), titanium (Ti), and chromium (Cr). Alternatively, it is also possible to form the light-shielding film as a metal oxide film. In this case, the metal oxide film may be formed of at least one of zirconium dioxide ($ZrO_2$), hafnium dioxide ($HfO_2$), titanium dioxide ($TiO_2$), tantalum pentoxide ($Ta_2O_5$), silicon monoxide (SiO), and chromium oxide ($Cr_2O_3$).

The above-described Embodiments 1 to 33 apply the exposure apparatus configured to fill the space between the projection optical system PL and the substrate P locally with the liquid. However, the present invention is also applicable to a liquid immersion exposure apparatus disclosed in Japanese Patent Application Laid-Open Gazette No. Hei 6-124873 (JP 6-124873 A), which apparatus is configured to move a stage that retains a substrate subject to exposure in a liquid tank, or to a liquid immersion exposure apparatus disclosed in Japanese Patent Application Laid-Open Gazette No. Hei 10-303114 (JP 10-303114 A), which apparatus is configured to have a liquid tank having a predetermined depth, the tank being formed on a stage, and to retain a substrate inside the tank.

Moreover, the present invention is also applicable to a twin-stage type exposure apparatus including two stages configured to locate process target substrates such as wafers individually and to move the substrates independently in XY directions. Such a twin-stage type exposure apparatus is disclosed in Japanese Patent Application Laid-Open Gazette No. Hei 10-163099 (JP 10-163099 A), Japanese Patent Application Laid-Open Gazette No. Hei 10-214783 (JP 10-214783 A), International Application National-Phase Publication No. 2000-505958 (JP 2000-505958 A), and the like.

In addition to the above explanations, other configurations applicable to the exposure apparatus of the present invention are disclosed in International Publication No. WO2004/019128 (WO 2004-019128 A), International Publication No. WO2004/053950 (WO 2004-053950 A), and International Publication No. WO2004/053951 (WO 2004-053951 A); the entire contents of which are incorporated herein by reference.

EXAMPLES

The present invention will be described more in detail below based on examples and comparative examples. It is to be noted, however, that the present invention will not be limited only to the following examples.

Example 1

Figure 34:
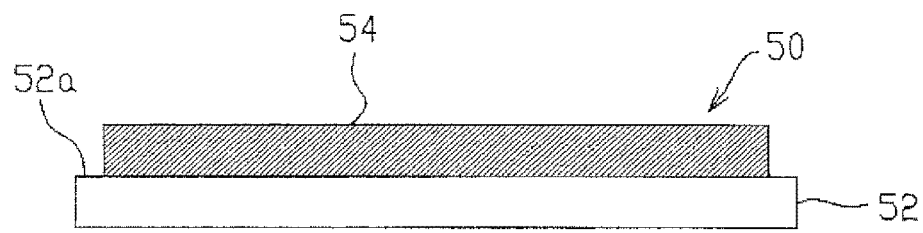
FIG. 34 is a view showing a configuration of an optical element according to Example 1.
Figure 35:
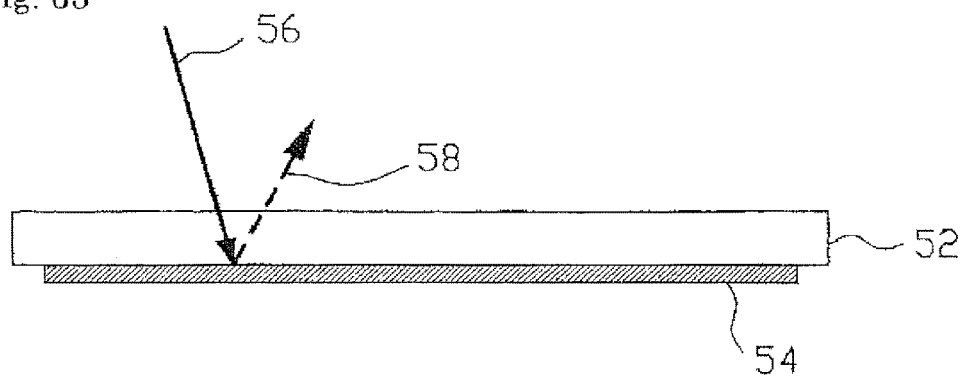
FIG. 35 is a view showing an aspect of reflection when light is incident on calcium fluoride.
Figure 36:
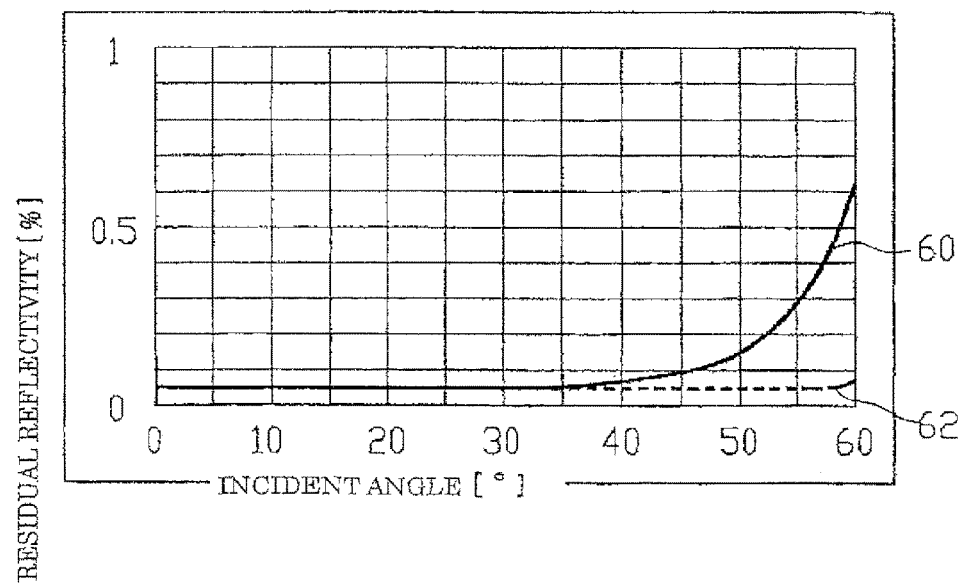
FIG. 36 is a graph showing residual reflectivity of calcium fluoride when the light is incident on a calcium fluoride substrate.

FIG. 34 is a view showing a configuration of an optical element 50 of the present invention. As shown in FIG. 34, the optical element 50 was formed by depositing silicon oxide 54 in an optical film thickness of $0.55\lambda$, ($\lambda=193$ nm) on a substrate of calcium fluoride 52, of which a crystal orientation of a film forming surface 52a is defined as a (111) plane, as an anti-dissolution film for the calcium fluoride 52 by use of the RF sputtering method. Here, as shown in FIG. 35, the optical film thickness of the silicon oxide film must be restricted so as to suppress a ghost phenomenon caused by residual reflection of light on a surface of the substrate of the calcium fluoride 52 when the light is incident on the calcium fluoride 52 along the direction of an arrow 56 indicated with a solid line and is reflected by the calcium fluoride 52 along the direction of an arrow 58 indicated with a dashed line. Specifically, FIG. 36 is a graph showing residual reflectivity of the calcium fluoride when the light is incident on the calcium fluoride substrate. The residual reflectivity of the calcium fluoride in the case of not forming the silicon oxide film on the calcium fluoride substrate is indicated with a solid line 60 in FIG. 36. Meanwhile, the residual reflectivity of the calcium fluoride in the case of forming the silicon oxide film on the calcium fluoride substrate is indicated with a dashed line 62 in FIG. 36. As shown in FIG. 36, the optical film thickness of the silicon oxide film is set such that the residual reflectivity of the calcium fluoride becomes equal to or below 0.5% when an incident angle of the light incident on the calcium fluoride is equal to 60 degrees.

Figure 37:
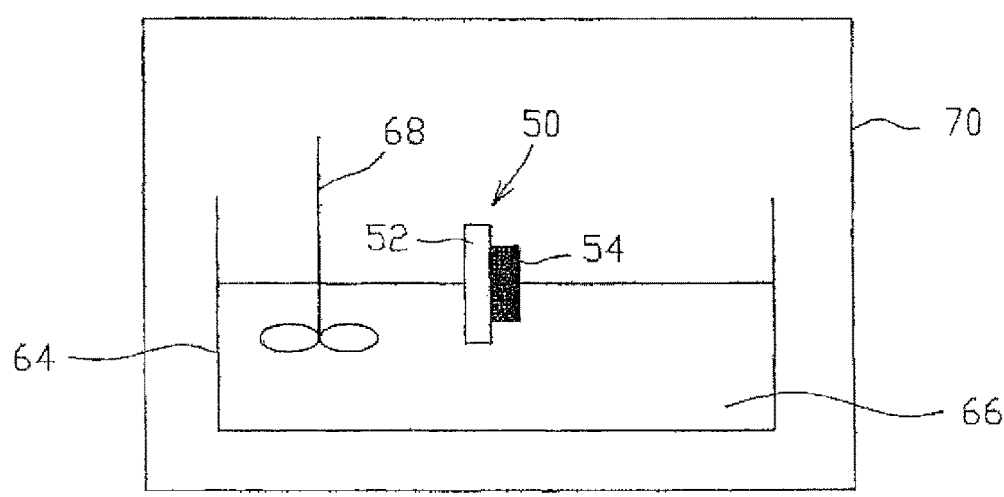
FIG. 37 is a view showing a configuration of an experimental device used in Example 1.

An experiment was performed by use of the optical element 50. FIG. 37 is a view showing a configuration of an experimental device used in this example. Pure water 66 at the temperature of 70° C. is put into a tank 64 made of polyether ether ketone (PEEK) which is large enough for the volume of the optical element 50. A beater 68 made of Teflon (registered trademark) is put into the pure water 66. As shown in FIG. 37, the optical element 50 is put into the pure water 66 so that only the half of the optical element 50 is soaked in the pure water 66. The tank 64 containing the optical element 50, the pure water 66, and the beater 68 is put into a constant-temperature tank 70 to maintain a constant temperature.

The tank 64 used herein has a sufficiently large size relative to the volume of the optical element 50 to reduce a liquid level change attributable to evaporation of the pure water 66. Moreover, the beater 68 is used for maintaining constant solubility even when the optical element 50 dissolves in the pure water 66 and thereby generates a buffer solution. After a lapse of 3 hours while the optical element 50 was soaked in the pure water 66, a step between the portion of the optical element 50 not soaked in the pure water 66 and the portion of the optical element 50 soaked in the pure water 66 was measured with a step-measurement gauge having resolving power of 0.5 nm. No step was observed.

Example 2

Figure 38:
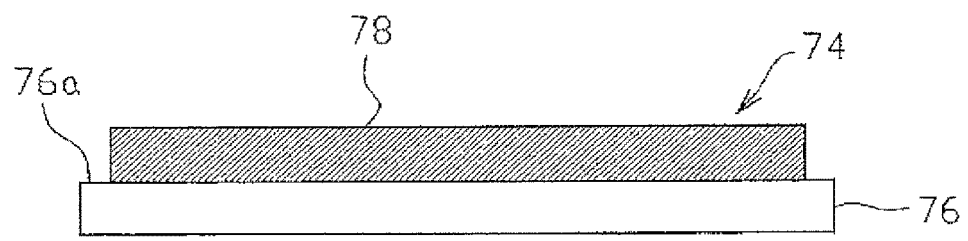
FIG. 38 is a view showing a configuration of an optical element according to Example 2.

FIG. 38 is a view showing a configuration of an optical element 74 of the present invention. As shown in FIG. 38, the optical element 74 was formed by depositing lanthanum fluoride 78 in an optical film thickness of 0.68λ (λ=193 nm) on a substrate of calcium fluoride 76, of which a crystal orientation of a film forming surface 76a is defined as a (111) plane, as an anti-dissolution film for the calcium fluoride 76 by use of the vacuum vapor deposition method. It has been known that the lanthanum fluoride 78 on the (111) plane of the calcium fluoride 76 reflects the crystal orientation of the calcium fluoride 76 and thereby heteroepitaxially grows on the (111) plane (see WO 03/009015). Therefore, the deposited lanthanum fluoride 78 forms a very dense crystal structure with very few defects.

An experiment was performed by use of the optical element 74. The configuration of an experimental device used in this example is the same as the configuration of the experimental device used in Example 1 shown in FIG. 37. Accordingly, the same constituents will be designated by the same reference numerals used in Example 1, in the following description.

First, the pure water 66 at the temperature of 70° C. is put into the tank 64 which is large enough for the volume of the optical element 74, and a beater 68 is put into pure water 66. The optical element 74 is put into the pure water 66 so that only the half of the optical element 74 is soaked in the pure water 66. The tank 64 containing the optical element 74, the pure water 66, and the beater 68 was put into the constant-temperature tank 70 to maintain a constant temperature. After a lapse of 3 hours while the optical element 74 was soaked in the pure water 66, a step between the portion of the optical element 74 not soaked in the pure water 66 and the portion of the optical element 74 soaked in the pure water 66 is measured with the step-measurement gauge having the resolving power of 0.5 nm. No step was observed.

In this example, the vacuum vapor deposition method was used as the film forming method for the anti-dissolution film in order to form the anti-dissolution film having the dense structure. However, it is also possible to form the anti-dissolution film by use of the sputtering method or the CVD method.

Comparative Example 1

Figure 39:
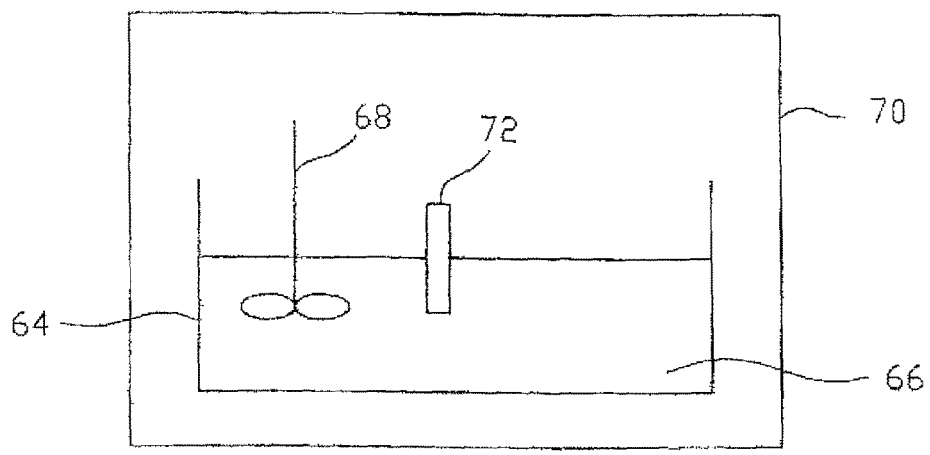
FIG. 39 is a view showing a configuration of an experimental device used in Comparative Example 1.

An experiment was performed in terms of a calcium fluoride substrate without an anti-dissolution film. FIG. 39 is a view showing a configuration of an experimental device used in this comparative example. In this comparative example, a calcium fluoride substrate 72 is used instead of the optical element 50 of Example 1. Other features of the experimental device for this comparative example are the same as the configuration of the experimental device used in Example 1. Accordingly, the same constituents will be designated by the same reference numerals in Example 1, in the following description.

First, the pure water 66 at the temperature of 70° C. is put into the tank 64 which is large enough for the volume of the calcium fluoride substrate 72, and a beater 68 is put into pure water 66. The calcium fluoride substrate 72 is put into the pure water 66 so that only the half of the calcium fluoride substrate 72 is soaked in the pure water 66. The tank 64 containing the calcium fluoride substrate 72, the pure water 66, and the beater 68 is put into the constant-temperature tank 70 to maintain a constant temperature. After a lapse of 3 hours while soaking the calcium fluoride substrate 72 in the pure water 66, a step between the portion of the calcium fluoride substrate 72 not soaked in the pure water 66 and the portion of the calcium fluoride substrate 72 soaked in the pure water 66 was measured with the step-measurement gauge having the resolving power of 0.5 nm. A step of 50 nm was observed due to dissolution of the portion of the calcium fluoride substrate 72 soaked in the pure water 66.

Figure 40:
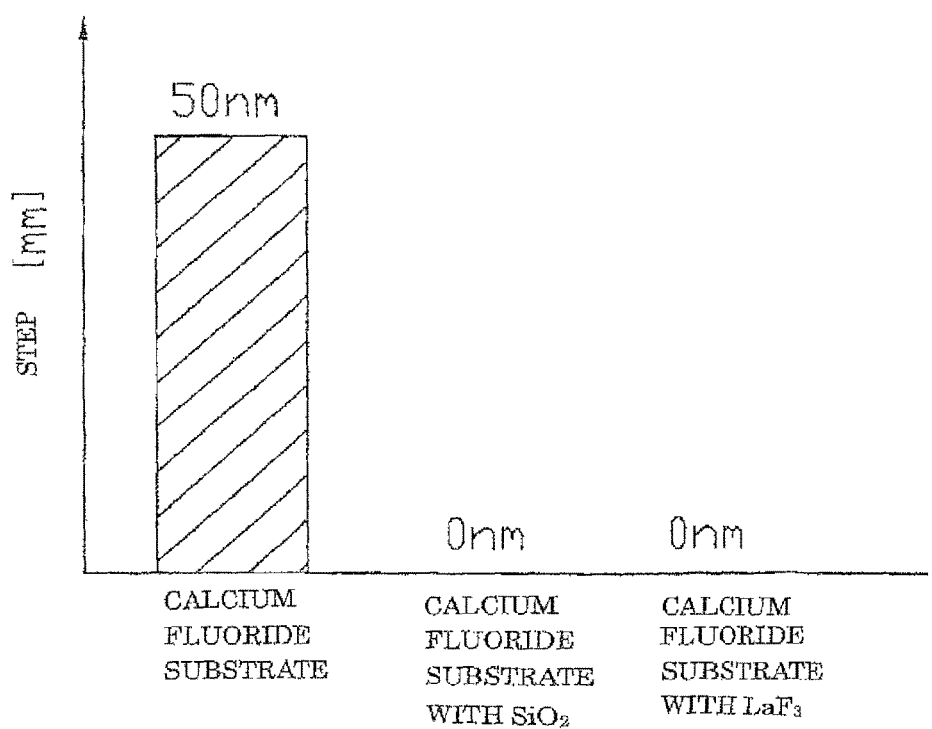
FIG. 40 is a graph showing results of measurement of steps measured after the experiments of the optical elements of Comparative Example 1, Example 1, and Example 2.

According to the optical elements of Example 1 and Example 2, it is possible to reduce the solubility to pure water at least 1/50 times as small as that of the optical element of Comparative Example 1. FIG. 40 is a graph showing results of measurement of steps measured after the experiments of the optical elements of Comparative Example 1, Example 1, and Example 2, which are measured with the step-measurement gauge. As shown in FIG. 40, the calcium fluoride including the anti-dissolution film made of the silicon oxide or the lanthanum fluoride does not dissolve in the pure water. Accordingly, no step is generated. Therefore, it is possible to maintain a transmission wavefront of the projection optical system in the projection exposure apparatus when this optical element is embedded in the liquid contact portion of the projection exposure apparatus applying the liquid immersion method.

Example 3

Figure 41:
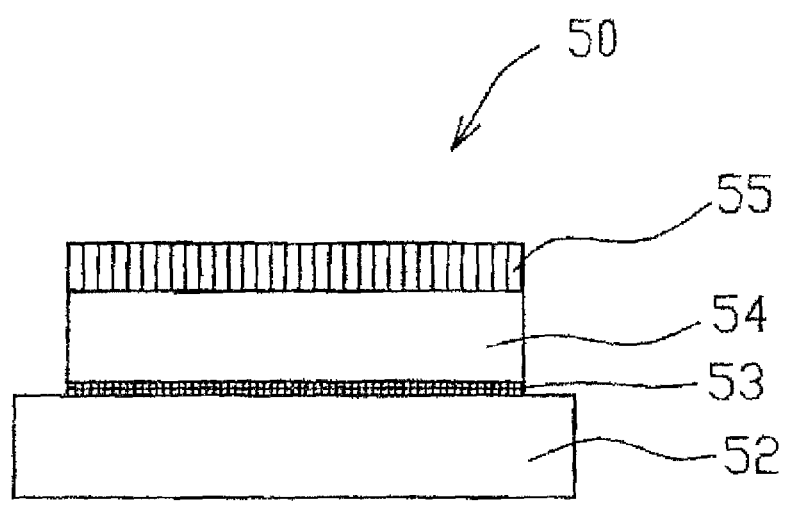
FIG. 41 is a view showing a configuration of a transmissive optical element according to Example 3.

FIG. 41 is a view showing a configuration of a transmissive optical element 50 of the Example 3. As shown in FIG. 41, an adhesion reinforcing film 53 is formed by depositing tantalum (Ta) in a thickness of 10 nm on a substrate of calcium fluoride 52 by use of the sputtering method. The adhesion reinforcing film 53 has a function to improve adhesion between the calcium fluoride 52 and a metal film 54 to be formed on a surface of the adhesion reinforcing layer 53. Here, the film thickness required for increasing adhesion is equal to or above 10 nm. However, an effect of adhesion can be achieved by the film thickness in a range from 3 to 5 nm.

Next, the metal film 54 made of gold (Au), which film functions as the anti-dissolution film for preventing dissolution in water, is formed in a thickness of 200 nm on the surface of the adhesion reinforcing film 53 by use of the sputtering method.

Here, density of the metal film 54 can be determined by a critical angle in X-ray diffraction. When the film is formed by the sputtering method, packing density of the metal film 54 is equal to or above 97%. Meanwhile, solubility of the metal film 54 to water is equal to or below 1 ppt when the film is formed by the sputtering method.

Next, a silicon dioxide ($SiO_2$) film 55, which functions as the protective film for the anti-dissolution film for improving mechanical strength of the metal film 54, is formed in a thickness of 50 nm on the surface of the metal film 54 by use of the sputtering method.

Figure 42:
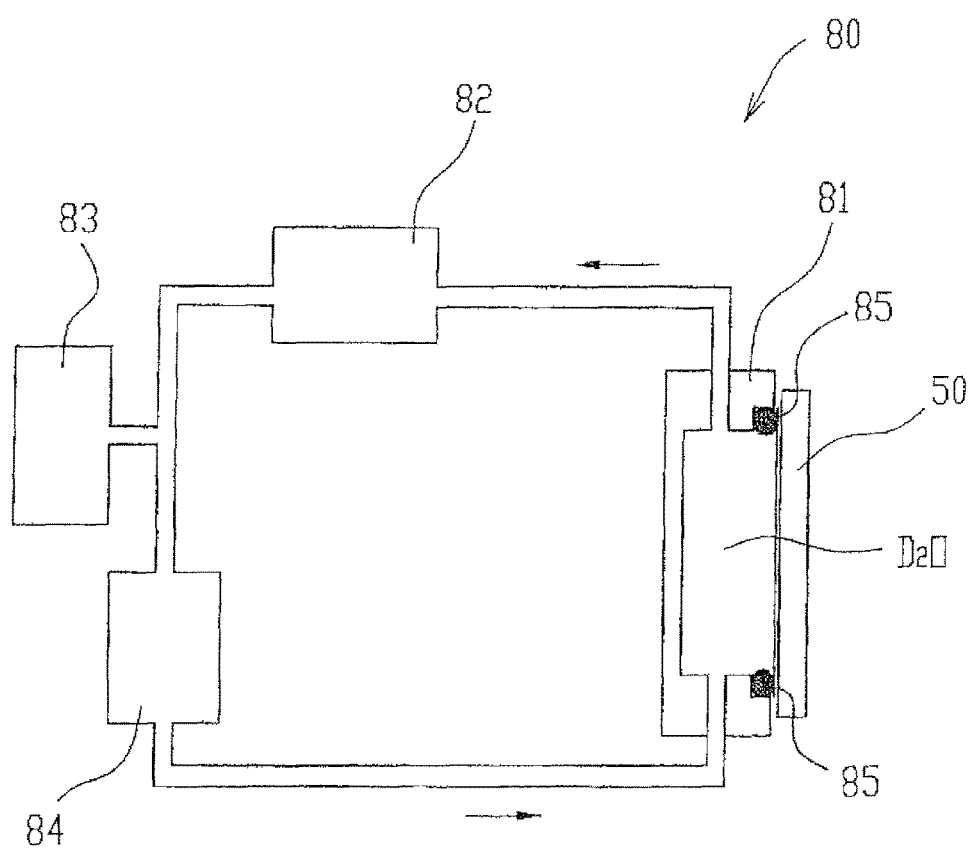
FIG. 42 is a view showing a configuration of a tester according to Example 3.

An experiment was performed by use of the transmissive optical element 50. FIG. 42 is a view showing a configuration of a tester 80 used in this example. As shown in FIG. 42, the tester 80 includes a sample holder 81, a circulation pump 82, a deuterated water supply device 83, and a buffer tank 84. One surface of the sample holder 81 is open, and an O-ring 85 is provided on the open surface. The surface of the transmissive optical element 50 where the adhesion reinforcing film 53, the metal film 54, and the silicon dioxide ($SiO_2$) film 55 are formed on is attached to the open surface of the sample holder 81 and is sealed with the O-ring 85. Deuterated water is supplied from the deuterated water supply device 83 by use of the circulation pump 82 and is allowed to flow inside the sample holder 81 through the buffer tank 84. Here, the buffer tank 84 is provided in order to prevent transmission of vibrations of the circulation pump 82 to the sample holder 81. Moreover, by supplying deuterated water ($D_2O$) instead of pure water ($H_2O$), it is possible to measure an amount of deuterated water infiltrating the surface of the transmissive optical element 50 in the depth direction after a water resistance test.

A thirty-day water resistance test was conducted by use of the tester 80 while setting a traveling speed of deuterated water on the transmissive optical element 50 equal to 50 cm/sec. As a result, the films formed on the surface of the transmissive optical element 50 were not peeled off, and there was no change in the appearance of the transmissive optical element 50. Moreover, as a result of evaluation concerning infiltration of the deuterated water into the surface of the transmissive optical element 50 in the depth direction in accordance with the secondary ion mass spectrometry (SIMS), it was confirmed that the deuterated water did not infiltrate into the metal film 54.

Example 4

Figure 43:
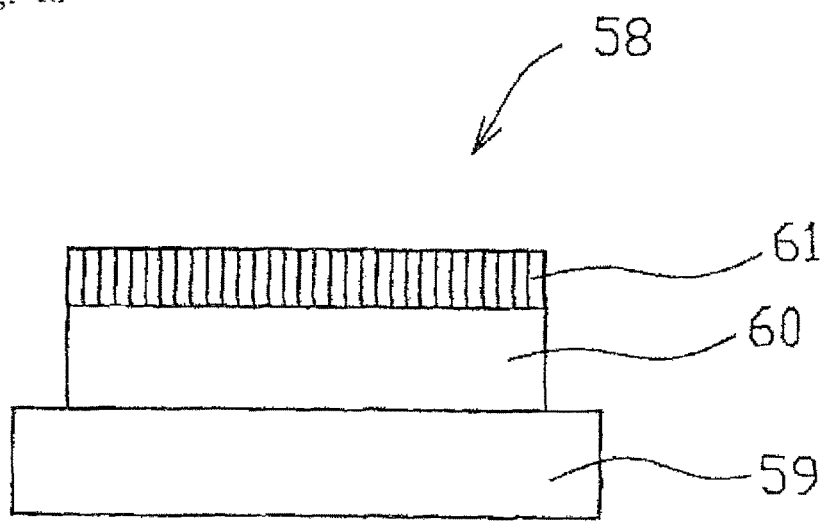
FIG. 43 is a view showing a configuration of a transmissive optical element according to Example 4.

FIG. 43 is a view showing a configuration of a transmissive optical element 58 of the Example 4. As shown in FIG. 43, a metal film 60 made of gold (Au), which functions as the anti-dissolution film for preventing dissolution in water, is formed in a thickness of 200 nm on a surface of a substrate of calcium fluoride 59 by use of the sputtering method. Here, density of the metal film 60 can be determined by a critical angle in X-ray diffraction. When the metal film 60 is formed by the sputtering method, packing density thereof is equal to or above 97%. Meanwhile, solubility of the metal film 60 to water is equal to or below 1 ppt when the film is formed by the sputtering method.

Next, a silicon dioxide ($SiO_2$) film 61, which functions as the protective film for the anti-dissolution film for improving mechanical strength of the metal film 60, is formed in a thickness of 50 nm on the surface of the metal film 60 by use of the sputtering method.

An experiment was performed by use of the transmissive optical element 58. As similar to Example 3, a thirty-day water resistance test was conducted by use of the tester 80 shown in FIG. 42 while setting a traveling speed of deuterated water on the transmissive optical element 58 equal to 50 cm/sec. As a result, the films formed on the surface of the transmissive optical element 58 were not peeled off, and there was no change in the appearance of the transmissive optical element 58. Moreover, as a result of evaluation concerning infiltration of the deuterated water into the surface of the transmissive optical element 58 in the depth direction in accordance with the secondary ion mass spectrometry (SIMS), it was confirmed that the deuterated water did not infiltrate into the metal film 60.

Example 5

Figure 44:
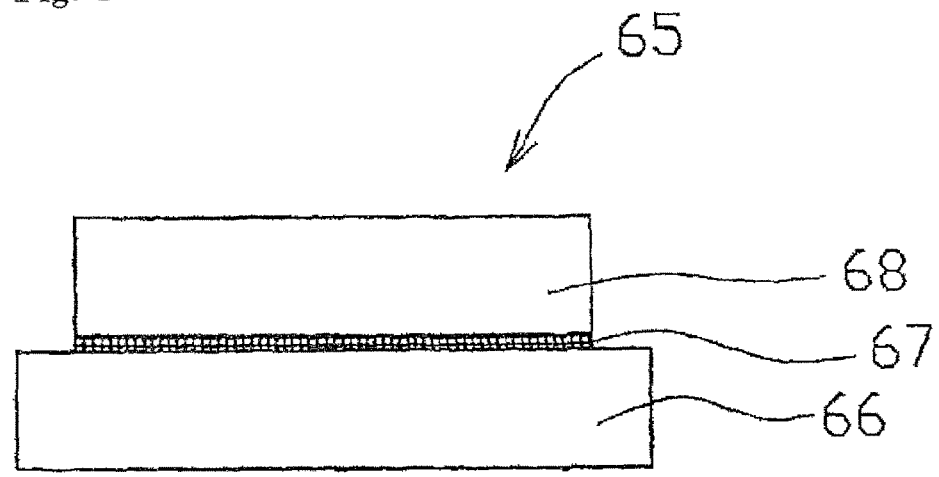
FIG. 44 is a view showing a configuration of a transmissive optical element according to Example 5.

FIG. 44 is a view showing a configuration of a transmissive optical element 65 of the Example 5. As shown in FIG. 44, an adhesion reinforcing film 67 is formed by depositing tantalum (Ta) in a thickness of 10 nm on a substrate of calcium fluoride 66 by use of the sputtering method. The adhesion reinforcing layer 67 has a function to improve adhesion between the calcium fluoride 66 and a metal film 68 to be formed on a surface of the adhesion reinforcing layer 67. Here, the film thickness required for increasing the adhesion is equal to or above 10 nm. However, an effect of adhesion can be achieved by the film thickness in a range from 3 to 5 nm.

Next, the metal film 68 made of gold (Au) functioning as the anti-dissolution film for preventing dissolution in water is formed in a thickness of 200 nm on the surface of the adhesion reinforcing film 67 by use of the sputtering method.

Here, density of the metal film 67 can be determined by a critical angle in X-ray diffraction. When the film is formed by the sputtering method, packing density of the metal film 67 is equal to or above 97%. Meanwhile, solubility of the metal film 67 to water is equal to or below 1 ppt when the film is formed by the sputtering method.

An experiment was performed by use of the transmissive optical element 65. As similar to Example 3, a thirty-day water resistance test was conducted by use of the tester 80 shown in FIG. 42 while a traveling speed of deuterated water on the transmissive optical element 65 was being set equal to 50 cm/sec. As a result, the films formed on the surface of the transmissive optical element 65 were not peeled off, and there was no change in the appearance of the transmissive optical element 65. Moreover, as a result of evaluation concerning infiltration of the deuterated water into the surface of the transmissive optical element 65 in the depth direction in accordance with the secondary ion mass spectrometry (SIMS), it was confirmed that the deuterated water did not infiltrate into the transmissive optical element 65.

Although the sputtering method was used as the film forming method in the respective examples described above, it is also possible to form the adhesion reinforcing film, the metal film, and the protective film for the anti-dissolution film by use of the vacuum vapor deposition method or the CVD method.

Example 6

Figure 45:
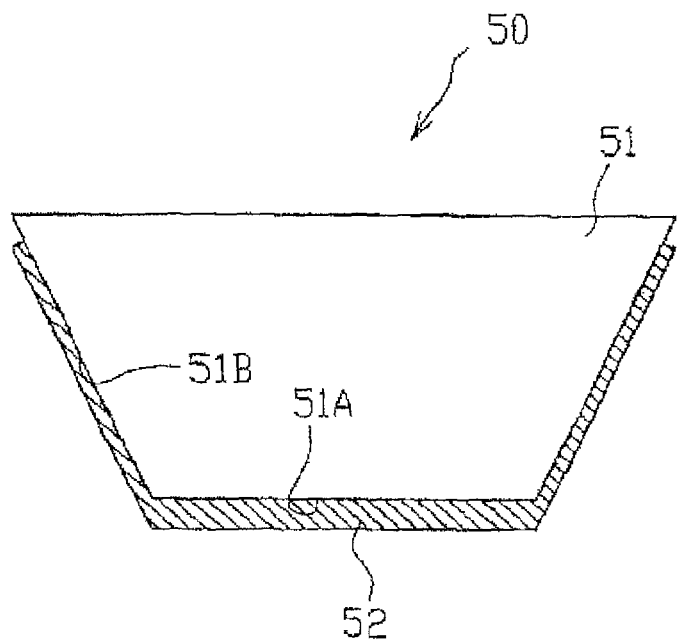
FIG. 45 is a view showing a configuration of an optical element according to Example 6.

FIG. 45 is a view showing a configuration of an optical element 50 of this example. As shown in FIG. 45, an anti-dissolution film 52 made of magnesium fluoride ($MgF_2$) is formed on a surface 51A on a substrate's side of an optical member 51 and on a side surface 51B of the optical member 51 by use of a wet film forming method, or by spray coating in particular. Here, the anti-dissolution film 52 made of magnesium fluoride ($MgF_2$) is formed in an optical film thickness of $0.65\lambda$ ($\lambda=193$ nm) on the surface 51A on the substrate's side of the optical member 51. Here, the wet film forming method means a film forming method including the steps of dispersing a substance intended for forming the film in a certain solvent, coating a film forming surface with the solvent, and drying and removing the solvent after coating. The solvent used herein should only be a solvent that allows uniform dispersion of the intended substance without condensation or precipitation. In particular, a solvent such as alcohol or an organic solvent is used herein.

When forming the magnesium fluoride ($MgF_2$) film by use of the wet film forming method, it is preferable to carryout the following three types of reaction processes.
(i) Hydrofluoric Acid/Magnesium Acetate Method

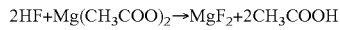
$2HF + Mg(CH_3COO)_2 \rightarrow MgF_2 + 2CH_3COOH$ (ii) Hydrofluoric Acid/Alkoxide Method

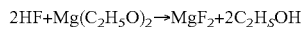
$2HF + Mg(C_2H_5O)_2 \rightarrow MgF_2 + 2C_2H_5OH$ (iii) Trifluoroacetate/Alkoxide Method

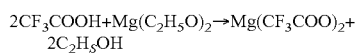
$2CF_3COOH + Mg(C_2H_5O)_2 \rightarrow Mg(CF_3COO)_2 + 2C_2H_5OH$

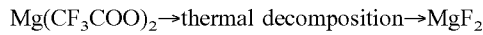
$Mg(CF_3COO)_2 \rightarrow \text{thermal decomposition} \rightarrow MgF_2$ After adjusting a sol solution in these processes, it is preferable to carry out either an organothermal process or a hydrothermal process as a pretreatment. In this case, it is possible to perform any one of or both of pressurization and thermal maturation. Details of the above-described wet film forming methods are disclosed in U.S. Pat. No. 5,835,275 for reference. As for the method of coating the substrate with the sol solution, at least one method is selected from the spin coating method, the dipping method, the meniscus method, the spray coating method, and the printing method. After coating the substrate with the sol solution, the film is formed by heating and removing the organic matter. The surface 51A on the substrate's side and the side surface 51B of the optical member 51 made of calcium fluoride need to be protected by the formed film without leaving any spaces.

The film formed by use of the wet film forming method has considerably low mechanical durability as compared to a film formed by a typical dry film forming method as represented by the vacuum vapor deposition method or the sputtering method. Accordingly, it is necessary to heat and anneal the film to improve the mechanical durability. In particular, when the film is formed on the optical member made of calcium fluoride by use of the wet film forming method, there is a risk of surface deformation attributable to the linear coefficient of expansion of calcium fluoride, or occurrence of cracks on calcium fluoride in an extreme case if the annealing process is conducted by rapidly increasing the temperature. To avoid such a trouble, it is essential to raise the temperature at a low rate.

Although magnesium fluoride ($MgF_2$) is used for the anti-dissolution film in this example, the present invention is not limited to the foregoing. It is by all means possible to use silicon oxide ($SiO_2$) formed by the wet film forming method instead.

Example 7

Figure 46:
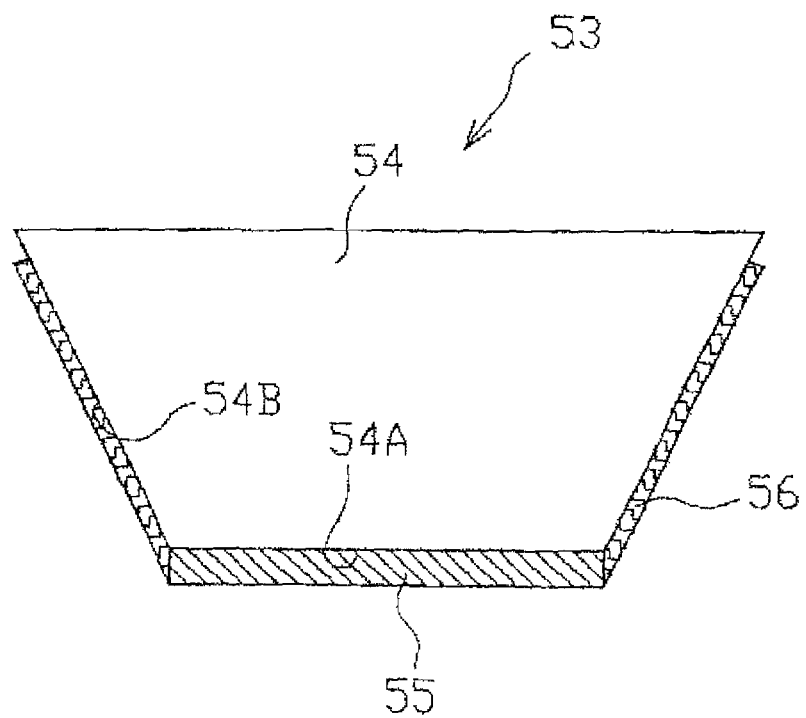
FIG. 46 is a view showing a configuration of an optical element according to Example 7.

FIG. 46 is a view showing a configuration of an optical element 53 of this example. As shown in FIG. 46, an anti-dissolution film 55 made of silicon oxide ($SiO_2$) is formed on a surface 54A on a substrate's side of an optical member 54 in an optical film thickness of $0.65\lambda$ ($\lambda=193$ nm) by use of the ion beam sputtering method. Thereafter, a heated sided surface 54B of the optical member 54 is coated with an alkyl ketene dimmer (AKD) solution. When the liquid alkyl ketene dimmer is crystallized, the alkyl ketene dimmer is formed into a fractal structure that includes small irregular shapes inside other irregular shapes. In this way, the alkyl ketene dimmer is formed into a superhydrophobic film having a contact angle equal to or above 160 degrees.

This phenomenon is understood by the fact that the following extended Young's formula holds true assuming that $\theta_f$ is a contact angle when a substance having a contact angle $\theta$ is formed into a fractal structure having the surface area that is r times greater.

$$\cos\theta_f = \frac{r(\gamma_S - \gamma_{SL})}{\gamma_L} = r\cos\theta \qquad \text{(Formula)}$$

Here, $\gamma_S$ denotes surface tension of a solid, $\gamma_L$ denotes surface tension of a liquid, and $\gamma_{SL}$ denotes interfacial tension between the solid and the liquid. As shown in this formula, the contact angle becomes greater when cos θ is positive (θ>90°). In other words, the film is a more liquid repellent. On the contrary, the contact angle becomes smaller when cos θ is negative (θ<90°). In other words, the film is more wettable to the liquid.

Although alkyl ketene dimmer having the fractal structure is used for the anti-dissolution film on the side surface, it is also possible to obtain a similar anti-dissolution effect on the side surface by use of other typical water repellent processes such as a water repellent process applying a silane coupling agent (1H,2H,2H,2H-perfluorooctyltrichlorosilane). Alternatively, it is also possible to apply a water repellent process using a typical electroless plating method.

Results of verification of the optical elements of Example 6 and Example 7 will be described below.

Figure 47:
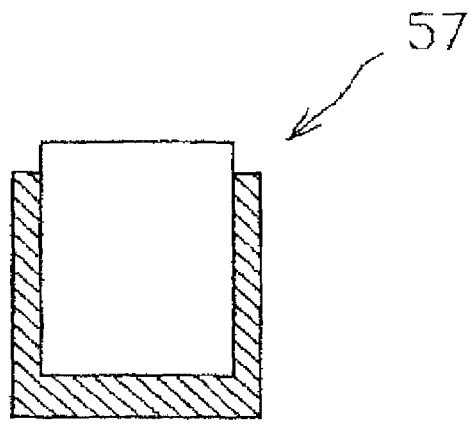
FIG. 47 is a view showing a configuration of a sample 1 used in Example 6.

Magnesium fluoride ($MgF_2$) is formed on a bottom surface of a rectangular solid calcium fluoride optical element as shown in FIG. 47 as the anti-dissolution film by use of the wet film forming method, or by spray coating in particular. Then, magnesium fluoride ($MgF_2$) is formed on a side surface of the calcium fluoride optical element as the anti-dissolution film by use of the wet film forming method, or by spray coating in particular. The anti-dissolution film identical to the anti-dissolution film of Example 6 is formed on an optical element 57 shown in FIG. 47. This optical element shown in FIG. 47 is defined as a sample 1.

Figure 48:
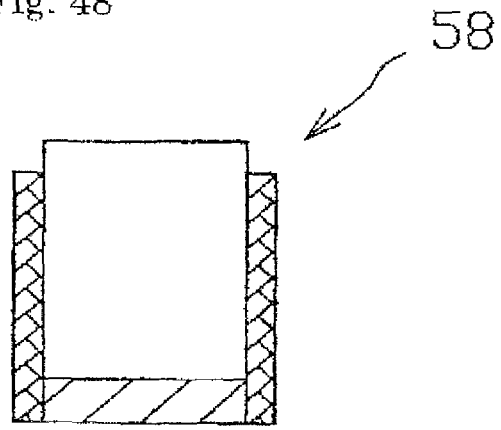
FIG. 48 is a view showing a configuration of a sample 2 used in Example 7.

Silicon dioxide ($SiO_2$) is formed on a bottom surface of a rectangular solid calcium fluoride optical element as shown in FIG. 48 as the anti-dissolution film by use of the ion beam sputtering method. Then, the alkyl ketene dimmer solution is coated and dried on a side surface of the calcium fluoride optical element as the anti-dissolution film. The anti-dissolution film identical to the anti-dissolution film of Example 7 is formed on an optical element 58 shown in FIG. 48. This optical element shown in FIG. 48 is defined as a sample 2.

Figure 49:
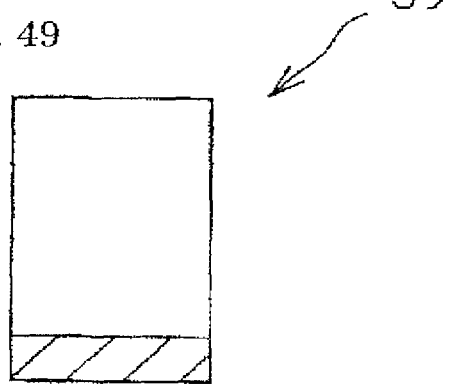
FIG. 49 is a view showing a configuration of a sample 3 used in Reference Example 1.

Magnesium fluoride ($MgF_2$) is formed on a bottom surface of a rectangular solid calcium fluoride optical element as shown in FIG. 49 as the anti-dissolution film by use of the wet film forming method, or by spray coating in particular. A side surface thereof is uncoated. This optical element 59 shown in FIG. 49 is defined as a sample 3 (Reference Example 1).

Figure 50:
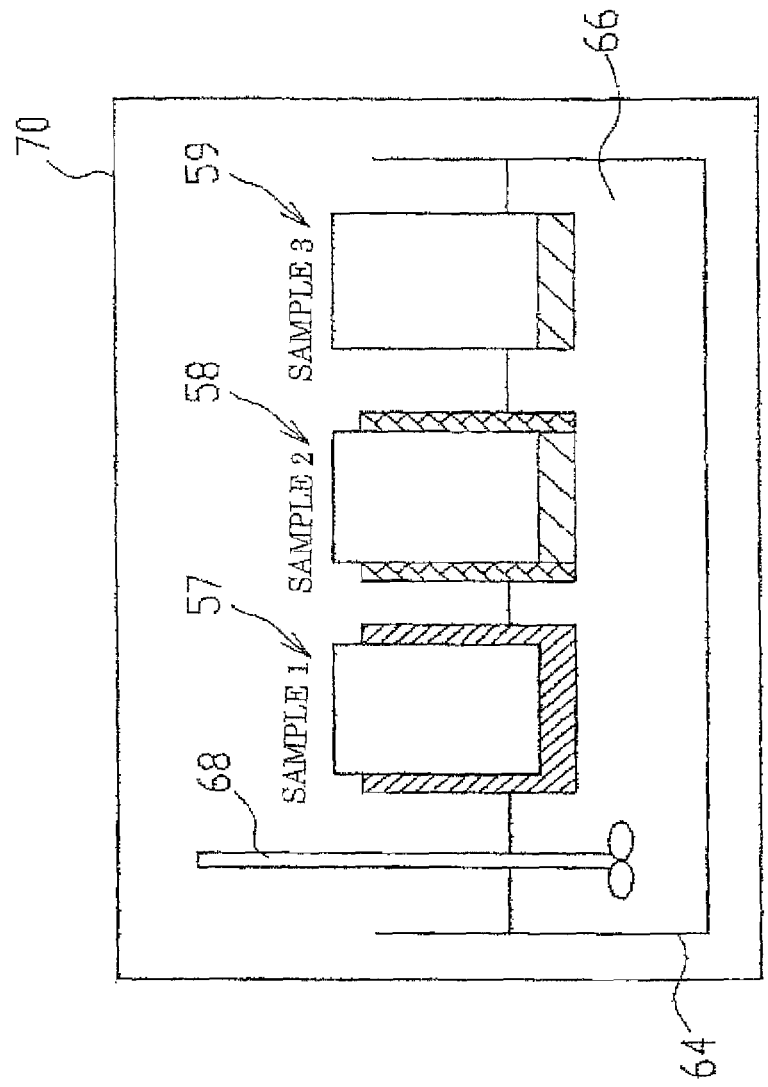
FIG. 50 is a view showing an experimental device used in Examples 6 and 7 and Reference Example 1.

The following experiment was performed by use of the samples 1, 2, and 3. FIG. 50 is a view showing a configuration of an experimental device. Pure water 66 at the temperature of 70° C. is put into a tank 64 made of polyether ether ketone (PEEK) which is large enough for the volumes of the optical elements 57, 58, and 59. A beater 68 made of Teflon (registered trademark) is put into the pure water 66. As shown in FIG. 50, the optical elements 57, 58, and 59 are put into the pure water 66 so that only the bottom surfaces of the optical elements 57, 58, and 59 are soaked in the pure water 66. The tank 64 containing the optical elements 57, 58, and 59, the pure water 66, and the beater 68 is put into a constant-temperature tank 70 to maintain a constant temperature.

The tank 64 used herein has a sufficiently large size relative to the volumes of the optical elements 57, 58, and 59 to reduce a liquid level change attributable to evaporation of the pure water 66. Moreover, the beater 68 is used for maintaining constant solubility even when the optical elements 57, 58, and 59 dissolve in the pure water 66 and thereby generate a buffer solution. After a lapse of 3 hours while soaking the optical elements 57, 58, and 59 in the pure water 66, steps between the bottom surfaces and the side surfaces respectively of the optical elements 57, 58, and 59 were measured with a step-measurement gauge having resolving power of 0.5 nm.

Figure 51:
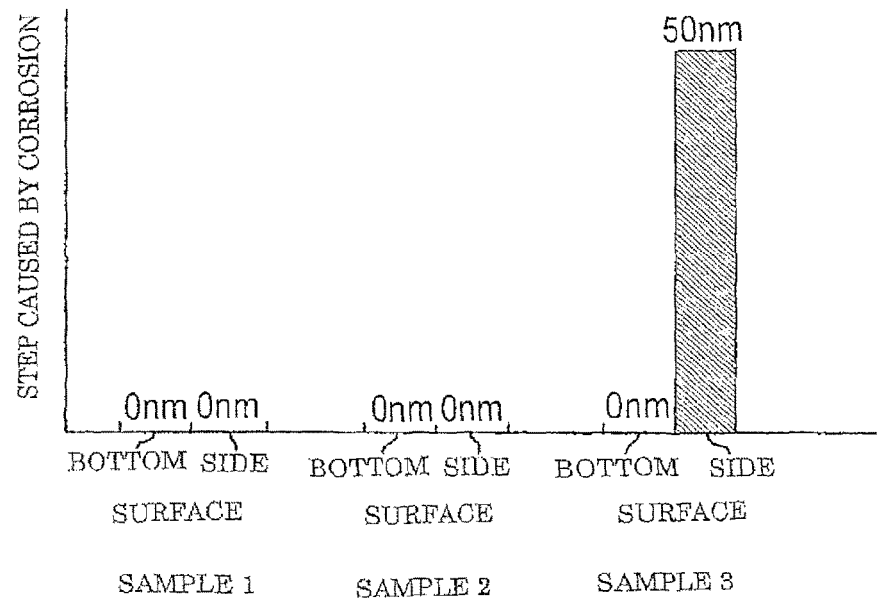
FIG. 51 is a graph showing results of experiments in Examples 6 and 7 and Reference Example 1.
Figure 52:
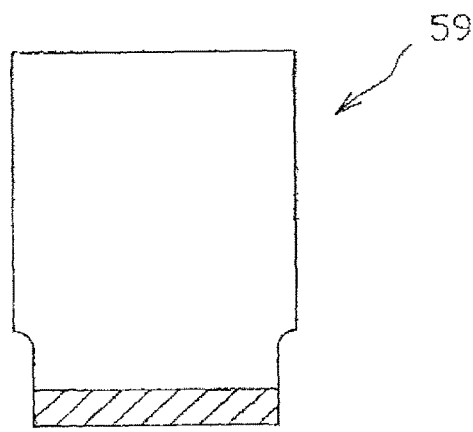
FIG. 52 is a view showing the state of the sample 3 after the experiment.

As shown in FIG. 51, the bottom surfaces and the side surfaces of the optical element 57 (the sample 1) and the optical element 58 (the sample 2) did not dissolve at all. On the contrary, in terms of the optical element 59 (the sample 3), the side surface was corroded in an amount of about 50 nm. Although the central part of the bottom surface of the optical element 59 (the sample 3) did not change. However, as shown in FIG. 52, the anti-dissolution film in the periphery of the bottom surface was partially destroyed due to the corrosion on the side surface.

Example 8

Figure 53:
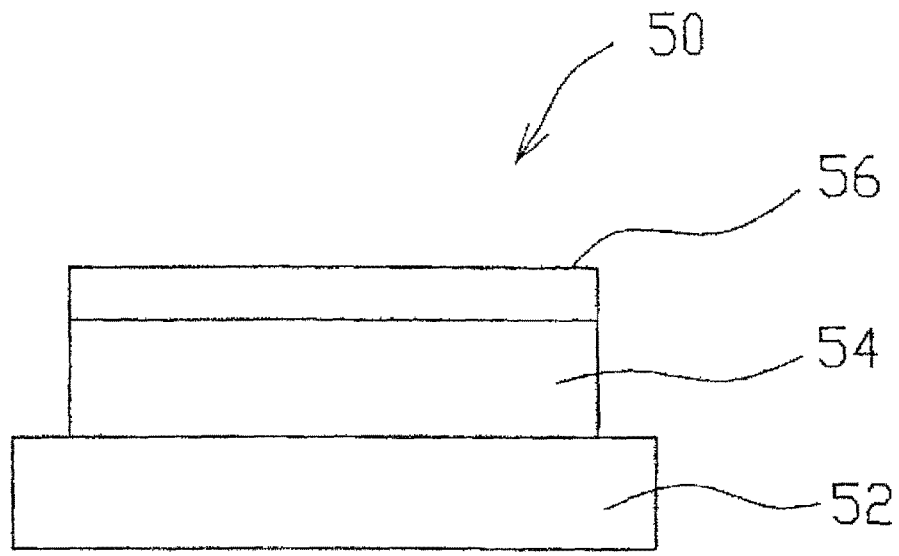
FIG. 53 is a view showing a configuration of a transmissive optical element according to Example 8.

FIG. 53 is a view showing a configuration of a transmissive optical element 50 of Example 8. As shown in FIG. 53, a silicon dioxide ($SiO_2$) film 54 is formed in a thickness of 200 nm on a surface of a substrate of calcium fluoride 52 by use of the sputtering method.

Next, a silicon dioxide ($SiO_2$) film 56 is formed in a thickness of 50 nm by use of the wet film forming method, or by spin coating in particular, on a surface of the silicon dioxide ($SiO_2$) film 54, which is formed on the surface of the substrate of calcium fluoride 52 by use of the sputtering method. Specifically, the surface is coated with a commercially available sol-gel silica solution for wet film forming at a rotating speed of the substrate in a range from 1000 to 2000 revolutions per minute. Here, the film thickness of the silicon dioxide ($SiO_2$) film 56 to be formed by the wet film forming method depends on the concentration and viscosity of the sol-gel silica solution for wet film forming, the rotating speed of the substrate in the spin coating process, the temperature, humidity, and the like. Accordingly, it is essential to produce an analytical curve concerning the film thickness of the silicon dioxide ($SiO_2$) film 56 relative to the concentration and the viscosity of the sol-gel silica solution for wet film forming by use of the concentration and the viscosity of the sol-gel silica solution for wet film forming as parameters. Meanwhile, the film thickness of the silicon dioxide ($SiO_2$) film 56 formed by the wet film forming method is set to 50 nm in order to minimize tensile stress on the film. When the film thickness of the silicon dioxide ($SiO_2$) film 56 is set equal to or above 150 nm, it is necessary to pay attention because cracks may be generated on the film due to stress relaxation.

Next, the silicon dioxide ($SiO_2$) film 56 is subjected to an annealing process in the air at the temperature of 160° C. for two hours to evaporate alcohol, which is a main solvent of the sol-gel silica solution for wet film forming, and to sinter the silicon dioxide ($SiO_2$) film 56 formed by the wet film forming method. The annealing process is performed on the silicon dioxide ($SiO_2$) film 56 in the air and the entire substrate of calcium fluoride 52 is evenly heated. Accordingly, no damage or variation in the shape of the surface occurs.

An experiment was performed by use of the transmissive optical element 50 with the tester 80 shown in FIG. 42. As shown in FIG. 42, the tester 80 includes the sample holder 81, the circulation pump 82, the deuterated water supply device 83, and the buffer tank 84. One surface of the sample holder 81 is open, and the O-ring 85 is provided on the open surface. The surface of the transmissive optical element 50 where the silicon dioxide ($SiO_2$) films 54 and 56 are formed on is attached to the open surface of the sample holder 81 and is sealed with the O-ring 85. Deuterated water is supplied from the deuterated water supply device 83 by use of the circulation pump 82 and is allowed to flow inside the sample holder 81 through the buffer tank 84. Here, the buffer tank 84 is provided in order to prevent transmission of vibrations of the circulation pump 82 to the sample holder 81. Moreover, by supplying deuterated water ($D_2O$) instead of pure water ($H_2O$), it is possible to measure an amount of deuterated water infiltrating the surface of the transmissive optical element 50 in the depth direction after a water resistance test.

A thirty-day water resistance test was conducted by use of the tester 80 while a traveling speed of deuterated water on the transmissive optical element 50 was being set equal to 50 cm/sec. As a result, the films formed on the surface of the transmissive optical element 50 were not peeled off, and there was no change in the appearance of the transmissive optical element 50. Moreover, as a result of evaluation concerning infiltration of the deuterated water into the surface of the transmissive optical element 50 in the depth direction in accordance with the secondary ion mass spectrometry (SIMS), it was confirmed that the deuterated water did not infiltrate into the silicon oxide films.

The sputtering method is used as the dry film forming method in Example 8. Instead, it is possible to form the film for preventing dissolution of the transmissive optical element by use of the vacuum vapor deposition method or the CVD method.

Example 9

Next, a transmissive optical element of Embodiment 9 will be described. A magnesium fluoride ($MgF_2$) film is formed in a thickness of 70 nm on a heated calcium fluoride substrate by use of the vacuum vapor deposition method. Here, when heating calcium fluoride to form the magnesium fluoride ($MgF_2$) film in a vacuum, the entire calcium fluoride substrate should be evenly heated in order to avoid damage or variation in the shape of the surface attributable to a thermal impact on the calcium fluoride substrate having a high thermal expansion coefficient. Moreover, when heating or cooling the calcium fluoride substrate, it is necessary to perform heating or cooling at a low rate.

Subsequently, a silicon dioxide ($SiO_2$) film is formed in a thickness of 50 nm by use of the wet film forming method, or by spin coating in particular, on a surface of the magnesium fluoride ($MgF_2$) film, which is formed on the surface of the substrate of calcium fluoride by use of the vacuum vapor deposition method. Specifically, the surface is coated with a commercially available sol-gel silica solution for wet film forming at a rotating speed of the substrate in a range from 1000 to 2000 revolutions per minute. Here, the film thickness of the silicon dioxide ($SiO_2$) film to be formed by the wet film forming method depends on the concentration and viscosity of the sol-gel silica solution for wet film forming, the rotating speed of the substrate in the spin coating process, the temperature, humidity, and the like. Accordingly, it is essential to produce the analytical curve concerning the film thickness of the silicon dioxide ($SiO_2$) film relative to the concentration and the viscosity of the sol-gel silica solution for wet film forming by use of the concentration and the viscosity of the sol-gel silica solution for wet film forming as parameters. Meanwhile, the film thickness of the silicon dioxide ($SiO_2$) film formed by the wet film forming method is set to 50 nm in order to minimize tensile stress on the film. When the film thickness of the silicon dioxide ($SiO_2$) film is set equal to or above 150 nm, it is necessary to pay attention because cracks may be generated on the film due to stress relaxation.

Next, the silicon dioxide ($SiO_2$) film is subjected to the annealing process in the air at the temperature of 160° C. for two hours to evaporate alcohol, which is the main solvent of the sol-gel silica solution for wet film forming, and to sinter the silicon dioxide ($SiO_2$) film formed by the wet film forming method. The annealing process is performed in the air and the entire substrate of calcium fluoride is evenly heated. Accordingly, no damage or variation in the shape of the surface occurs.

An experiment was performed by use of the transmissive optical element of Example 9. As similar to Example 8, a thirty-day water resistance test was conducted by use of the tester 80 shown in FIG. 42 while setting a traveling speed of deuterated water on the transmissive optical element of Example 9 equal to 50 cm/sec. As a result, the films formed on the surface of the transmissive optical element were not peeled off, and there was no change in the appearance of the transmissive optical element. Moreover, as a result of evaluation concerning infiltration of the deuterated water into the surface of the transmissive optical element in the depth direction in accordance with the secondary ion mass spectrometry (SIMS), it was confirmed that the deuterated water did not infiltrate into the silicon oxide film.

The vacuum vapor deposition method was used as the dry film forming method in Example 9. Instead, it is possible to form the film for preventing dissolution of the transmissive optical element by use of the sputtering method or the CVD method.

Example 10

Figure 54:
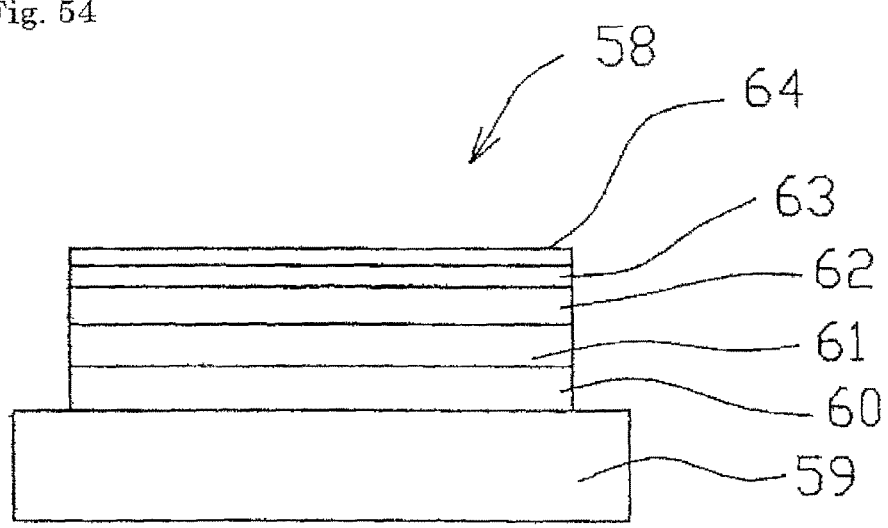
FIG. 54 is a view showing a configuration of a transmissive optical element according to Example 10.

FIG. 54 is a view showing a configuration of a transmissive optical element 58 of Example 10, which has an anti-reflection effect at a central wavelength of 193.4 nm. As shown in FIG. 54, a lanthanum fluoride ($LaF_3$) film 60 as a first layer, a magnesium fluoride ($MgF_2$) film 61 as a second layer, and a lanthanum fluoride ($LaF_3$) film 62 as a third layer are formed on a substrate made of calcium fluoride ($CaF_2$) 59 heated by resistance heating in accordance with the vacuum vapor deposition method. Subsequently, a silicon dioxide ($SiO_2$) film 63 as a first film constituting part of a fourth layer is formed in an optical thickness of $0.08\lambda$ by electron gun heating in accordance with the vacuum vapor deposition method. Then, the calcium fluoride 59 including the first layer to part of the fourth layer is taken out of a vacuum chamber. Thereafter, a silicon dioxide ($SiO_2$) film 64 as a second film constituting part of the fourth layer is formed in an optical thickness of $0.04\lambda$ by the wet film forming method, or by spin coating in particular. Next, the silicon dioxide ($SiO_2$) film 64 is subjected to the annealing process in the air at the temperature of 160° C. for two hours to sinter the silicon dioxide ($SiO_2$) film 64 formed by the wet film forming method. Refractive indices n relative to a light flux having the central wavelength of 193.4 nm, and optical film thicknesses nd relative to the light flux having the central wavelength of 193.4 concerning the substrate, oxide films, and the like constituting the transmissive optical element 58 will be listed below:

Substrate: $CaF_2$ (n=1.50);
First layer: $LaF_3$ (n=1.69, nd=0.60);
Second layer: $MgF_2$ (n=1.43, nd=0.66);
Third layer: $LaF_3$ (n=1.69, nd=0.52);
Fourth layer: $SiO_2$ (n=1.55, nd=0.12); and
Medium: $H_2O$ (n=1.44)

An experiment was performed by use of the transmissive optical element 58. As similar to Example 8, a thirty-day water resistance test was conducted by use of the tester 80 shown in FIG. 42 while a traveling speed of deuterated water on the transmissive optical element 58 was being equal to 50 cm/sec. As a result, the films formed on the surface of the transmissive optical element 58 were not peeled off, and there was no change in the appearance of the transmissive optical element 58. Moreover, as a result of evaluation concerning infiltration of the deuterated water into the surface of the transmissive optical element 58 in the depth direction in accordance with the secondary ion mass spectrometry (SIMS), it was confirmed that the deuterated water did not infiltrate into the films.

Example 11

Figure 55:
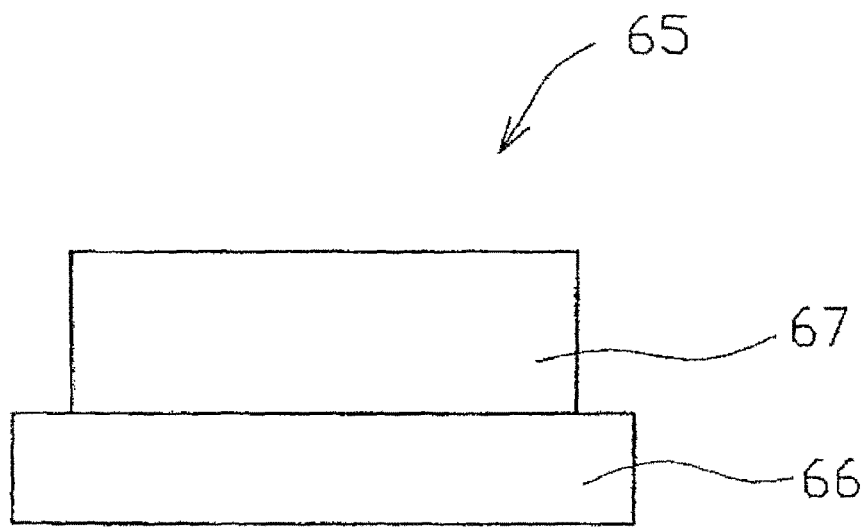
FIG. 55 is a view showing a configuration of a transmissive optical element according to Example 11.

FIG. 55 is a view showing a configuration of a transmissive optical element 65 of Example 11. As shown in FIG. 55, a surface treatment is performed on a substrate of calcium fluoride 66. Specifically, the substrate of calcium fluoride 66 is polished with a #2000 grind stone to increase surface roughness and the surface area thereof. Then, the substrate of calcium fluoride 66, which is subjected to the surface treatment by polishing with the grind stone, is coated with a silicon dioxide ($SiO_2$) film 67, which serves as an oxide anti-dissolution film, in a thickness of 100 nm by the wet film forming method, or by spin coating in particular. Next, the silicon dioxide ($SiO_2$) film 67 is subjected to the annealing process in the air at the temperature of 160° C. for two hours to sinter the silicon dioxide ($SiO_2$) film 67 formed by the wet film forming method.

An experiment was performed by use of the transmissive optical element 65. As similar to Example 8, a thirty-day water resistance test was conducted by use of the tester 80 shown in FIG. 42 while setting a traveling speed of deuterated water on the transmissive optical element 65 equal to 50 cm/sec. As a result, the films formed on the surface of the transmissive optical element 65 were not peeled off, and there was no change in the appearance of the transmissive optical element 65. Moreover, as a result of evaluation concerning infiltration of the deuterated water into the surface of the transmissive optical element 65 in the depth direction in accordance with the secondary ion mass spectrometry (SIMS), it was confirmed that the deuterated water did not infiltrate into the films.

Reference Example 2

Figure 56:
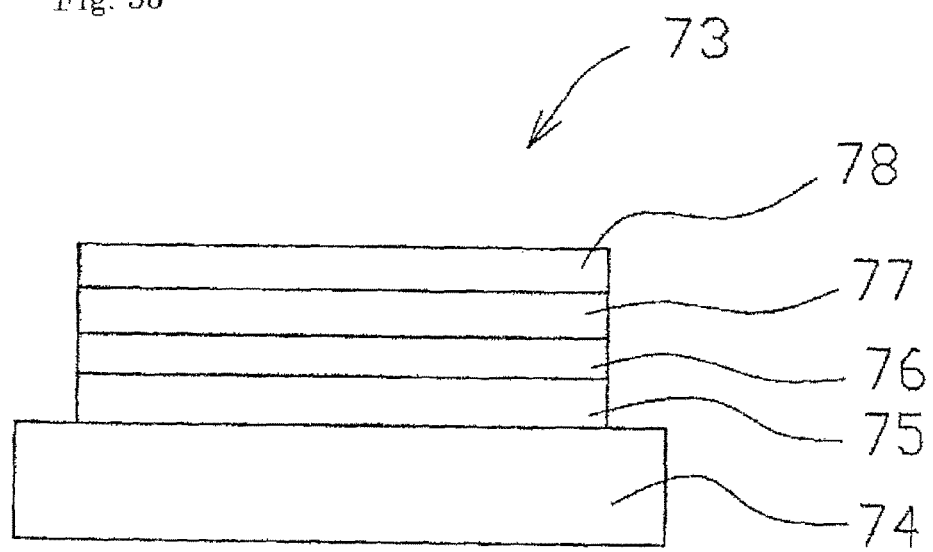
FIG. 56 is a view showing a configuration of a transmissive optical element according to Reference Example 2.

FIG. 56 is a view showing a configuration of a transmissive optical element 73 of Reference Example 2, which has an anti-reflection effect at a central wavelength of 193.4 nm. As shown in FIG. 56, a lanthanum fluoride ($LaF_3$) film 75 as a first layer, a magnesium fluoride ($MgF_2$) film 76 as a second layer, and a lanthanum fluoride ($LaF_3$) film 77 as a third layer are formed on a substrate made of calcium fluoride 74 heated by resistance heating in accordance with the vacuum vapor deposition method. Subsequently, a silicon dioxide ($SiO_2$) film 78 as a fourth layer is formed by electron gun heating in accordance with the vacuum vapor deposition method.

Here, the lanthanum fluoride ($LaF_3$) film 75 as the first layer, the magnesium fluoride ($MgF_2$) film 76 as the second layer, and the lanthanum fluoride ($LaF_3$) film 77 as the third layer collectively constituting the transmissive optical element 73 of Reference example 2 have the same refractive indices n and the same optical film thicknesses nd relative to the light flux having the central wavelength of 193.4 nm as those of the lanthanum fluoride ($LaF_3$) film 60 as the first layer, the magnesium fluoride ($MgF_2$) film 61 as the second layer, and the lanthanum fluoride ($LaF_3$) film 62 as the third layer collectively constituting the transmissive optical element 58 of Example 10. Meanwhile, the silicon dioxide ($SiO_2$) film 78 as the fourth layer has the same refractive index n and the same optical film thickness nd relative to the light flux having the central wavelength of 193.4 nm as those of the silicon dioxide ($SiO_2$) film 63 and the silicon dioxide ($SiO_2$) film 64 constituting the fourth layer of Example 9.

An experiment was performed by use of the transmissive optical element 73. As similar to Example 8, a thirty-day water resistance test was conducted by use of the tester 80 shown in FIG. 42 while setting a traveling speed of deuterated water on the transmissive optical element 73 equal to 50 cm/sec. After the water resistance test, infiltration of the deuterated water into the surface of the transmissive optical element 73 in the depth direction was evaluated in accordance with the secondary ion mass spectrometry (SIMS). As a result, deuterated water was detected from the inside of the silicon dioxide ($SiO_2$) film 78 as the fourth layer formed on the surface of the transmissive optical element 73, and in the vicinity of the interface with the lanthanum fluoride ($LaF_3$) film 77 as the third layer.

Figure 57:
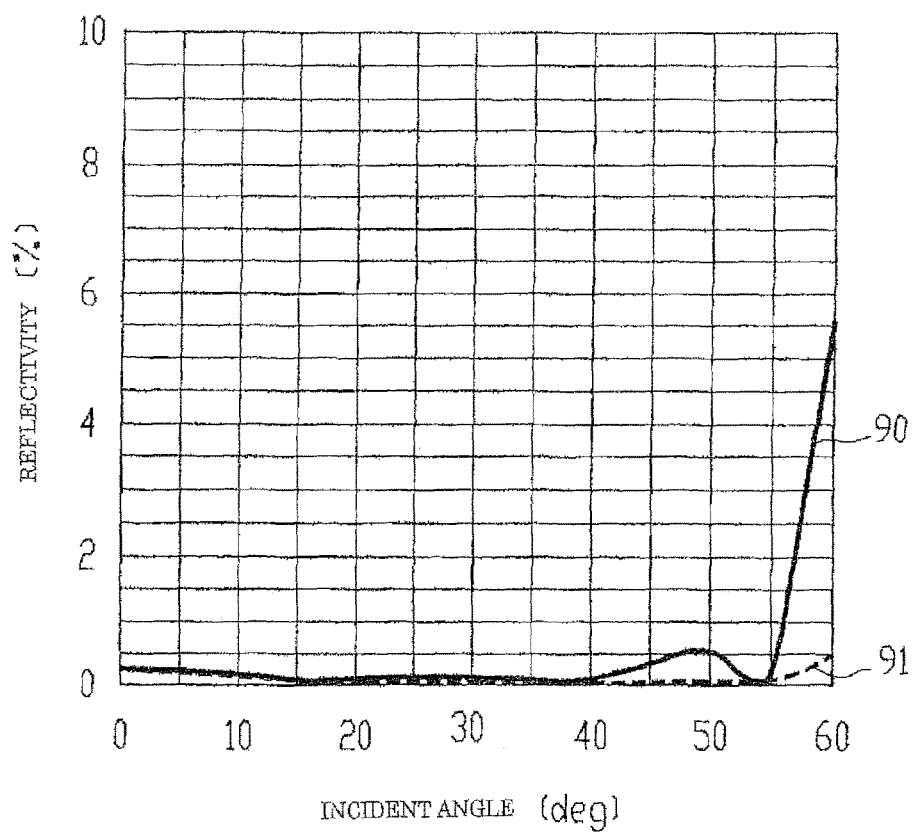
FIG. 57 is a graph showing angle-reflectance characteristics when light from a medium is incident on the transmissive optical elements according to Example 10 and Reference Example 2.

In comparison with the transmissive optical element of Reference example 2, the transmissive optical element of Embodiment 10 can prevent infiltration of and corrosion by deuterated water without changing the optical characteristic thereof. FIG. 57 is a graph showing angle-reflectivity characteristics when light from a medium (pure water) is incident on the transmissive optical elements of Example 10 and Reference Example 2. A solid line 90 in FIG. 57 indicates angle-reflectivity characteristics of S polarization components of the light incident on the transmissive optical elements of Example 10 and Reference Example 2. Meanwhile, a dashed line 91 in FIG. 57 indicates angle-reflectivity characteristics of P polarization components of the light incident on the transmissive optical elements of Example 10 and Reference Example 2. As shown in FIG. 57, the angle-reflectivity characteristics of the S polarization components and the P polarization components of the light incident on the transmissive optical element are equal between Example 10 and Reference Example 2. Accordingly, it is apparent that the transmissive optical elements of Example 10 and Reference Example 2 have the identical optical characteristics.

INDUSTRIAL APPLICABILITY

As described above, the present invention can provide an optical element configured to avoid a tip portion of a projection optical system from being corroded by a liquid when the liquid immersion method is applied. Therefore, according to the present invention, it is possible to provide an exposure apparatus which is capable of sufficiently preventing dissolution of the optical element and maintaining optical performance of the projection optical system over a long time period.

The invention claimed is:
1. An exposure apparatus that exposes a substrate with exposure beam via liquid, comprising:
   a projection optical system that has a plurality of optical elements and a lens barrel that holds the optical elements, the optical elements having a lens, which is located at a closest position to an image plane among the optical elements;
   a nozzle member that is arranged at a surrounding of the lens to form a liquid immersion region below the projection optical system with the liquid; and
   a stage that is arranged below the projection optical system and the nozzle member and that holds the substrate, wherein
   the lens has:
      an exit surface via which the exposure beam is transmitted, the exit surface being arranged to be in contact with the liquid of the liquid immersion region;
      a downward-facing surface that is arranged farther, from the stage in a direction along an optical axis of the projection optical system, than the exit surface;
      a protruding part, through which the exposure beam is transmitted, that protrudes toward the stage with respect to the downward-facing surface in the direction along the optical axis, the protruding part including the exit surface; and
      a thin film that is formed at a portion, via which the exposure beam is not transmitted onto the substrate, of the protruding part different from the exit surface, at least a part of the protruding part is arranged lower than the lens barrel in the direction along the optical axis, a side surface of the protruding part is arranged between the downward-facing surface and the exit surface in the direction along the optical axis, the nozzle member has an inward surface, the inward surface extending to surround the protruding part and being arranged facing the side surface of the protruding part, the nozzle member has an upper surface, the upper surface being arranged underneath the downward-facing surface and extending in a radial direction, a corner part of the nozzle member arranged between the upper surface and the inward surface is arranged adjacent to the side surface of the protruding part in the radial direction, and in the exposure process for the substrate via the projection optical system and the liquid immersion region, the substrate held on the stage is arranged to face the projection optical system and is moved relative to the liquid immersion region while the liquid immersion region is locally formed between the lens and a local part of a surface of the substrate.

2. The exposure apparatus according to claim 1, wherein the exit surface is substantially plane, and wherein the lens is arranged such that the exit surface is substantially parallel to a predetermined plane that is orthogonal to the optical axis of the projection optical system.

3. The exposure apparatus according to claim 2, wherein the exit surface of the lens is substantially flat.

4. The exposure apparatus according to claim 3, wherein the side surface of the protruding part is an inclined surface.

5. The exposure apparatus according to claim 4, wherein the side surface of the protruding part extends upwardly and radially with respect to the exit surface.

6. The exposure apparatus according to claim 5, wherein the protruding part has a shape, a width of which is gradually reduced toward the exit surface.

7. The exposure apparatus according to claim 4, wherein the thin film is arranged such that contact of the thin film with the liquid is not precluded.

8. The exposure apparatus according to claim 7, wherein the lens is arranged such that an incident surface of the lens intersects with the optical axis of the projection optical system.

9. The exposure apparatus according to claim 8, wherein the lens is arranged such that the exit surface intersects with the optical axis of the projection optical system.

10. The exposure apparatus according to claim 7, wherein a lower surface of the nozzle member is located lower than the exit surface.

11. The exposure apparatus according to claim 10, wherein liquid is supplied to the liquid immersion region via the nozzle member and liquid is collected from the liquid immersion region via the nozzle member, and wherein the substrate is irradiated with the exposure beam via the liquid of the liquid immersion region, which is locally formed on the substrate.

12. The exposure apparatus according to claim 11, wherein the substrate is subjected to a scanning exposure, wherein a projection area, onto which a pattern image is projected via the projection optical system and the liquid, has a length in a first direction orthogonal to an optical axis of the projection optical system and a length in a second direction orthogonal to the first direction and to the optical axis, the length in the first direction being smaller than the length in the second direction, and wherein, during the scanning exposure, the substrate is relatively moved with respect to the projection area in the first direction.

13. The exposure apparatus according to claim 12, wherein the protruding part is formed such that the exit surface has a length in the first direction that is smaller than a length in the second direction.

14. The exposure apparatus according to claim 7, wherein the lens has a different surface from the exit surface, the thin film being formed on the different surface.

15. The exposure apparatus according to claim 14, wherein the thin film is formed on the side surface of the protruding part.

16. The exposure apparatus according to claim 15, wherein the thin film has a light-shielding function.

17. The exposure apparatus according to claim 16, wherein the thin film is part of a multilayer film, and the multilayer film has at least one of a protective function and the light shielding function.

18. A method of exposing a substrate with exposure beam via liquid, the method comprising:

positioning the substrate held on a stage below a projection optical system, the projection optical system having a plurality of optical elements and a lens barrel that holds the optical elements, the optical elements having a lens, which is located at a closest position to an image plane among the optical elements; and irradiating the substrate with the exposure beam via the projection optical system and a liquid immersion region while the stage is arranged below the projection optical system and a nozzle member, the liquid immersion region being formed with the liquid below the projection optical system by use of the nozzle member that is arranged at a surrounding of the lens, wherein the lens has:
an exit surface via which the exposure beam is transmitted, the exit surface being arranged to be in contact with the liquid of the liquid immersion region;
a downward-facing surface that is arranged farther, from the stage in a direction along an optical axis of the projection optical system, than the exit surface;
a protruding part, through which the exposure beam is transmitted, that protrudes toward the stage with respect to the downward-facing surface in the direction along the optical axis, the protruding part including the exit surface; and
a thin film that is formed at a portion, via which the exposure beam is not transmitted onto the substrate, of the protruding part different from the exit surface, at least a part of the protruding part is arranged lower than the lens barrel in the direction along the optical axis, a side surface of the protruding part is arranged between the downward-facing surface and the exit surface in the direction along the optical axis, the nozzle member has an inward surface, the inward surface extending to surround the protruding part and being arranged facing the side surface of the protruding part, the nozzle member has an upper surface, the upper surface being arranged underneath the downward-facing surface and extending in a radial direction, a corner part of the nozzle member arranged between the upper surface and the inward surface is arranged adjacent to the side surface of the protruding part in the radial direction, and in the exposure process for the substrate via the projection optical system and the liquid of the liquid immersion region, the substrate held on the stage is arranged to face the projection optical system and is moved relative to the liquid immersion region while the liquid immersion region is locally formed between the lens and a local part of a surface of the substrate.

19. The method according to claim 18,
wherein the exit surface is substantially plane, and
wherein the lens is arranged such that the exit surface is substantially parallel to a predetermined plane that is orthogonal to the optical axis of the projection optical system.

20. The method according to claim 19,
wherein the exit surface of the lens is substantially flat.

21. The method according to claim 20,
wherein the side surface of the protruding part is an inclined surface.

22. The method according to claim 21,
wherein the side surface of the protruding part extends upwardly and radially with respect to the exit surface.

23. The method according to claim 22,
wherein the protruding part has a shape, a width of which is gradually reduced toward the exit surface.

24. The method according to claim 21,
wherein the thin film is arranged such that contact of the thin film with the liquid is not precluded.

25. The method according to claim 24,
wherein the lens is arranged such that an incident surface of the lens intersects with the optical axis of the projection optical system.

26. The method according to claim 25,
wherein the lens is arranged such that the exit surface intersects with the optical axis of the projection optical system.

27. The method according to claim 24,
wherein a lower surface of the nozzle member is located lower than the exit surface.

28. The method according to claim 27,
wherein liquid is supplied to the liquid immersion region via the nozzle member and liquid is collected from the liquid immersion region via the nozzle member, and
wherein the substrate is irradiated with the exposure beam via the liquid of the liquid immersion region, which is locally formed on the substrate.

29. The method according to claim 28,
wherein the substrate is subjected to a scanning exposure,
wherein a projection area, onto which a pattern image is projected via the projection optical system and the liquid, has a length in a first direction orthogonal to an optical axis of the projection optical system and a length in a second direction orthogonal to the first direction and to the optical axis, the length in the first direction being smaller than the length in the second direction, and
wherein, during the scanning exposure, the substrate is relatively moved with respect to the projection area in the first direction.

30. The method according to claim 29,
wherein the protruding part is formed such that the exit surface has a length in the first direction that is smaller than a length in the second direction.

31. The method according to claim 24,
wherein the lens has a different surface from the exit surface, the thin film being formed on the different surface.

32. The method according to claim 31,
wherein the thin film is formed on the side surface of the protruding part.

33. The method according to claim 32,
wherein the thin film has a light-shielding function.

34. The method according to claim 33,
wherein the thin film is part of a multilayer film, and the multilayer film has at least one of a protective function and the light shielding function.

* * * * *